United States Patent [19]
Kitoh et al.

[11] Patent Number: 6,104,738
[45] Date of Patent: Aug. 15, 2000

[54] SEMICONDUCTOR LASER AND PROCESS FOR PRODUCING THE SAME

[75] Inventors: Masahiro Kitoh, Suita; Nobuyuki Otsuka, Kawanishi; Masato Ishino, Shijonawate; Yasushi Matsui, Neyagawa; Yuichi Inaba, Katano, all of Japan

[73] Assignee: Matsushita Electric Industrial Co., Ltd., Osaka, Japan

[21] Appl. No.: 08/894,763

[22] PCT Filed: Dec. 26, 1996

[86] PCT No.: PCT/JP96/03837

§ 371 Date: Nov. 13, 1997

§ 102(e) Date: Nov. 13, 1997

[87] PCT Pub. No.: WO97/24787

PCT Pub. Date: Jul. 10, 1997

[30] Foreign Application Priority Data

Dec. 28, 1995 [JP] Japan .................................. 7-342838
Dec. 9, 1996 [JP] Japan .................................. 8-241732

[51] Int. Cl.[7] .............................. H01S 3/19; H01S 3/08
[52] U.S. Cl. ............................................. 372/46; 372/96
[58] Field of Search .................................. 372/50, 96, 46

[56] References Cited

FOREIGN PATENT DOCUMENTS

| | | |
|---|---|---|
| 64-35977 | 2/1989 | Japan . |
| 4-326788 | 11/1992 | Japan . |
| 5-114767 | 5/1993 | Japan . |
| 7-63935 | 3/1995 | Japan . |
| 7-74396 | 3/1995 | Japan . |
| 9-23036 | 1/1997 | Japan . |
| 2195822 | 4/1988 | United Kingdom . |

OTHER PUBLICATIONS

T. Tamanuki et al., "High–Power 1.55 $\mu$m–Eye–Safe Pulse Laser Diodes with Flared Waveguide", *Proceedings of the 1994 IEICE Fall Conference*, p. 175 (1994) (No Month Available).

H. Fukano et al., "1.3 $\mu$m Large Spot–Size Laser Diodes with Laterally Tapered Active Layer", *Electronics Letters*, vol. 31, No. 17, pp. 1439–1440, Aug., 1995.

M. Kito et al., "High–Power, Wide–Temperature Range Operation of 1.3 $\mu$m Gain–Coupled DFB Lasers with Automatically Buried InAsP absorptive Grating", *IEEE Photonics Technology Letter*, vol. 8, No. 10, pp. 1299–1301 (Oct. 1996).

M. Kito et al, "New Structure of 1.3 $\mu$m strained–Layer Multi–Quantum Well Complex–Coupled Distributed Feedback Lasers", *Japanese Journal of Applied Physics*, pp. 1375–1377, vol. 35, Part 1, No. 2B, Feb., 1996.

T. Tamanuki et al., "High Power and Narrow Lateral Far–Field Divergence 1.5 $\mu$m Eye–Safe Pulsed Laser Diodes with Flared Waveguide ", *Optical and Quantum Electronics*, vol. 28, pp. 513–517 (1996) (No Month Available).

(List continued on next page.)

*Primary Examiner*—Rodney Bovernick
*Assistant Examiner*—Quyen Phan Leung
*Attorney, Agent, or Firm*—Ratner & Prestia

[57] ABSTRACT

In a semiconductor laser device 100, an n-type InGaAsP light confinement layer 2, a multiple quantum well active layer 3, a p-type InGaAsP light confinement layer 4, and a p-type InP cladding layer 5 are formed on an n-type InP substrate 1 to be in a mesa structure extending in stripes along the cavity length direction. Moreover, regions on both sides of this striped mesa are buried with a p-type InP current blocking layer 6 and an n-type InP current blocking layer 7. Furthermore, a p-type InP burying layer 8 and a p-type InGaAsP contact layer 9 are formed thereon. The oscillation wavelength of the semiconductor laser device 100 is around 1.3 $\mu$m. The stripe width of the active layer 3 is such that the width W1 at the front end face and the width W2 at the rear end face have a relationship of W1<W2, and the stripe width is continuously reduced from W2 to W1 along the cavity length direction. Thus, a semiconductor laser device is provided which has a very narrow beam divergence and a low threshold current and generates a high optical output.

32 Claims, 37 Drawing Sheets

OTHER PUBLICATIONS

K. Kasaya et al., "Monolithically Integrated DBR Lasers with Simple Tapered Waveguide for Low–Loss Fibre Coupling", *Electronics Letters,* vol. 29, No. 23, pp. 2067–2068 (Nov. 1993).

P. Doussiere et al., "Tapered Active Strip for 1.5 $\mu$m InGaAsP/InP Strained Mulitple Quantum Well Lasers with Reduced Beam Divergence", *Applied Physics Letters,* vol. 64, No. 5, pp. 539–541, Jan., 1994.

International Search Report corresponding to PCT Application No. PCT/JP96/03837.

M. Kito et al., "Fabrication of 1.3 $\mu$m strained MQW gain–coupled DFB–LD with InAsP absorptive Gratings", Proceedings of $42^{nd}$ Spring Conference of Society of Applied Physics 1995, 30a–ZG–3, p. 1097 (No Month Available).

European Search Report dated Feb. 4, 1999 for corresponding European Patent Application No. 96943318.4.

FIG. 1
PRIOR ART
(a)
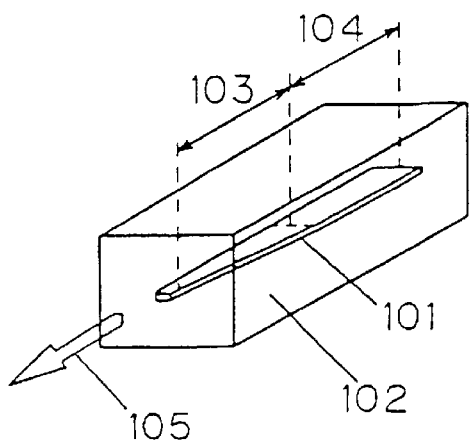
(b)
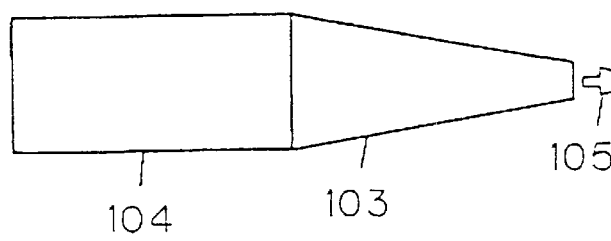
(c)
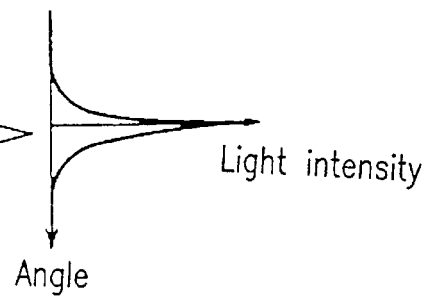
(d)
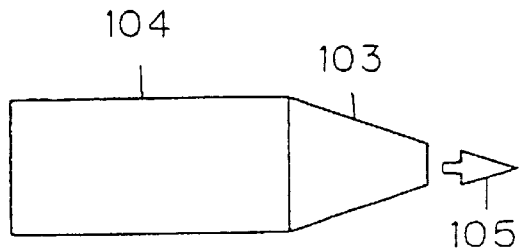
(e)
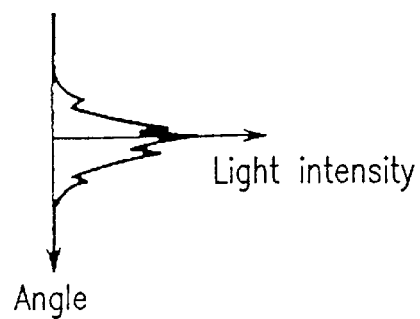

FIG. 6
(a)
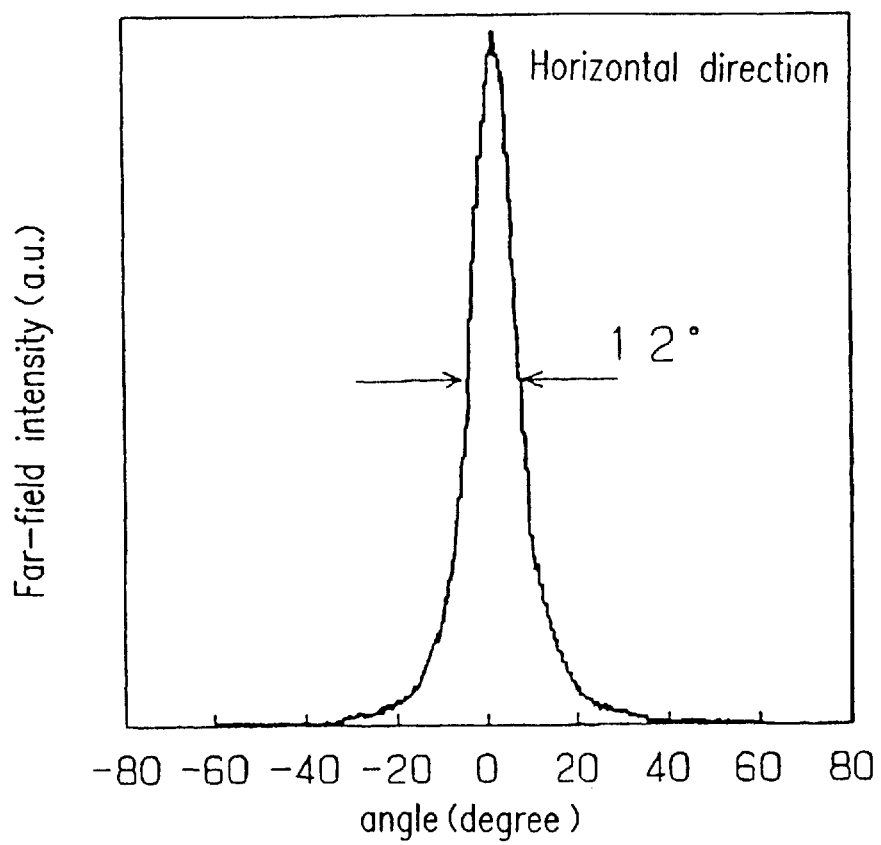
(b)
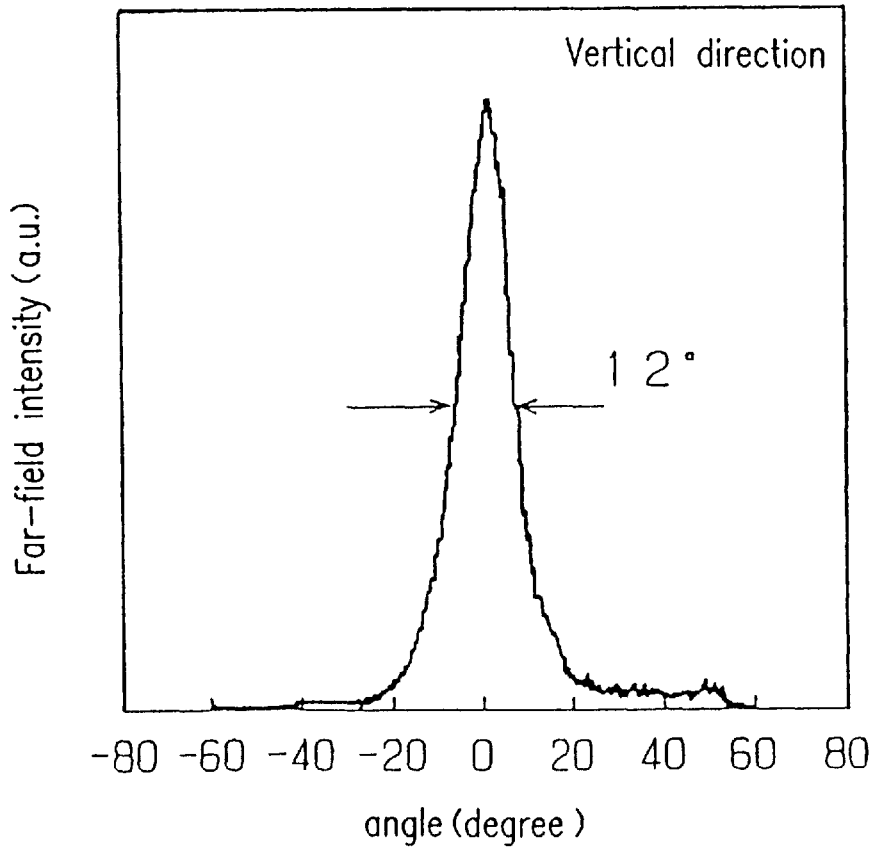

FIG. 10
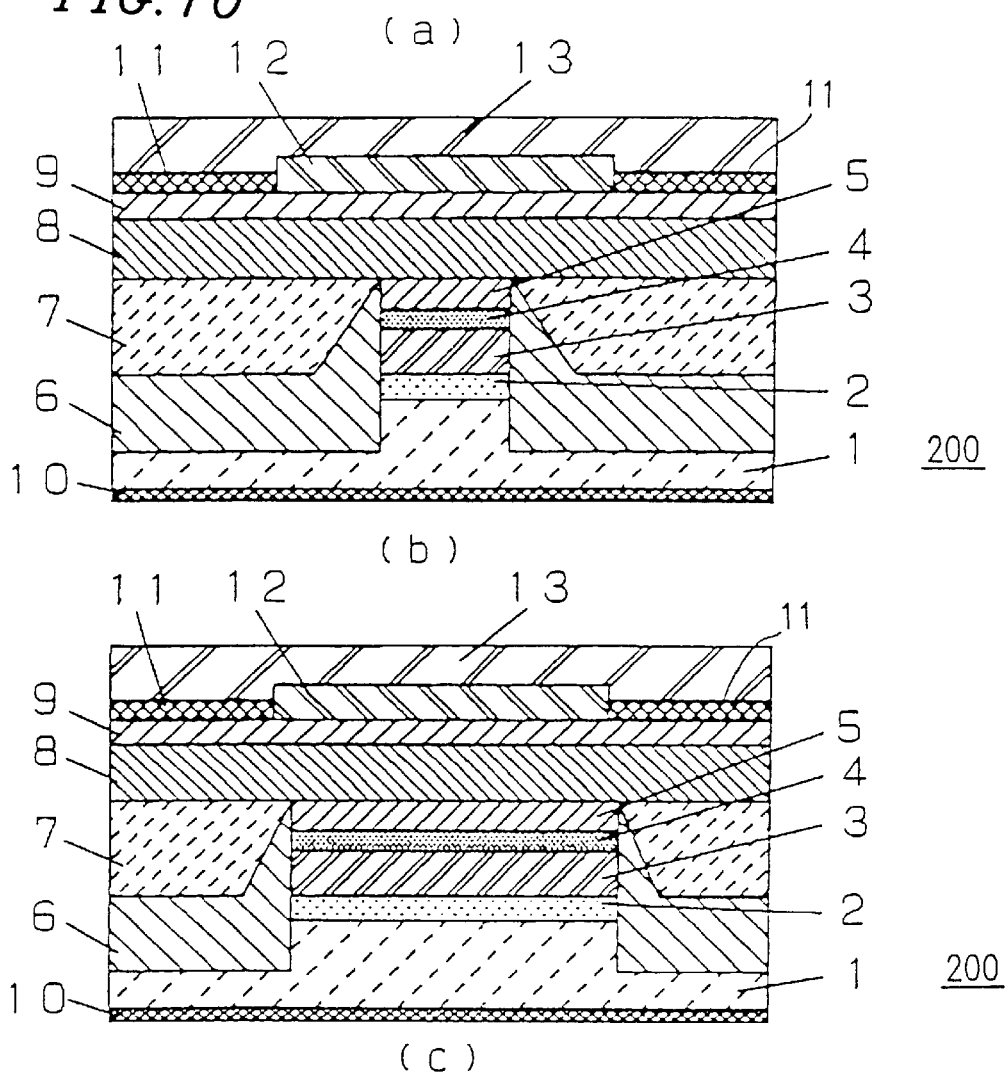
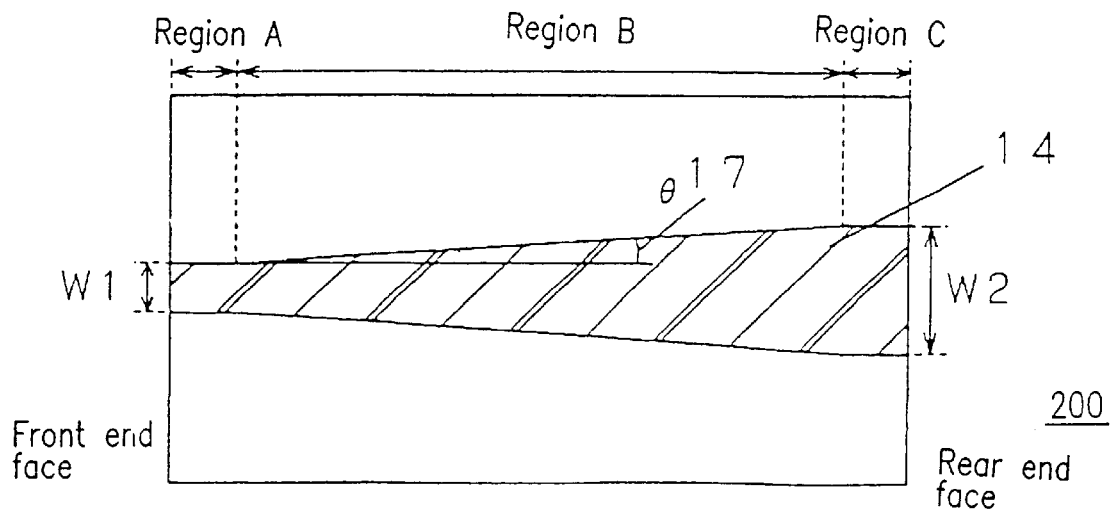

FIG. 13
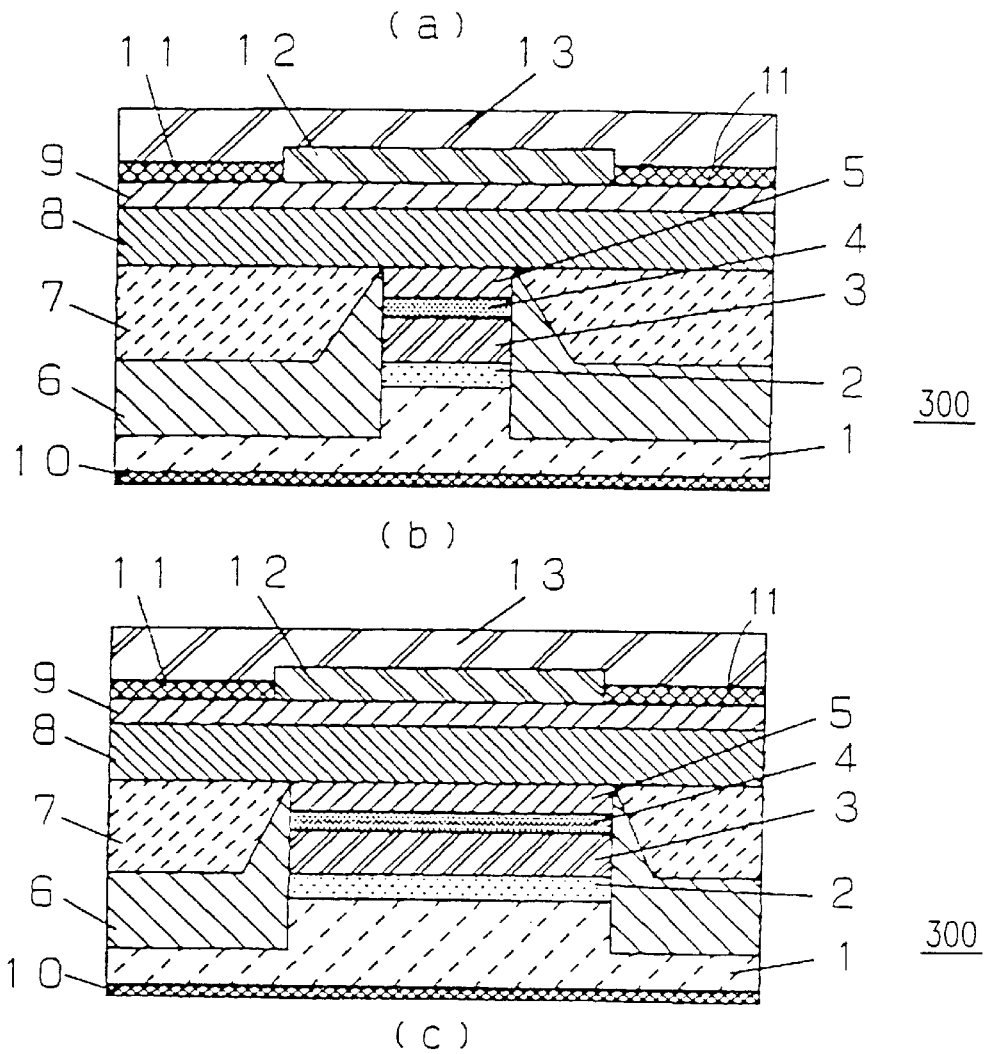
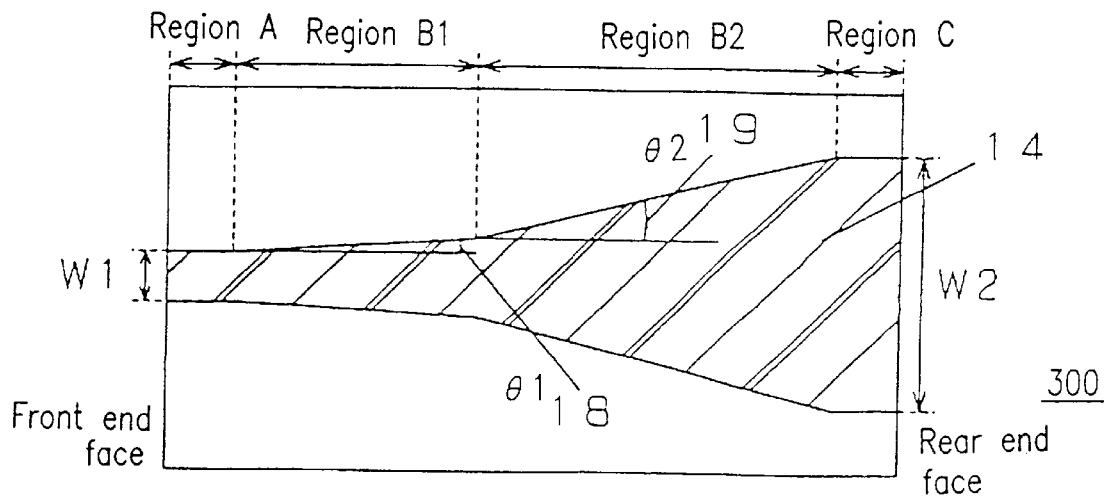

FIG.16
(a)
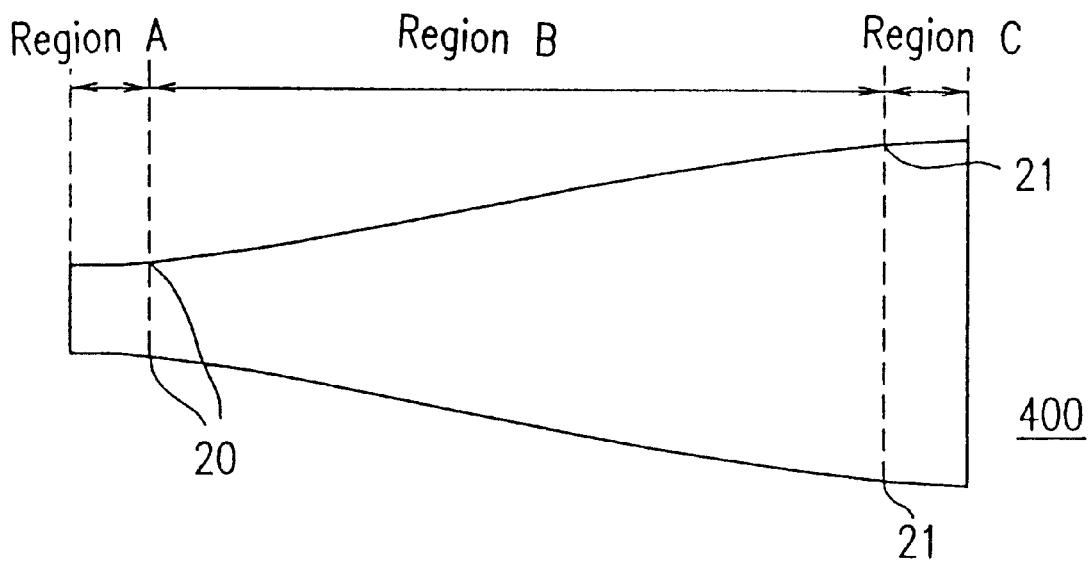
(b)
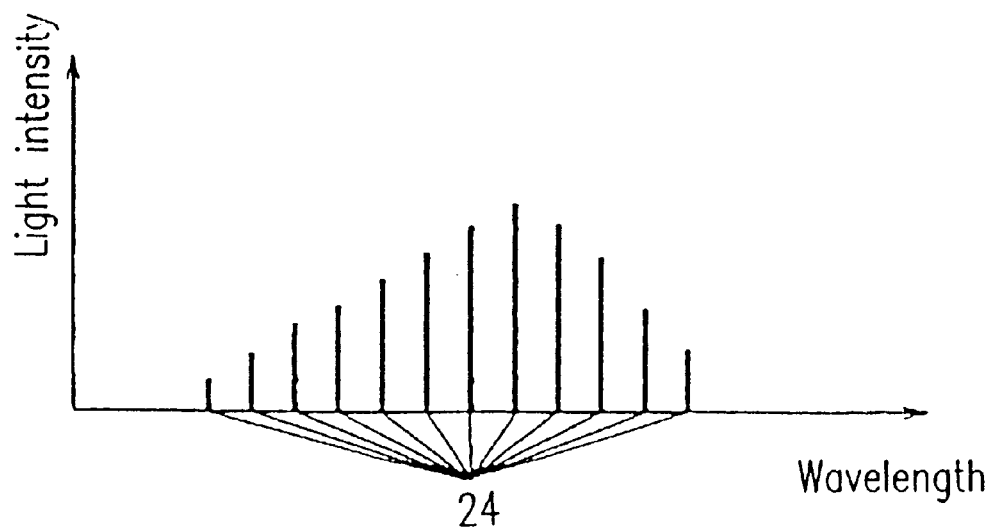

FIG. 18
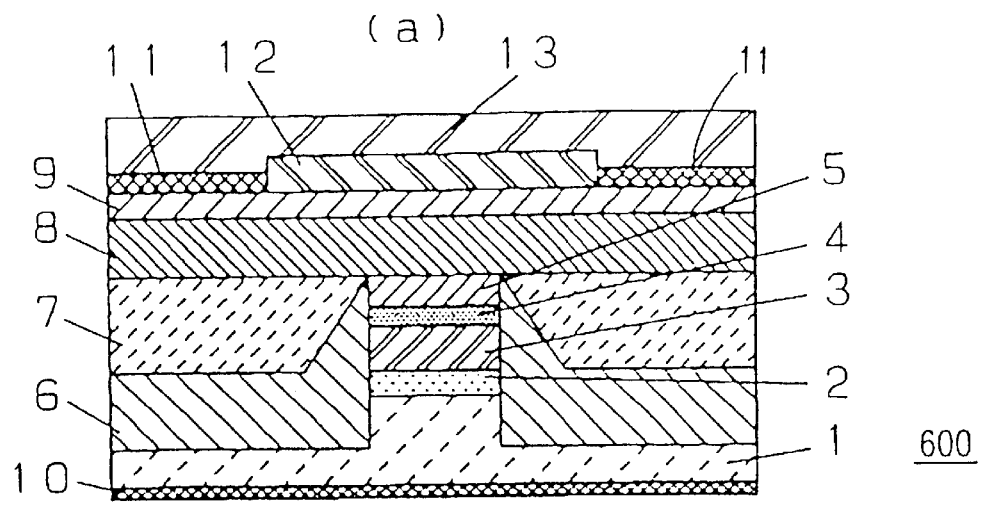
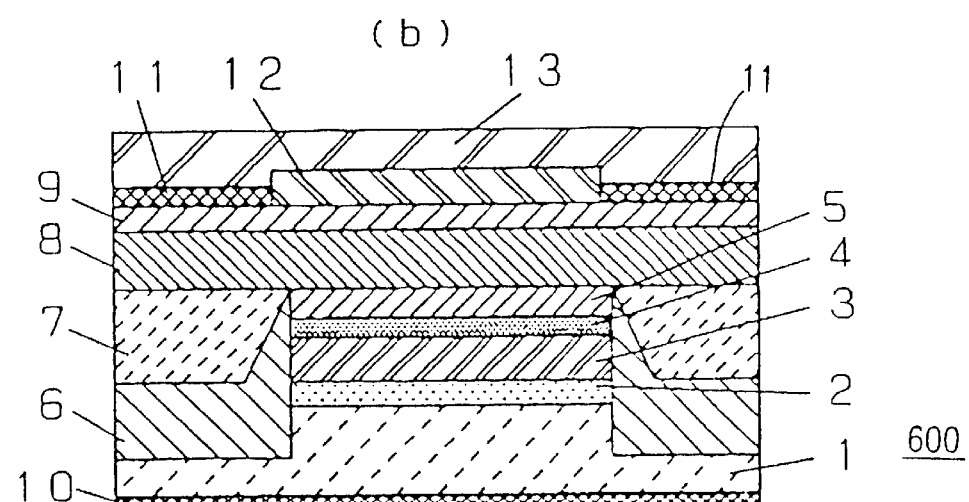
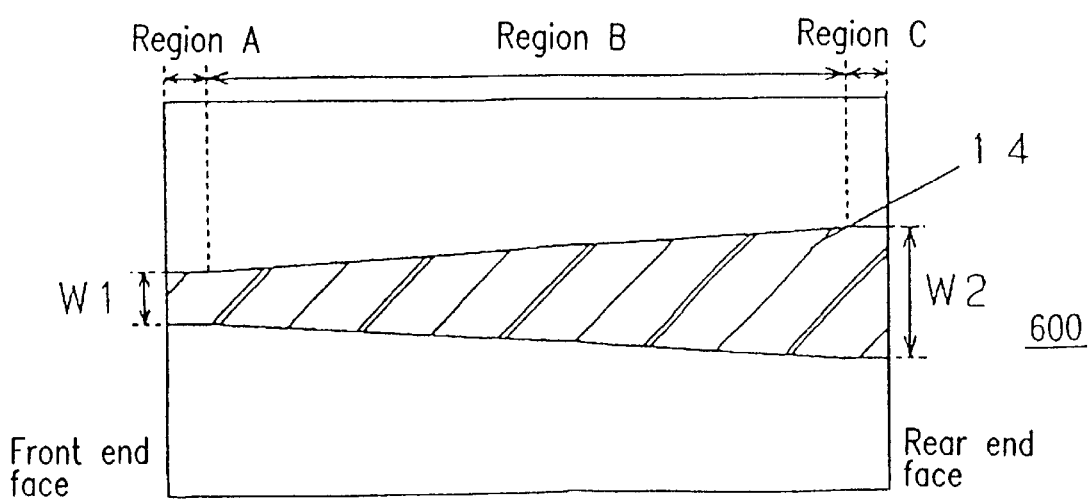

FIG.20
(a)
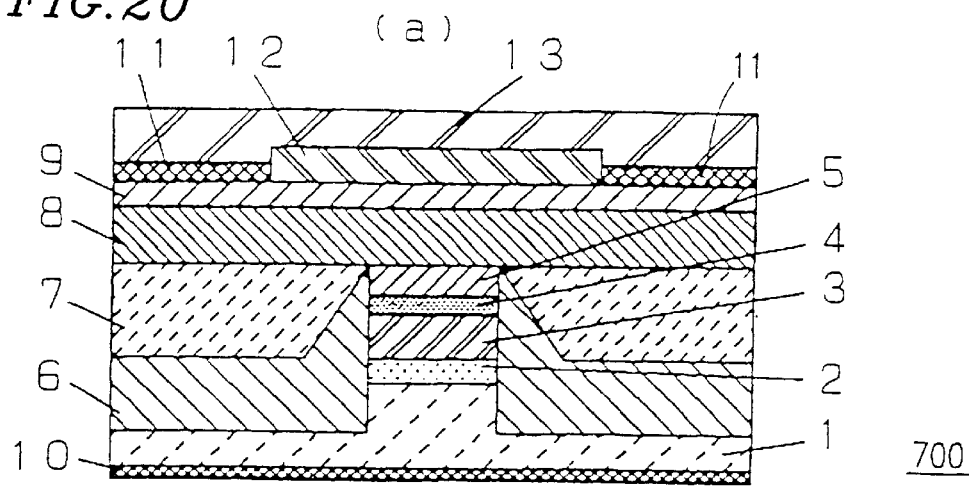
(b)
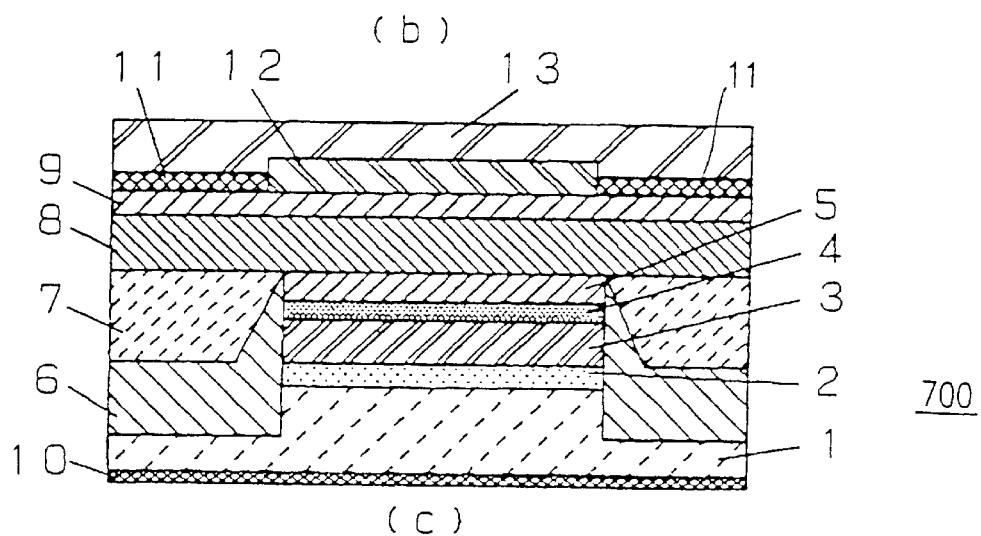
(c)
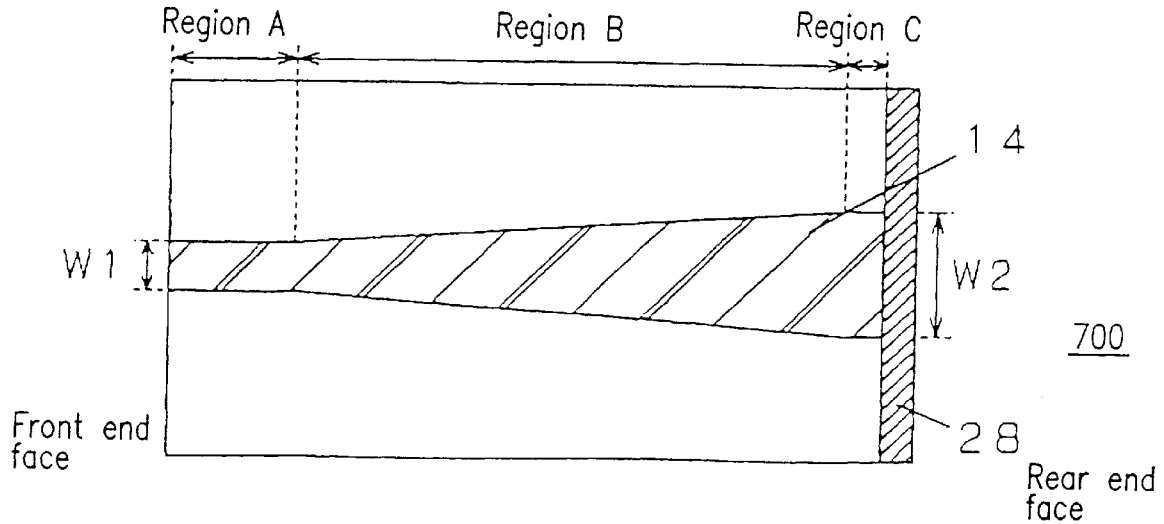

FIG.22
(a)
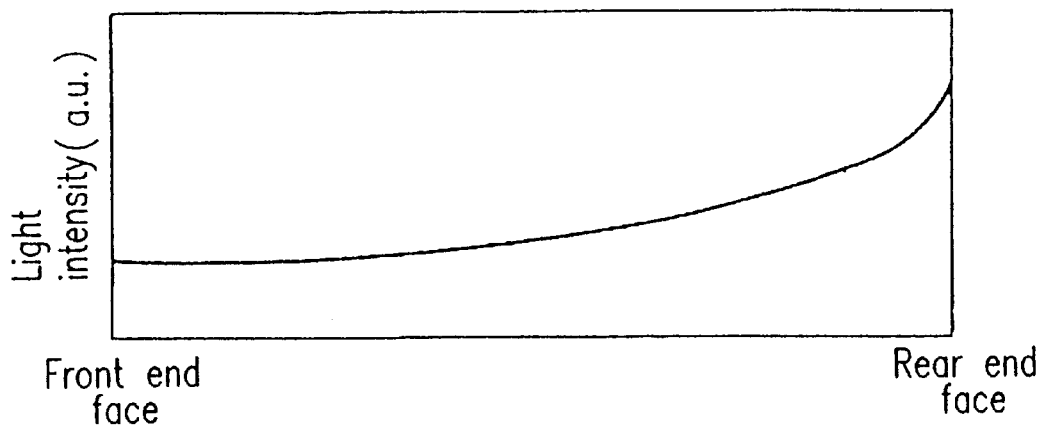
(b)
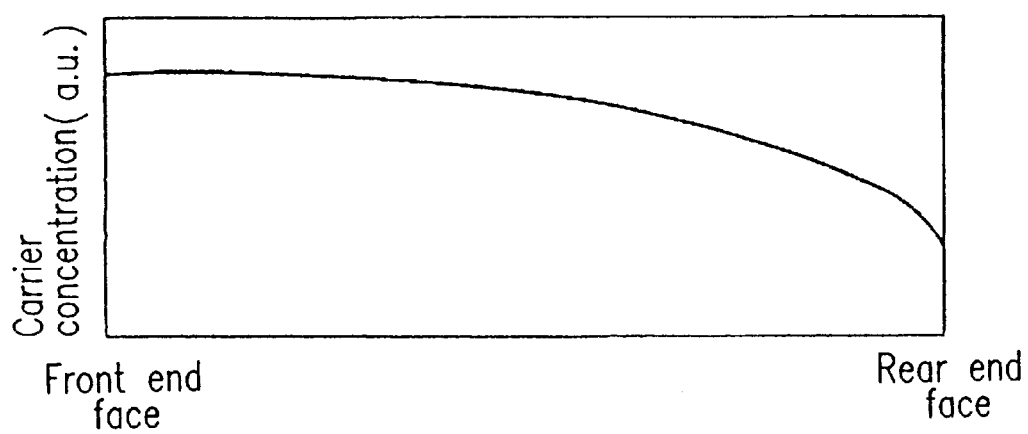
(c)
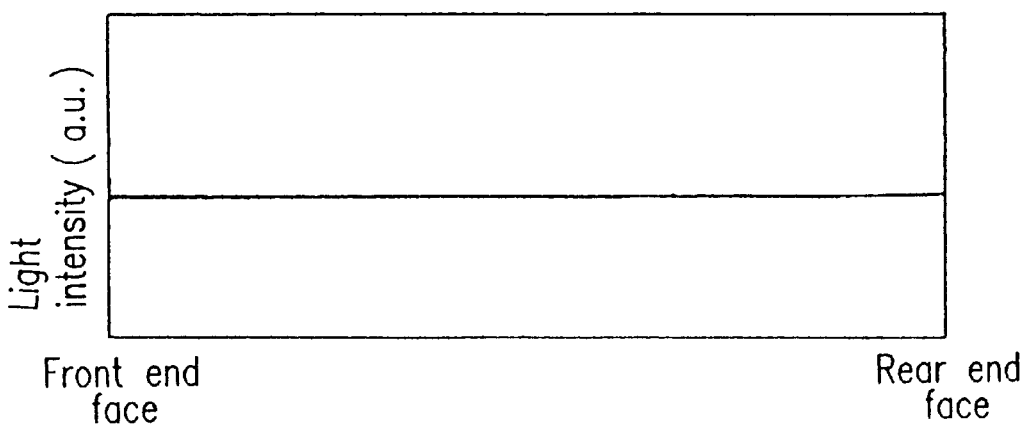

FIG.25
(a)
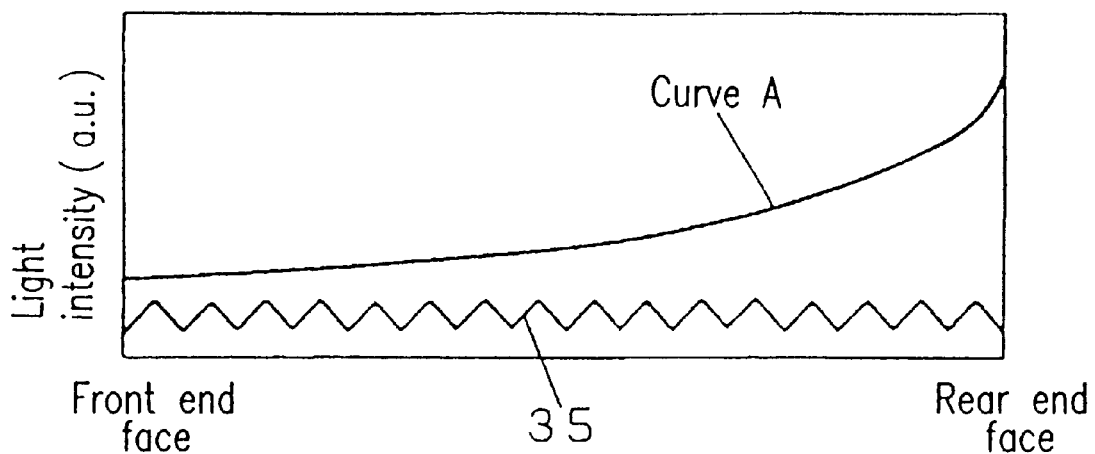
(b)
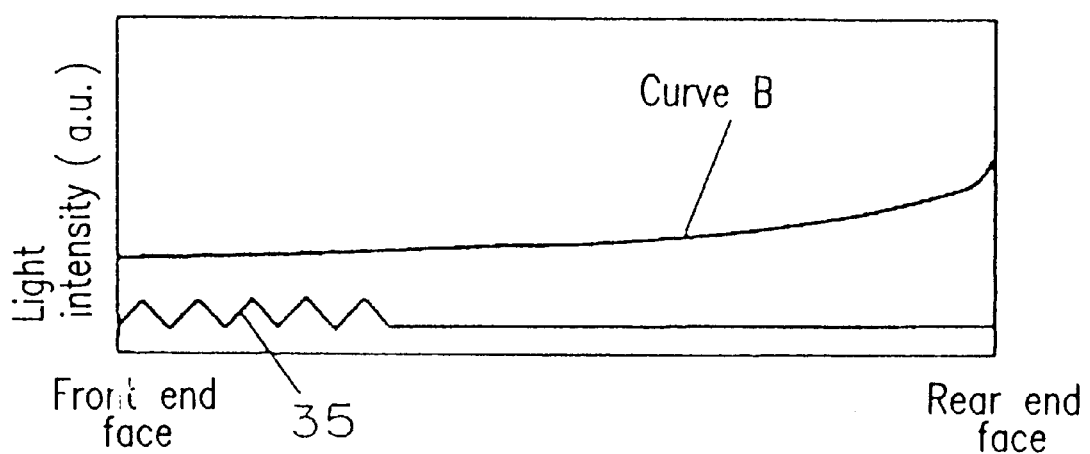

FIG. 34
(a)
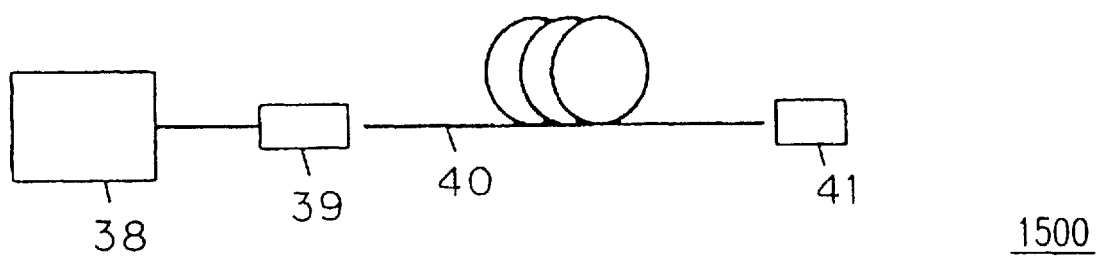
1500
(b)
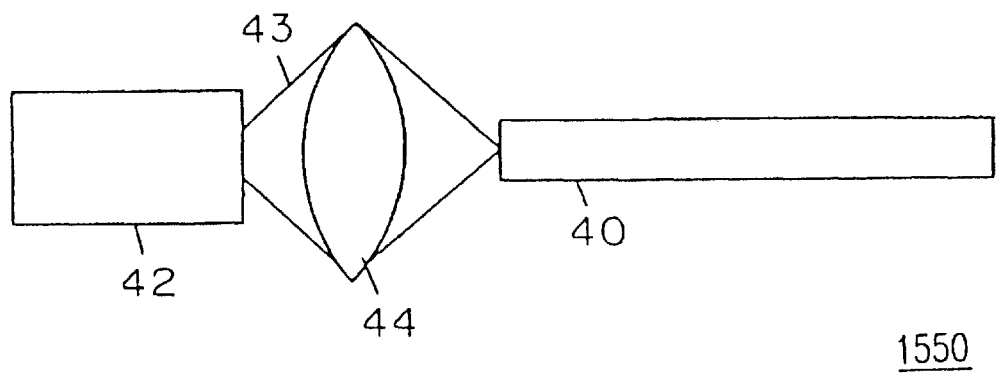
1550

FIG.35
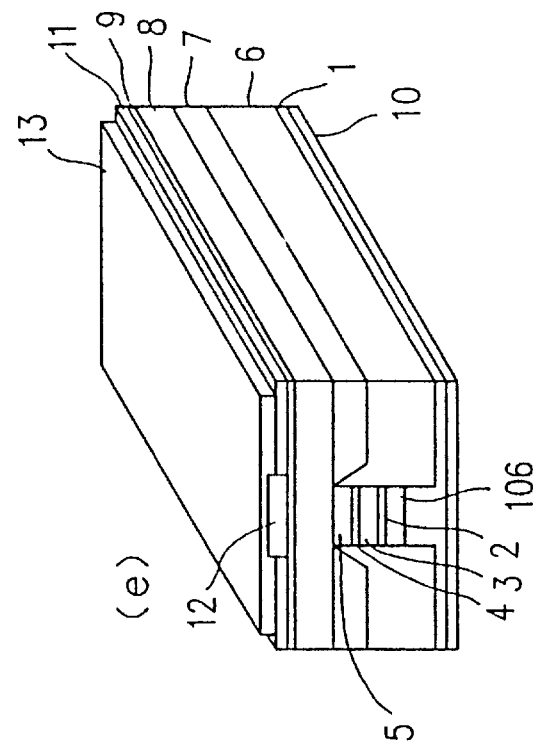
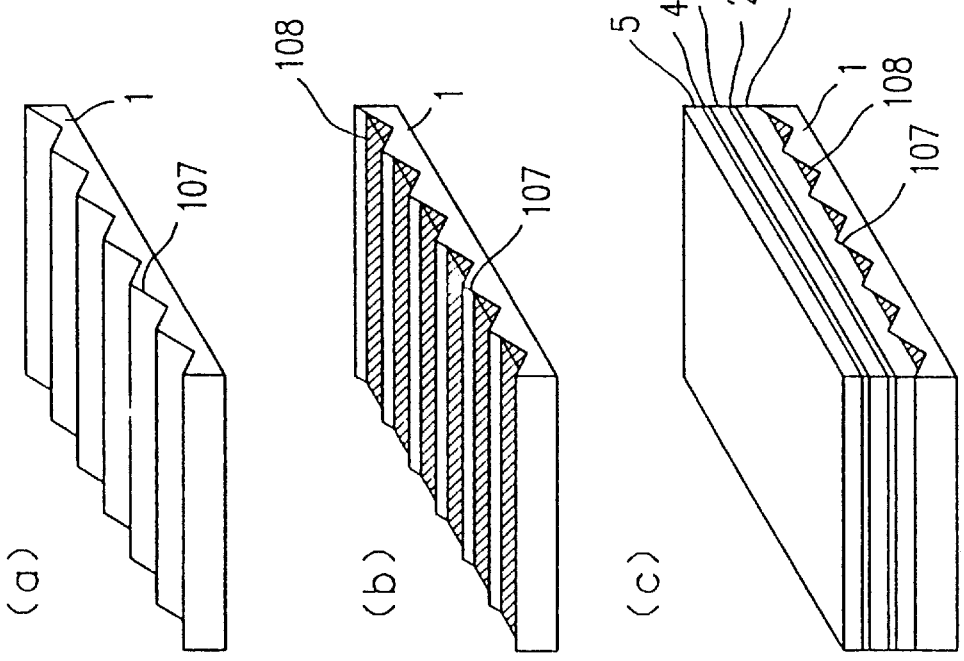

FIG.36
(a)
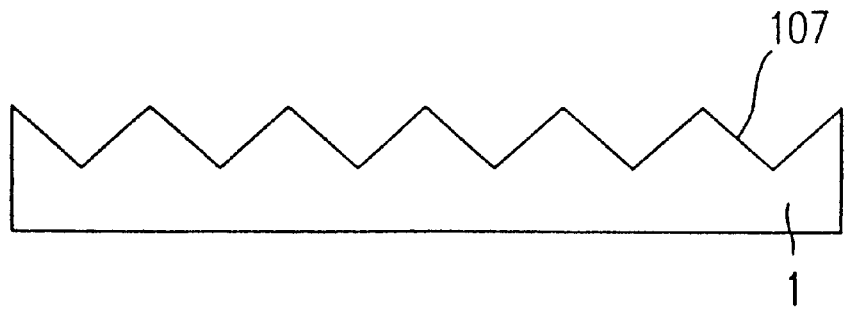
(b)
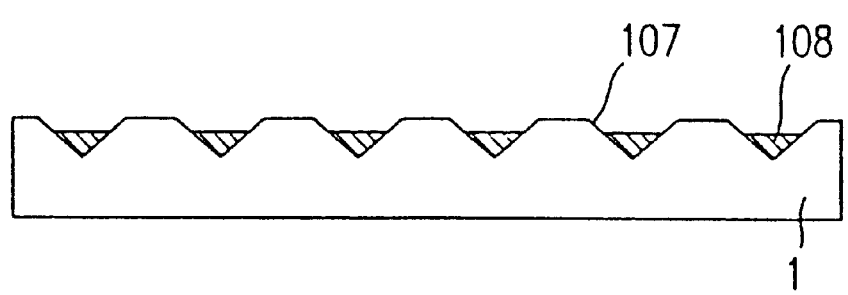
(c)
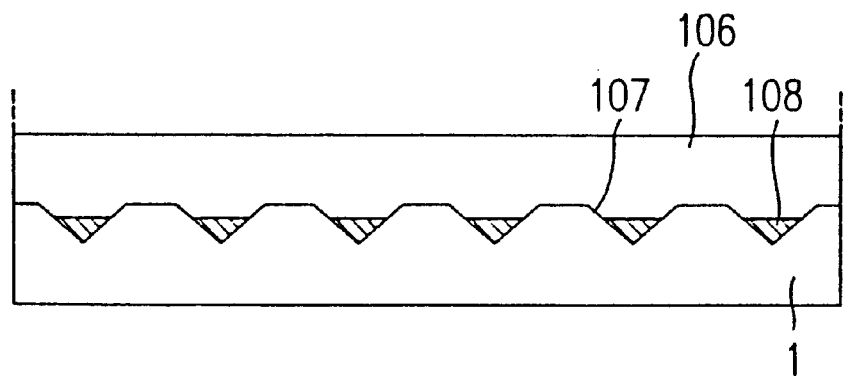

SEMICONDUCTOR LASER AND PROCESS FOR PRODUCING THE SAME

This Application is a U.S. National Phase Application of PCT International Application PCT/JP96/03837 filed Dec. 26, 1996.

TECHNICAL FIELD

The present invention relates to a semiconductor laser device and a production method therefor, and particularly, to a semiconductor laser device suitable as a light source for optical communication and a production method therefor. Moreover, the present invention relates to an optical communication system including such a semiconductor laser device as a light source.

BACKGROUND ART

Problems arising when a light emitted from a semiconductor laser device is coupled to an optical fiber are the coupling efficiency and the alignment precision between the semiconductor laser device and the optical fiber. Since the beam divergence of an ordinary semiconductor laser device for optical communication is as wide as about 20° to about 30°, only a very low coupling efficiency of several percents may be realized when the laser light is directly coupled to the optical fiber.

When a lens is inserted between the semiconductor laser device and the optical fiber, a high coupling efficiency can be obtained. However, the alignment precision will then be about 1 $\mu$m, so that it becomes necessary to perform a highly precise alignment, thereby presenting a cost-increasing factor.

In order to solve this problem, a method has been devised to directly couple laser light to an optical fiber while narrowing the beam divergence of the semiconductor laser device to about 10°. FIG. 1(a) shows an example of a conventional structure of a semiconductor laser device which realizes such a narrow beam divergence (H. Fukano et al., Electron. Lett., vol. 31, No. 17 pp. 1439–1440, Aug. 17, 1995).

The structure includes a stripe 101 having an active layer (hereinafter, referred to also as the "striped active layer 101") and an InP burying layer 102 surrounding the stripe. The striped active layer 101 includes a tapered region 103 and a parallel region 104. Laser light 105 is emitted from an end face of the tapered region 103.

For light propagating from the parallel region 104 to the tapered region 103 of the striped active layer 101, light confinement in the active layer 101 continuously decreases as the light propagates through the tapered region 103. Accordingly, leakage of light from the active layer 101 into the burying layer 102 increases, whereby the spot size of the laser light 105 at the emission end is enlarged with respect to the spot size in the parallel region 104. Such an enlargement of the spot size of the laser light 105 means narrowing of the beam divergence.

In the above-described conventional structure, the striped active layer 101 is divided into the parallel region 104 having a constant width and the tapered region 103 having a continuously-varying width. In such a structure, when the length of the tapered region 103 is relatively long, as shown in FIG. 1(b), the variation of stripe width is gentle, whereby a radiation mode has less influence on an emitted light pattern. Thus, for the laser light 105 emitted from the parallel region 104 via the tapered region 103, an emitted light pattern with a single peak, as shown in FIG. 1(c), can be obtained. However, since the total cavity length increases, in view of the operating characteristics of the semiconductor laser, problems arise such as an increase in the threshold current and a decrease in the slope efficiency. Moreover, the number of laser elements to be obtained from a substrate of the same size decreases, thereby increasing the production cost per element.

On the other hand, when the tapered region 103 is short, as shown in FIG. 1(d), the total cavity length decreases, but the influence of the radiation mode on the emitted light pattern becomes more significant, thereby resulting in an emitted light pattern with a plurality of peaks, as shown in FIG. 1(e). Thus, the coupling efficiency between the semiconductor laser and the optical fiber decreases.

In view of the above points, it is necessary to realize an emitted light pattern with a single peak at a narrow beam divergence in a semiconductor laser device without deteriorating the operating characteristics such as the threshold current and the slope efficiency.

The present invention, which has been made in view of such problems, has objectives of: (1) providing a semiconductor laser device with a low threshold current, a high slope efficiency characteristic and a narrow beam divergence; (2) providing a production method therefor; and (3) providing an optical communication system including such a semiconductor laser device as a light source.

DISCLOSURE OF THE INVENTION

A semiconductor laser device of the present invention is a semiconductor laser device comprising a substrate and a multi-layer structure formed on the substrate, wherein: the multi-layer structure includes an optical waveguide region having at least an active layer and a burying layer for burying peripheries of the optical waveguide region, the optical waveguide region being formed in stripes along a cavity length direction; a stripe width of the optical waveguide region is such that a width W1 at a front end face and a width W2 at a rear end face satisfy a relationship of W1<W2; and the stripe width continuously varies between the width W1 and the W2 along the cavity length direction, thereby generating laser light with a very narrow beam divergence.

In one example, the optical waveguide region further comprises a light confinement layer adjoining the active layer.

The optical waveguide region may comprise: a first region having the width W1 of a constant value; a second region having the width W2 of a constant value; and a third region having a width which continuously varies along the cavity length direction between the width W1 and the width W2, and the first region may be located on the front end face side while the second region is located on the rear end face side.

A length of the first region and a length of the second region each may be shorter than a length of the third region. Alternatively, a length of the first region and a length of the second region each may be shorter than about 15% of a length of the third region.

In one example, the stripe width of the optical waveguide region varies linearly along the cavity length direction with a gradient of variation being about 0.14° or less with respect to the cavity length direction.

In another example, the stripe width of the optical waveguide region varies linearly along the cavity length direction, and the optical waveguide region includes at least two regions, the gradients of variation of which are different from each other, and the gradient of one of the two regions which is closest to the front end face is about 0.14° or less with respect to the cavity length direction.

In still another example, an average refractive index n1 of the optical waveguide region and a refractive index n2 of the burying layer satisfy a relationship of (n1−n2)<0.2. An average refractive index n1 of the optical waveguide region and a refractive index n2 of the burying layer may alternatively satisfy a relationship of (n1−n2)<0.15.

The width W1 of the stripe of the optical waveguide region may be set to be a value which is less than about 1.0 μm and such that a light intensity distribution in a direction parallel to the substrate has only a fundamental mode.

The width W2 of the stripe of the optical waveguide region may be set to be a value such that a higher mode is allowed to exist in a light intensity distribution in a direction parallel to the substrate. Preferably, the width W2 of the stripe of the optical waveguide region is about 2 μm or more.

In one example, the first region and the third region, and the second region and the third region are respectively connected smoothly.

In another example, a length of the first region and a length of the second region are each about 5 μm or less.

In still another example, at least one of the first region and the second region has, on a side adjoining the third region, lengths different from each other on respective sides of the striped shape.

In still another example, at least one of the first region and the second region has, on a side adjoining the third region, lengths different from each other on respective sides of the striped shape with a connection surface to the third region being inclined by substantially about 45° with respect to the cavity length direction.

In still another example, the rear end face is coated with a highly reflective film, and a length of the first region is longer than about 5 μm while a length of the second region is about 5 μm or less.

In still another example, a first electrode provided on the multi-layer structure and a second electrode provided on a reverse surface of the substrate are further provided, wherein: the first electrode is separated into a plurality of regions by at least two separation grooves which are parallel to the front end face and the rear end face; and widths of the separation grooves along the cavity length direction are set to be wider when closer to the rear end face.

In still another example, a first electrode provided on the multi-layer structure and a second electrode provided on a reverse surface of the substrate are further provided, wherein: the first electrode is separated into a plurality of regions by at least two separation grooves which are parallel to the front end face and the rear end face, and configured such that less current is supplied to one of the plurality of regions which is closer to the rear end face.

The substrate and the burying layer may be made of InP, and the active layer may be made of InGaAsP.

In one example, a diffraction grating for modulating an effective refractive index of the optical waveguide region periodically along the cavity length direction is formed to be adjacent to the optical waveguide region, thereby oscillating with a single wavelength.

In another example, a diffraction grating for modulating a gain of the optical waveguide region periodically along the cavity length direction is formed to be adjacent to the optical waveguide region, thereby oscillating with a single wavelength.

A period of the diffraction grating may be shorter in a vicinity of the rear end face than in a vicinity of the front end face. Preferably, the period of the diffraction grating varies along the cavity length direction so that a Bragg wavelength is constant along the cavity length direction.

In one example: the semiconductor substrate is formed of InP; the active layer is formed of a multi-layer film of an InGaAsP mixed crystal; and the diffraction grating is a material layer of any one of an InAsP layer, an InGaAsP layer and an InGaAs layer buried in the vicinity of the active layer. In a circumstance, a bandgap energy of the material layer of any one of an InAsP layer, an InGaAsP layer and an InGaAs layer forming the diffraction grating is set to be less than an energy of laser light emitted from the active layer, and the material layer of any one of the InAsP layer, the InGaAsP layer and the InGaAs layer functions as an absorbing layer for the laser light. Alternatively, a bandgap energy of the material layer of any one of an InAsP layer, an InGaAsP layer and an InGaAs layer forming the diffraction grating is set to be greater than an energy of laser light emitted from the active layer, and the material layer of any one of the InAsP layer, the InGaAsP layer and the InGaAs layer functions as a refractive index modulating layer for the laser light.

The diffraction grating may be formed only on a portion of the substrate on the front end face side.

An optical communication system of the present invention comprises a light source and an optical waveguide region to which light emitted from the light source is directly coupled, wherein the light source is the above-described semiconductor laser device.

A production method for a semiconductor laser device of the present invention comprises the steps of: forming, on a substrate, a multi-layer structure including at least an active layer and a light confinement layer; processing the multi-layer structure into a striped shape such that a width W1 at a front end face and a width W2 at a rear end face satisfy a relationship of W1<W2, the striped shape having a stripe width which continuously varies between the width W1 and the W2; forming a burying layer for burying peripheries of the striped shape; and forming an electrode on each of the multi-layer structure and a reverse surface of the substrate.

In one example, in the step of processing the multi-layer structure, the multi-layer structure is processed into a striped shape including: a first region having the width W1 of a constant value; a second region having the width W2 of a constant value; and a third region having a width which continuously varies between the width W1 and the W2 along the cavity length direction.

The substrate and the burying layer may be formed of InP, and the active layer and the light confinement layer may be formed of InGaAsP.

In one example, the substrate is InP, and the step of forming the multi-layer structure includes: forming a periodical corrugation on the InP substrate; thermally processing the InP substrate in an atmosphere in which at least phosphine ($PH_3$) and arsine ($AsH_3$) are mixed so as to deposit an InAsP layer in concave portions of the periodical corrugation; and depositing the multi-layer structure so as to cover the periodical corrugation and the InAsP layer.

In another example, the substrate is InP, and the step of forming the multi-layer structure includes: depositing a portion of the multi-layer structure on the InP substrate; forming a diffraction grating on the deposited portion of the multi-layer structure; thermally processing the deposited portion of the multi-layer structure in an atmosphere in which at least phosphine ($PH_3$) and arsine ($AsH_3$) are mixed so as to deposit an InAsP layer in concave portions of the diffraction grating; and depositing the remaining of the multi-layer structure so as to cover the periodical corrugation and the InAsP layer.

BRIEF DESCRIPTION OF THE DRAWINGS

FIG. 1(a) is a perspective view illustrating an example of a structure of a semiconductor laser device according to conventional technology, and FIGS. 1(b) to 1(e) are views for illustrating the relationship between the length and a characteristic of the tapered region in the structure of FIG. 1(a).

FIGS. 2(a) to 2(c) are cross-sectional views and a see-through view as viewed from above illustrating a structure of a semiconductor laser device according to Example 1 of the present invention, whereas FIG. 2(d) is a see-through view as viewed from above illustrating a modified structure of the semiconductor laser device according to Example 1 of the present invention.

FIGS. 6(a) and 6(b) are diagrams showing examples of measurement results of the far-field pattern in the semiconductor laser device according to Example 1 of the present invention.

FIGS. 10(a) to 10(c) are cross-sectional views and a see-through view as viewed from above illustrating a structure of a semiconductor laser device according to Example 2 of the present invention.

FIGS. 13(a) to 13(c) are cross-sectional views and a see-through view as viewed from above illustrating a structure of a semiconductor laser device according to Example 3 of the present invention.

FIGS. 14(a) to 14(c) are cross-sectional views and a see-through view as viewed from above illustrating a structure of a semiconductor laser device according to Example 4 of the present invention, whereas FIG. 14(d) is a partial enlarged view thereof.

FIG. 15(a) is a diagram schematically illustrating a structure of a semiconductor laser device as a comparative example, whereas FIGS. 15(b) to 15(d) are diagrams each showing an oscillation mode characteristic in the structure of FIG. 15(a).

FIG. 16(a) is a diagram schematically illustrating the structure of the semiconductor laser device according to Example 4 of the present invention, whereas FIG. 16(b) is a diagram showing an oscillation mode characteristic in the structure of FIG. 16(a) for illustrating the effect of Example 4 of the present invention.

FIGS. 17(a) to 17(c) are cross-sectional views and a see-through view as viewed from above illustrating a structure of a semiconductor laser device according to Example 5, whereas FIG. 17(d) is a see-through view as viewed from above illustrating a modified structure of the semiconductor laser device according to Example 5 of the present invention.

FIGS. 18(a) to 18(c) are cross-sectional views and a see-through view as viewed from above illustrating a structure of a semiconductor laser device according to Example 6 of the present invention.

FIGS. 20(a) to 20(c) are cross-sectional views and a see-through view as viewed from above illustrating a structure of a semiconductor laser device according to Example 7 of the present invention.

FIGS. 22(a) to 22(c) are diagrams each showing the light intensity distribution or the carrier concentration distribution inside a cavity for illustrating the effect of Example 8 of the present invention.

FIGS. 25(a) and 25(b) are diagrams each showing the light intensity distribution inside a cavity for illustrating the effect of Example 10 of the present invention.

FIG. 29(a) is a cross-sectional view illustrating a configuration of a diffraction grating (an InAsP layer) inside a cavity in the semiconductor laser device according to Example 11 of the present invention, whereas FIGS. 29(b) and 29(c) are diagrams respectively showing the effective refractive index distribution and the gain distribution inside the cavity in the semiconductor laser device according to Example 11 of the present invention for illustrating the effect of Example 11 of the present invention.

FIG. 31(a) is a diagram schematically illustrating a structure of a semiconductor laser device according to Example 12 of the present invention, whereas FIGS. 31(b) to 31(f) are diagrams each showing the effective refractive index inside the cavity, the pitch of the diffraction grating, or the Bragg wavelength distribution for illustrating the effect of Example 12 of the present invention.

FIG. 34(a) is a diagram schematically illustrating an optical communication system according to the present invention, whereas FIG. 34(b) is a diagram schematically illustrating an optical communication system according to conventional technology.

FIGS. 35(a) to 35(e) are perspective views illustrating a production method for the semiconductor laser device according to Example 11 of the present invention.

FIGS. 36(a) to 36(c) are cross-sectional views illustrating more in detail some steps in the production method for the semiconductor laser device according to Example 11 of the present invention.

BEST MODE FOR CARRYING OUT THE INVENTION

As described below with reference to FIGS. 2(a) to 2(c), the above-described problems in conventional technology may be solved by continuously varying the width of the striped active layer, which generates laser light, substantially over the entire cavity so as to satisfy the relationship W2>W1, wherein W1 denotes the width of the active layer at the front end face from which laser light is taken out, and W2 denotes the width of the active layer at the rear end face on the other side. When the above relationship is satisfied, the width of the active layer is narrow at the front end face of the semiconductor laser so that light is diffused out of the active layer, whereby the spread of the light intensity distribution is large. On the other hand, at the rear end face of the semiconductor laser, the width of the active layer is wide, and light is confined in the active layer, whereby the spread of the light intensity distribution is small.

Figure 2:
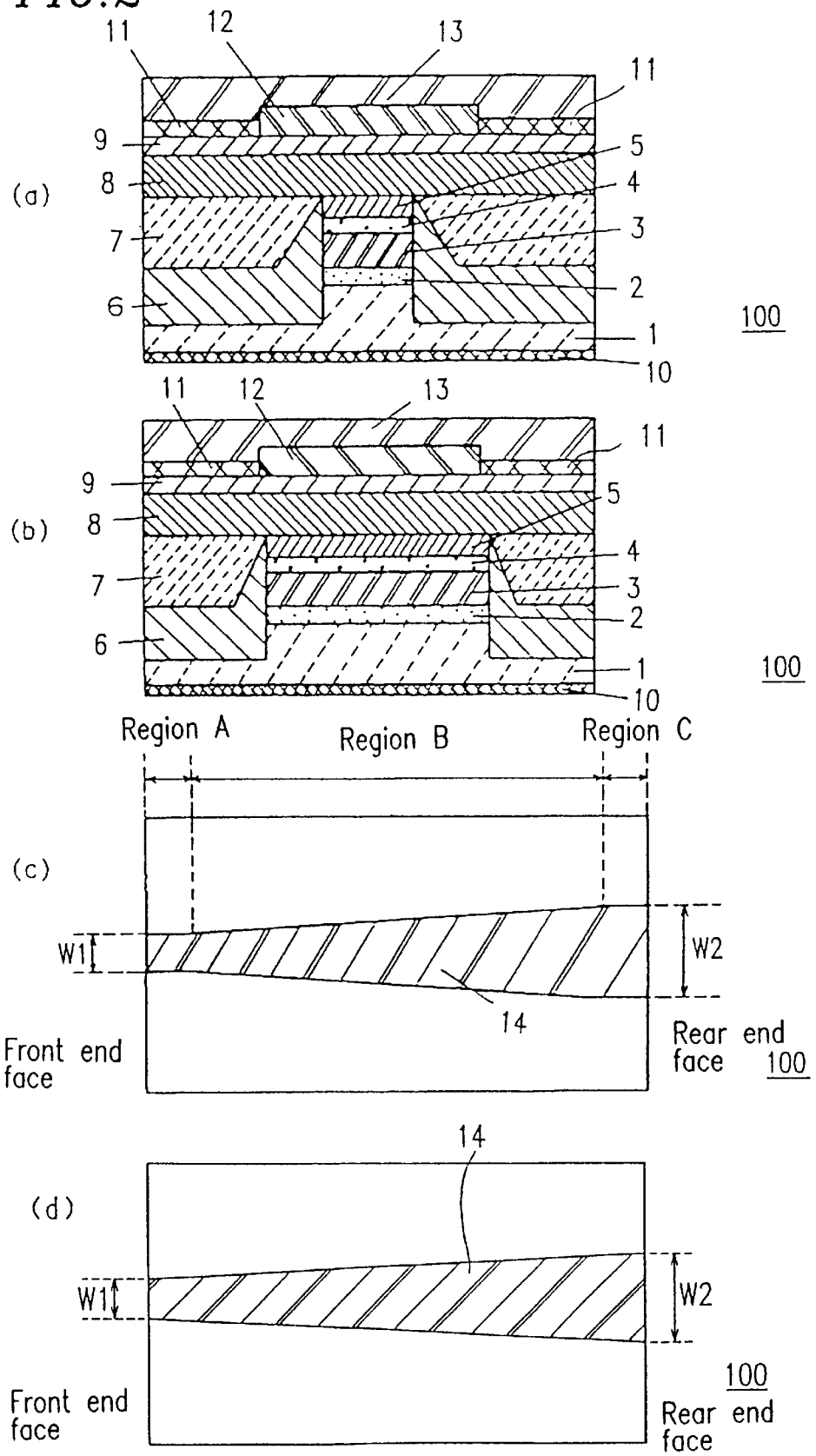
Figure 3:
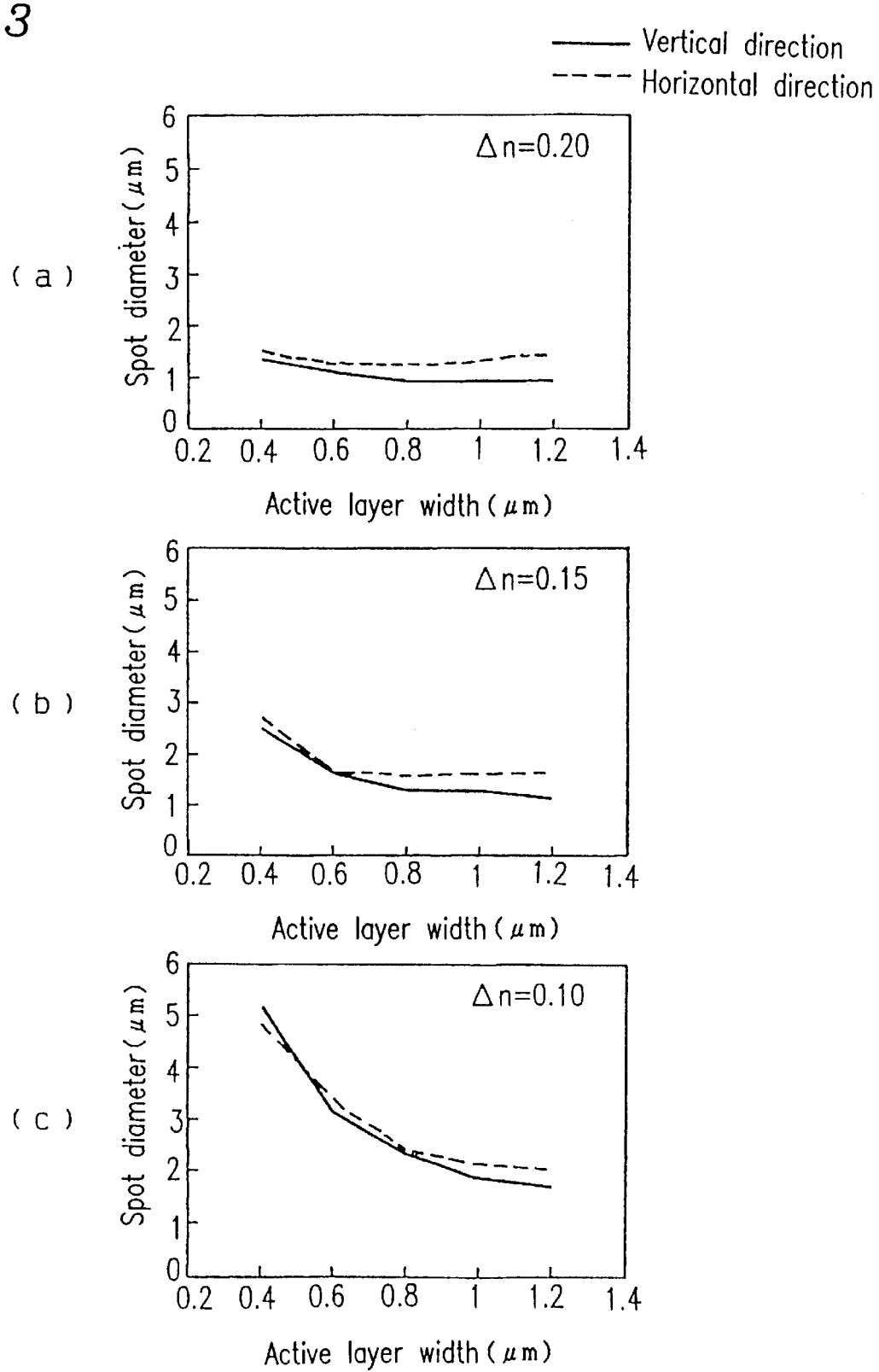
FIGS. 3(a) to 3(c) are diagrams showing calculation results of the spread of the light intensity distribution (spot diameter) for different widths of the active layer in the semiconductor laser device according to Example 1 of the present invention.

FIGS. 3(a) to 3(c) show the spread of the light intensity distribution with respect to the width of the active layer in the structure of the semiconductor laser device of FIGS. 2(a) to 2(c).

In FIGS. 3(a) to 3(c), it is assumed that the thickness of the active layer (the optical waveguide region) in which light is confined is constant at 0.2 $\mu$m, the width of the active layer (the optical waveguide region) being represented by the horizontal axis. Moreover, while the optical waveguide region is usually formed of an active layer and a light confinement layer, n1 denotes the average refractive index thereof. Furthermore, it is assumed that the surrounding region which surrounds the optical waveguide region has an uniform refractive index n2 (n1>n2).

FIGS. 3(a) to 3(c), where the parameter is the value of $\Delta n = n1-n2$, respectively show the results when $\Delta n = 0.20$, 0.15, and 0.10. Moreover, the vertical axis represents the spot diameter, representing the spread of the light intensity at a point where the light intensity is $1/e^2$ of the maximum value (the near-field pattern, e: natural constant). Furthermore, the solid line in FIGS. 3(a) to 3(c) represents the spot diameter in the vertical direction, whereas the broken line represents the spot diameter in the horizontal direction.

In the case where $\Delta n = 0.20$, as shown in FIG. 3(a), even if the width of the active layer is narrowed, the spot diameter does not vary either in the vertical direction or in the horizontal direction. On the other hand, in the case where $\Delta n = 0.15$ as shown in FIG. 3(b), and in the case where $\Delta n = 0.10$ as shown in FIG. 3(c); if the width of the active layer is narrowed, the spot diameter is widened both in the vertical direction and in the horizontal direction. This is because the light confinement is weakened as $\Delta n$ decreases so that light seeps out of the active layer as the width of the active layer is narrowed, whereby the spot diameter is widened.

Figure 4:
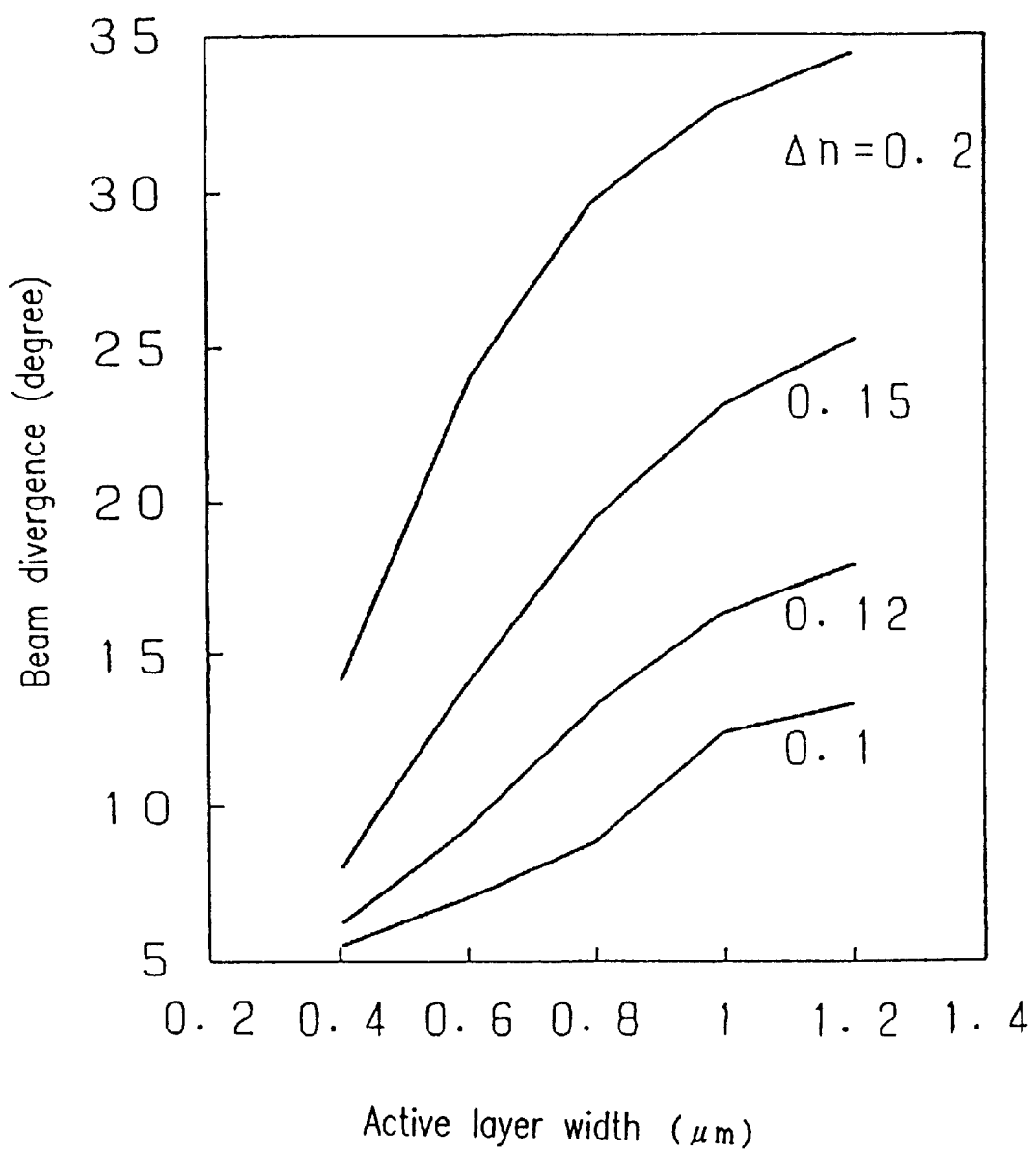
FIG. 4 is a diagram showing calculation results of the beam divergence in the vertical direction with respect to the width of the active layer in the semiconductor laser device according to Example 1 of the present invention.

FIG. 4 shows the results of calculation of the beam divergence in the vertical direction with respect to the width of the active layer with $\Delta n$ being the parameter. Particularly, four cases are shown, where $\Delta n = 0.20$, 0.15, 0.12, and 0.10, respectively.

This indicates that, when $\Delta n = 0.20$, the variation of the beam divergence is very slight as the width of the active layer is narrowed, while, when $\Delta n = 0.15$, the beam divergence is abruptly narrowed as the width of the active layer is narrowed to be 1.0 $\mu$m or less.

As can be seen from the above, a very narrow beam divergence can be realized by setting the refractive index difference $\Delta n$ between the optical waveguide region and the surrounding region to be less than 0.2 and the width W1 of the active layer at the front end face of the semiconductor laser to be about 1.0 $\mu$m or less. However, since light cannot be confined in the optical waveguide region when the width W1 is too narrow, it is necessary to set the width W1 to a magnitude such that the fundamental mode of the guided light can exist.

On the other hand, the width W2 of the active layer at the rear end face of the semiconductor laser is set so as to satisfy the relationship of W2>W1. However, when W2 is small, from the above relative expression, W1 becomes very small, and the light confinement or the gain in the entire optical waveguide region decreases, whereby the threshold current increases. In the semiconductor laser of conventional technology, which has a constant width over the entire cavity length, the width of the active layer is set to a value such that only the fundamental mode can propagate therein, whereas, in the present invention, the width W2 is preferably set to a value such that a higher mode can propagate so that the light confinement or the gain in the entire optical waveguide region will not decrease. Still in such a case, the active layer width W1 is narrow in the vicinity of the front end face of the semiconductor laser, and only the fundamental mode can propagate, so that no oscillation occurs in higher modes. It should be noted, however, that it is not necessary in the structure of the present invention to set the width W2 to a value such that higher modes can also propagate.

Hereinafter, examples of the present invention will be described with reference to the accompanying figures.

EXAMPLE 1

FIG. 2(a) is a view of a semiconductor laser device 100 according to Example 1 of the present invention as viewed from the front end face thereof, whereas FIG. 2(b) is a view of the semiconductor laser device 100 as viewed from the rear end face thereof. Moreover, FIG. 2(c) is a see-through view of the semiconductor laser device 100 as viewed from above, where the internal structure can be seen. Furthermore, FIG. 2(d) is a see-through view of a modified structure of the semiconductor laser device 100 as viewed from the above. The oscillation wavelength of the semiconductor laser device 100 is around 1.3 $\mu$m.

In the semiconductor laser device 100, an n-type InGaAsP light confinement layer (about 150 nm thick, $\lambda$g=about 1.05 $\mu$m) 2, a multiple quantum well active layer 3, a p-type InGaAsP light confinement layer (about 30 nm thick, $\lambda$g=about 1.05 $\mu$m) 4, and a p-type InP cladding layer (about 400 nm thick) 5 are formed on an n-type InP substrate 1 to be in a mesa structure extending in stripes along the cavity length direction. Herein, the hatched region in FIGS. 2(c) and 2(d) is a stripe 14. The stripe 14 includes the n-type InGaAsP light confinement layer 2, the multiple quantum well active layer 3, the p-type InGaAsP light confinement layer 4, and the p-type InP cladding layer 5.

Moreover, both sides of the striped mesa are buried with a p-type InP current blocking layer 6 and an n-type InP current blocking layer 7, on which a p-type InP burying layer 8 and a p-type InGaAsP contact layer ($\lambda$g=about 1.3 $\mu$m) 9 are further formed.

An n-side electrode 10 of an Au/Sn alloy is formed on the reverse surface of the n-type InP substrate 1. On the other hand, an $SiO_2$ insulating film 11 having a striped window is formed on the p-type InGaAsP contact layer 9, on which an electrode 12 of an Au/Zn alloy is further formed being in contact with the p-type InGaAsP contact layer 9 through the striped window of the $SiO_2$ insulating film 11. A p-side electrode 13 of a Ti/Au alloy is formed on the electrode 12.

Furthermore, the multiple quantum well active layer 3 includes five pairs of a well layer and a barrier layer. The well layer is an InGaAsP well layer about 6 nm thick into which a compressive strain is introduced within a range of about 0.7%, whereas the barrier layer is an InGaAsP barrier layer ($\lambda$g=about 1.05 $\mu$m) about 10 nm thick into which no intentional strain is introduced.

The length of the laser cavity is about 300 $\mu$m, and the width of the stripe 14 including the active layer 3 varies along the cavity length direction. Specifically, the stripe width W1 in the region A having a length of about 25 $\mu$m from the front end face of the semiconductor laser is about 0.6 $\mu$m, whereas the stripe width W2 in the region C having a length of about 25 $\mu$m from the rear end face of the semiconductor laser is set within a range of about 1.6 $\mu$m to about 2.6 $\mu$m. In the remaining region B (hereinafter referred to also as the "tapered region"), the stripe width varies linearly so as to connect the region A and the region C.

Figure 5:
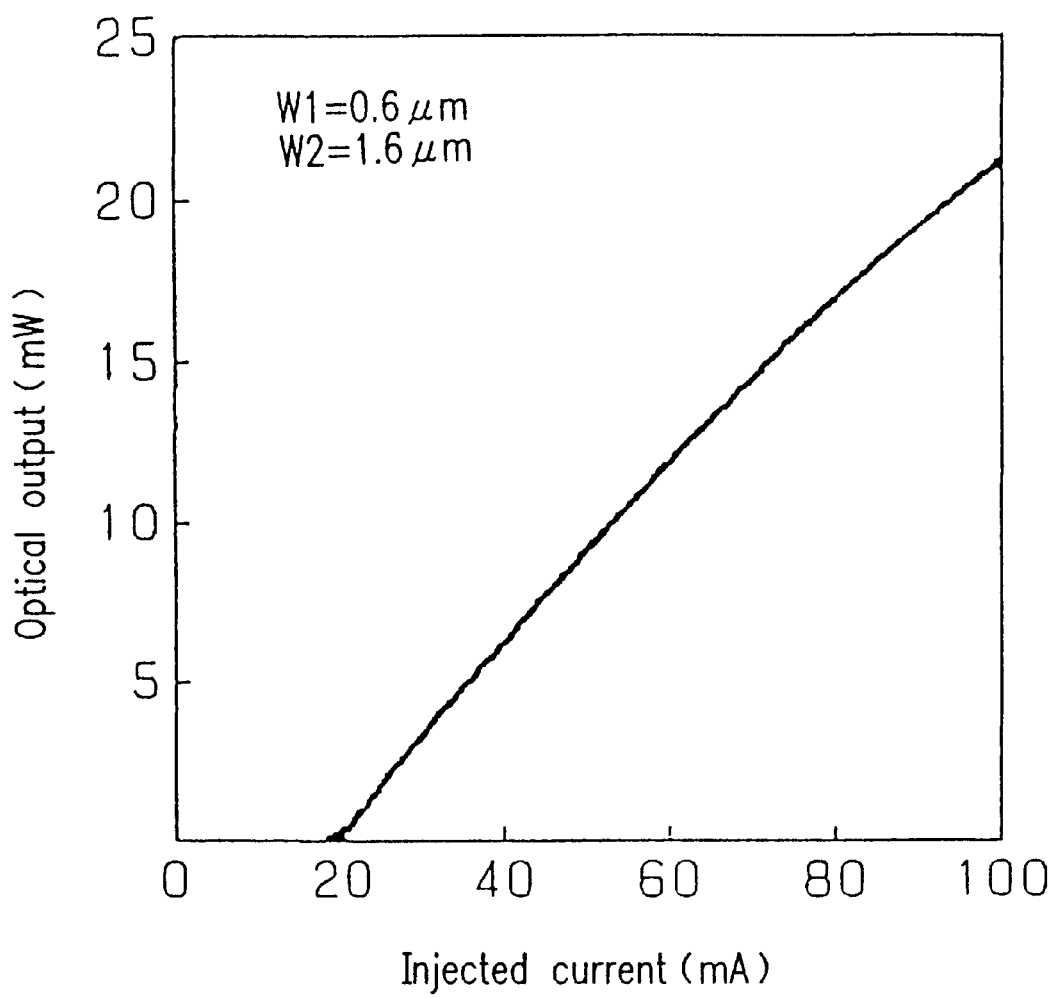
FIG. 5 is a diagram showing an exemplary measurement result of the current-optical output characteristic in the semiconductor laser device according to Example 1 of the present invention.

FIG. 5 shows the measurement result of the current-optical output characteristic in the semiconductor laser device 100 according to the present example, in the case where the stripe width W2=about 1.6 $\mu$m in the region C. The laser end faces, both the front end face and the rear end face, are cleavage surfaces. From FIG. 5, the threshold current is about 20 mA while the slope efficiency is about 0.35 mW/mA, indicating excellent characteristics.

FIGS. 6(a) and 6(b) show the measurement results of the far-field pattern in the semiconductor laser device 100 according to the present example, in the case where the stripe width W2=about 1.6 $\mu$m in the region C. This indicates that a very narrow beam divergence of about 12° is realized both in the horizontal direction (as in FIG. 6(a)) and in the vertical direction (as in FIG. 6(b)) with respect to the substrate 1.

Figure 7:
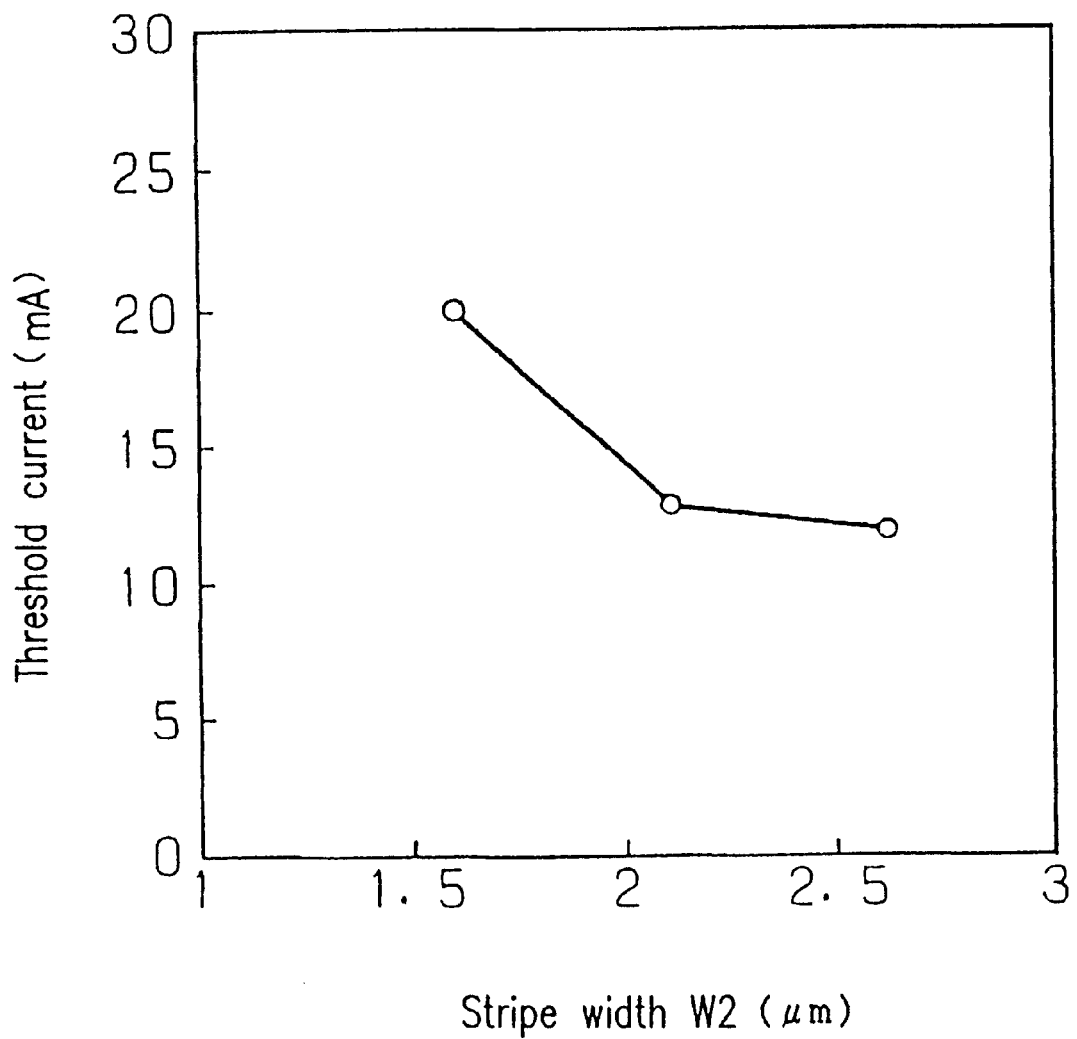
FIG. 7 is a diagram showing an exemplary measurement result of the threshold current in the semiconductor laser device according to Example 1 of the present invention.

FIG. 7 respectively shows the measurement results of the threshold current in three cases where the stripe width W2=about 1.6 $\mu$m, about 2.1 $\mu$m, and about 2.6 $\mu$m in the region C. The laser end faces, both the front end face and the rear end face are cleavage surfaces. This indicates that lowering of the threshold current is realized by widening the stripe width W2 in the region C.

Figure 8:
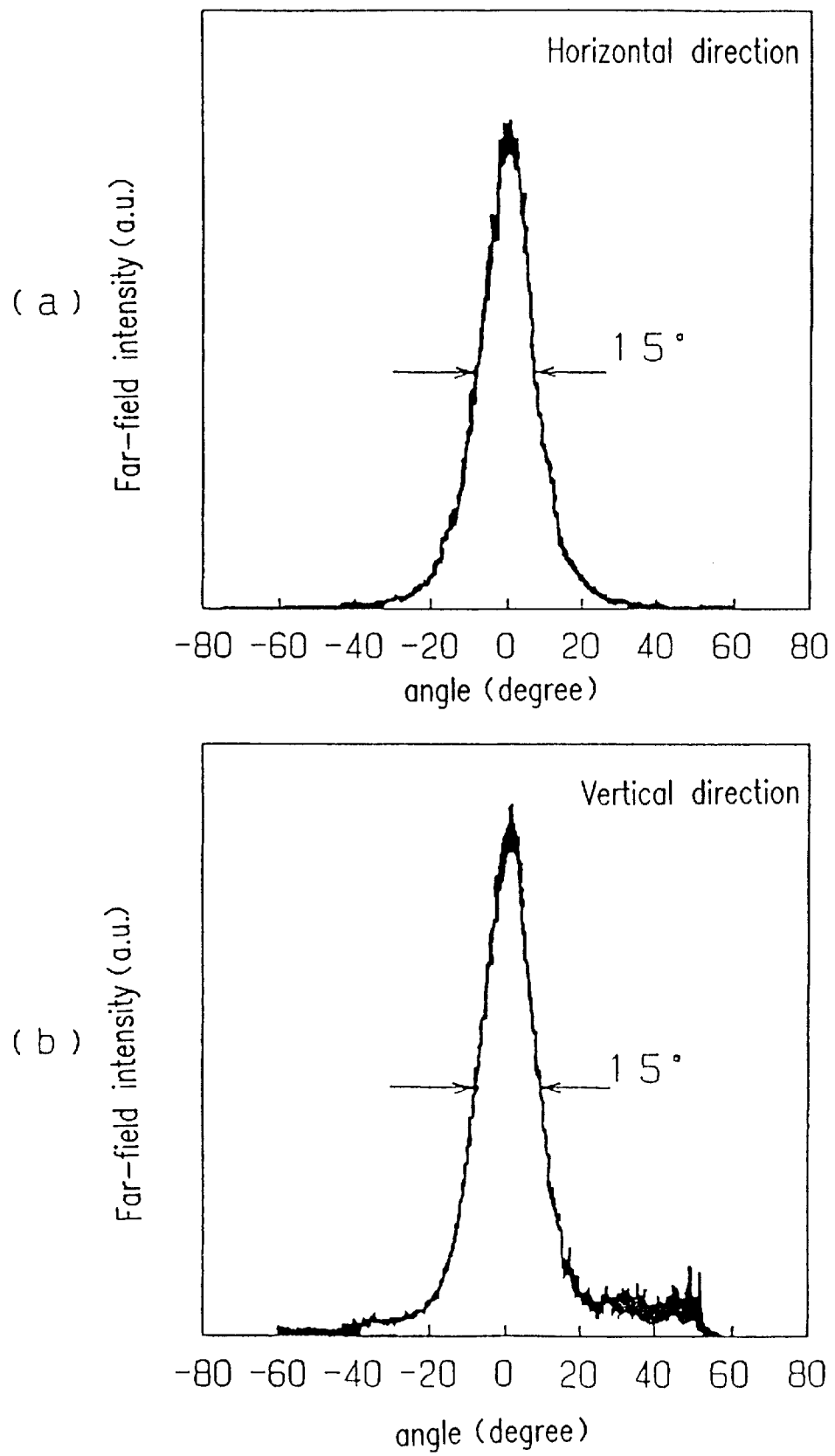
FIGS. 8(a) and 8(b) are diagrams showing other exemplary measurement results of the far-field pattern in the semiconductor laser device according to Example 1 of the present invention.

FIGS. 8(a) and 8(b) show the measurement results of the far-field pattern in the semiconductor laser device 100 according to the present example, in the case where the stripe width W2=about 2.1 $\mu$m in the region C. This indicates that a very narrow beam divergence of about 15° is realized both in the horizontal direction (as in FIG. 8(a)) and in the vertical direction (as in FIG. 8(b)) with respect to the substrate 1. Moreover, despite that the stripe width W2 has a value which allows for higher modes, a single peak is realized. This is because, as described above, the stripe width W1 in the region A is about 0.6 $\mu$m, thereby not allowing for higher modes.

In the present example, the stripe widths W1 and W2 are constant in the region A and the region C, which are portions of the laser cavity at the front end face and at the rear end face, respectively. However, since the region A and the region B are very short as compared to the entire cavity, similar effects can be realized with the region A and the region C being eliminated so as to only have the region B of a trapezoid shape having a side of the width W1 and a side of the width W2, as illustrated in FIG. 2(d). Moreover, the configurations of the region A and the region C do not necessarily have to be linear, but may also be curved. Furthermore, the respective length of the region A and the region C does not necessarily have to be about 25 $\mu$m. The inventors of the present invention have confirmed that similar effects can be realized as long as the length is within a range from 0 $\mu$m, corresponding to the above-described case where provision of the region A and the region C is omitted, to 10% of the total cavity length.

In the present example, although the stripe width W1 in the region A is set to be about 0.6 $\mu$m, as long as it is less than about 1.0 $\mu$m, similar effects can be realized by properly selecting the thickness or the composition of the n-type InGaAsP light confinement layer 2, the multiple quantum well active layer 3 and the p-type InGaAsP light confinement layer 4.

Moreover, in the present example, the average refractive index of the optical waveguide region, which includes the n-type InGaAsP light confinement layer 2, the multiple quantum well active layer 3 and the p-type InGaAsP light confinement layer 4, is about 3.31 for light having a wavelength of about 1.3 $\mu$m. On the other hand, the entire peripheral region is formed of InP, which has a refractive index of about 3.2 for light having a wavelength of about 1.3 $\mu$m, with the refractive index difference between the optical waveguide region and the peripheral region being about 0.11. Alternatively, when the refractive index difference is less than about 0.15, similar effects can be realized by properly setting the stripe width W1 in the region A to a value less than about 1.0 µm such that it allows for the fundamental mode.

Moreover, although the oscillation wavelength of the semiconductor laser device 100 of the present example is in the 1.3 µm band, it may also be in the 1.55 µm band or other oscillation wavelengths. Furthermore, although the semiconductor laser device 100 of the present example has a Fabry-Perot type structure, it may also have a structure of a distributed feedback type laser (DFB laser), in which a diffraction grating is formed in the vicinity of the active layer (e.g., on a substrate in the vicinity of the active layer).

EXAMPLE 2

FIG. 10(a) is a view of a semiconductor laser device 200 according to Example 2 of the present invention as viewed from the front end face thereof, whereas FIG. 10(b) is a view of the semiconductor laser device 200 as viewed from the rear end face thereof. Moreover, FIG. 10(c) is a see-through view of the semiconductor laser device 200 as viewed from above, where the internal structure can be seen. Herein, the hatched region in FIG. 10(c) is the stripe 14. The stripe 14 includes the n-type InGaAsP light confinement layer 2, the multiple quantum well active layer 3, the p-type InGaAsP light confinement layer 4, and the p-type InP cladding layer 5. The oscillation wavelength of the semiconductor laser device 200 is around 1.3 µm.

The basic structure of the semiconductor laser device 200 is the same as that of the semiconductor laser device 100 according to Example 1. The same reference numerals are used for the same components, which will not be described below.

In the semiconductor laser device 200 of the present example, in the region B (the tapered region), where the stripe width varies linearly, the gradient of the variation, i.e., the spread angle ($\theta$) 17 in the stripe width direction (see FIG. 10(c)), is set to be about 0.14° or less with respect to the cavity length direction. Hereinafter, the effect of the present example will be described with reference to FIGS. 11(a) and 11(b) and FIG. 12.

Figure 11:
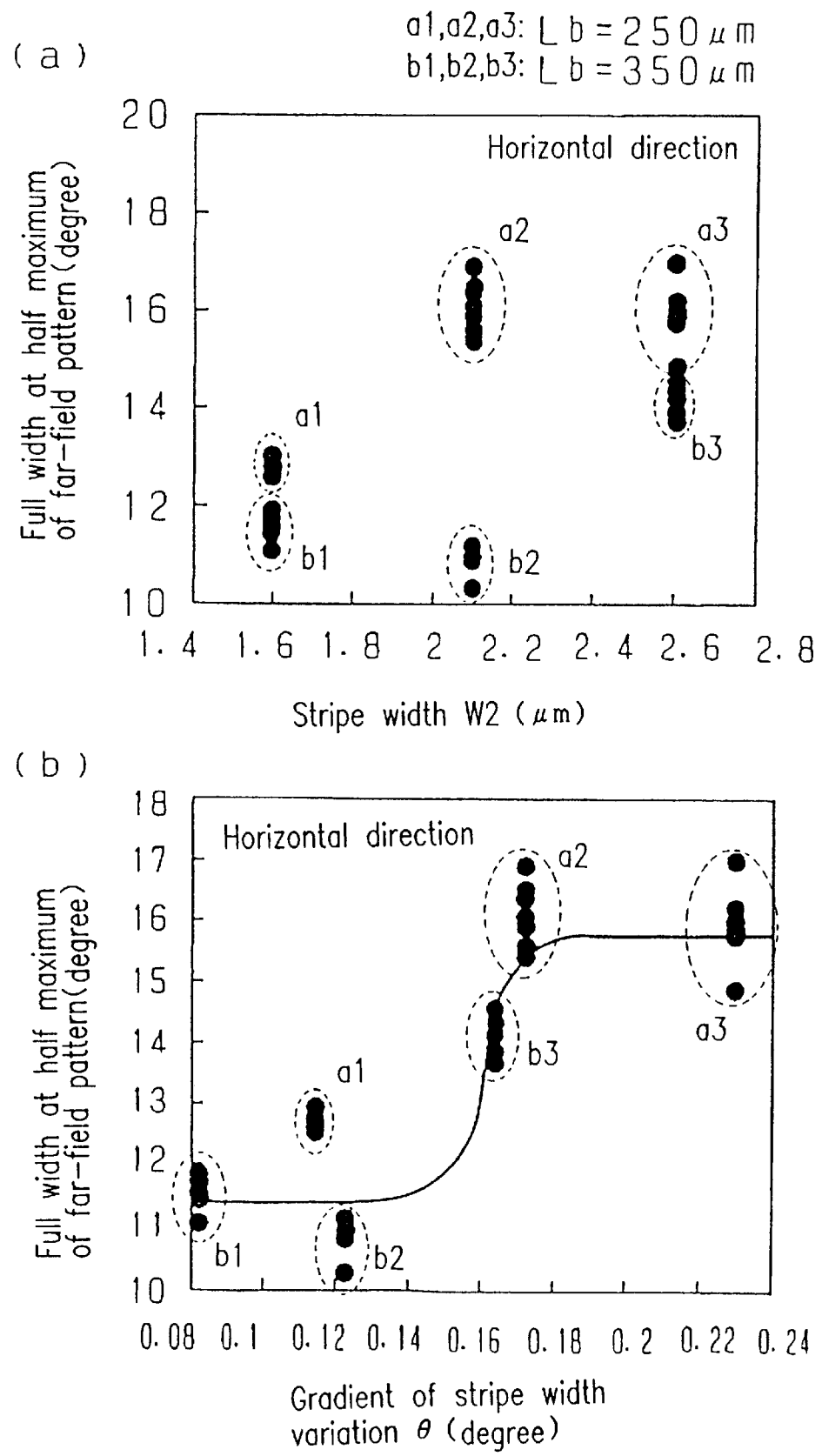
FIGS. 11(a) and 11(b) are diagrams showing the far-field pattern characteristics for illustrating the effect of Example 2 of the present invention.

FIG. 11(a) shows the measurement results of the beam divergence (the full width at half maximum of the far-field pattern) of the semiconductor laser device 200, which is produced with the stripe width W1 in the region A being about 0.6 µm, the stripe width W2 in the region C being about 1.6 µm, 2.1 µm, or 2.6 µm, and the length Lb of the region B along the stripe direction being about 250 µm (corresponding to plot groups a1, a2 and a3) or about 350 µm (corresponding to plot groups b1, b2 and b3).

Moreover, FIG. 11(b) shows a graph in which the results of FIG. 11(a) are expressed with the horizontal axis representing the gradient of the stripe width variation $\theta = \tan^{-1}\{(W2-W1)/(2 \cdot Lb)\}$, and the vertical axis representing the beam divergence (the full width at half maximum of the far-field pattern). With such a coordinate relationship, the respective plot groups a1, a2, a3, b1, b2 and b3 in FIG. 11(a) are plotted as in FIG. 11(b).

It can be seen from FIG. 11(b) that the beam-divergence is considerably reduced by setting the gradient $\theta$ to be about 0.14° or less.

Figure 12:
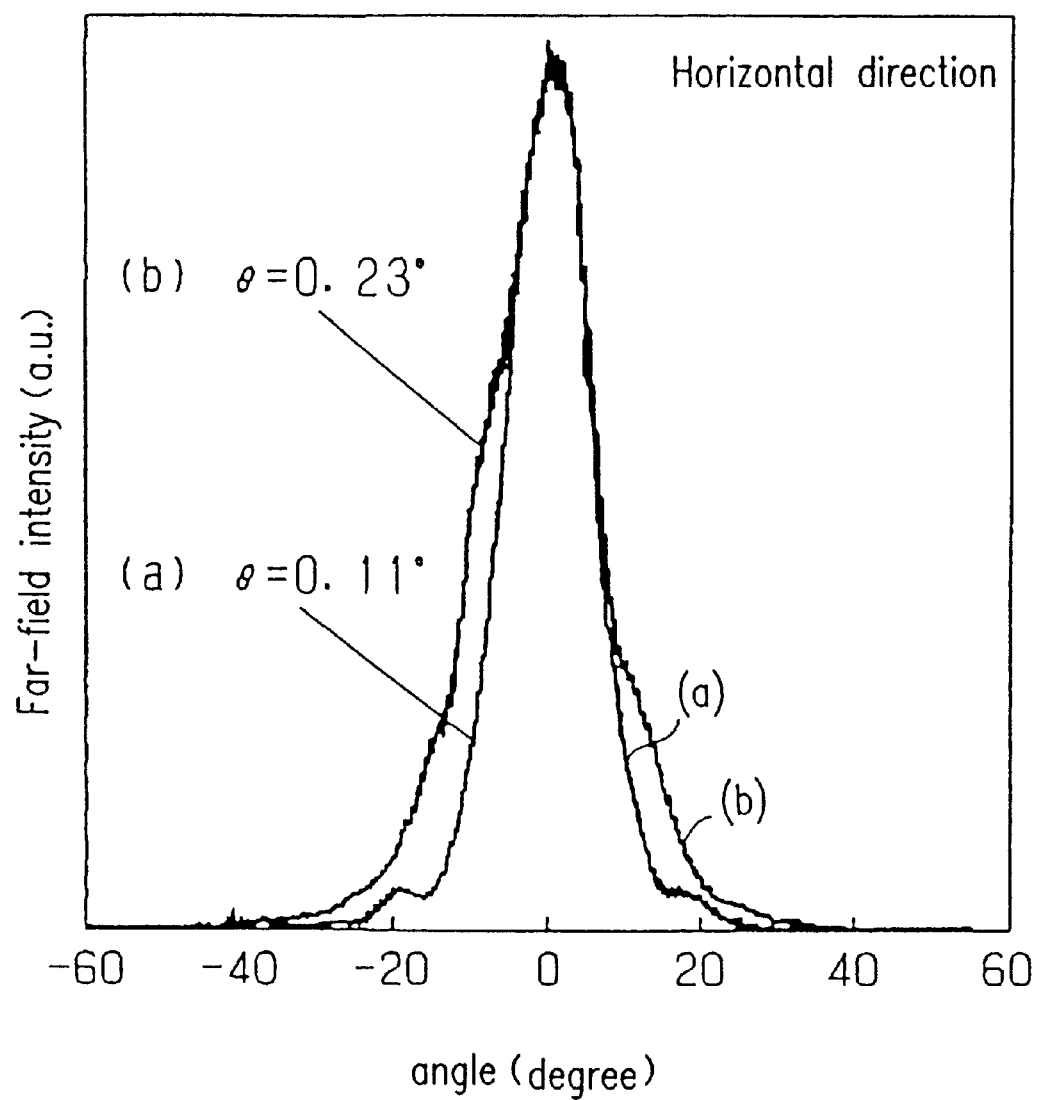
FIG. 12 is another diagram showing the far-field pattern characteristics for illustrating the effect of Example 2 of the present invention.

On the other hand, FIG. 12 shows the measurement results of the far-field pattern in the horizontal direction with respect to the substrate in the case where the gradient $\theta$ is about 0.11° (as in (a)) and about 0.23° (as in (b)). While there is a single peak at the gradient $\theta$=about 0.11° (a), a plurality of peaks are combined at the gradient $\theta$=about 0.23° (b), whereby the beam divergence is widened. This is because the radiation mode is more easily generated as the gradient $\theta$ increases, thereby influencing the emitted light pattern. In order to avoid this influence, as seen from FIG. 11(b), it is necessary to have the gradient $\theta$=about 0.14° or less.

EXAMPLE 3

FIG. 13(a) is a view of a semiconductor laser device 300 according to Example 3 of the present invention as viewed from the front end face thereof, whereas FIG. 13(b) is a view of the semiconductor laser device 300 as viewed from the rear end face thereof. Moreover, FIG. 13(c) is a see-through view of the semiconductor laser device 300 as viewed from above, where the internal structure can be seen. Herein, the hatched region in FIG. 13(c) is the stripe 14. The stripe 14 includes the n-type InGaAsP light confinement layer 2, the multiple quantum well active layer 3, the p-type InGaAsP light confinement layer 4, and the p-type InP cladding layer 5. The oscillation wavelength of the semiconductor laser device 300 is around 1.3 µm.

The basic structure of the semiconductor laser device 300 is the same as that of the semiconductor laser device 100 according to Example 1. The same reference numerals are used for the same components, which will not be described below.

In the semiconductor laser device 300 of the present example, the tapered region, where the stripe width varies linearly, is formed of two regions B1 and B2, the region B1 and the region B2 having variation gradients different from each other. Particularly, there is a relationship of $\theta 1 < \theta 2$ between the variation gradient ($\theta 1$) 18 in the region B1 and the variation gradient ($\theta 2$) 19 in the region B2, with $\theta 1$ being about 0.14° or less.

Due to such a structure, it is possible to realize the low threshold current characteristic and the narrow beam divergence characteristic.

Radiation mode light from a portion of the tapered region closer to the front end face has a greater influence on the emission light pattern. In view of this, the gradient ($\theta 1$) 18 of the stripe width variation in the region B1 closer to the front end face is set to be about 0.14° or less in the present example so that the narrow beam divergence characteristic can be realized. On the other hand, the gradient ($\theta 2$) 19 of the stripe width variation in the region B2 farther away from the front end face is set to be large so that the light confinement or the gain over the entire optical waveguide region increases, whereby the threshold current characteristic can be realized.

In the present example, the tapered region, where the stripe width varies linearly, is formed of two regions B1 and B2 having variation gradients different from each other, the same effects will also result when it is formed of three or more regions.

EXAMPLE 4

Figure 14:
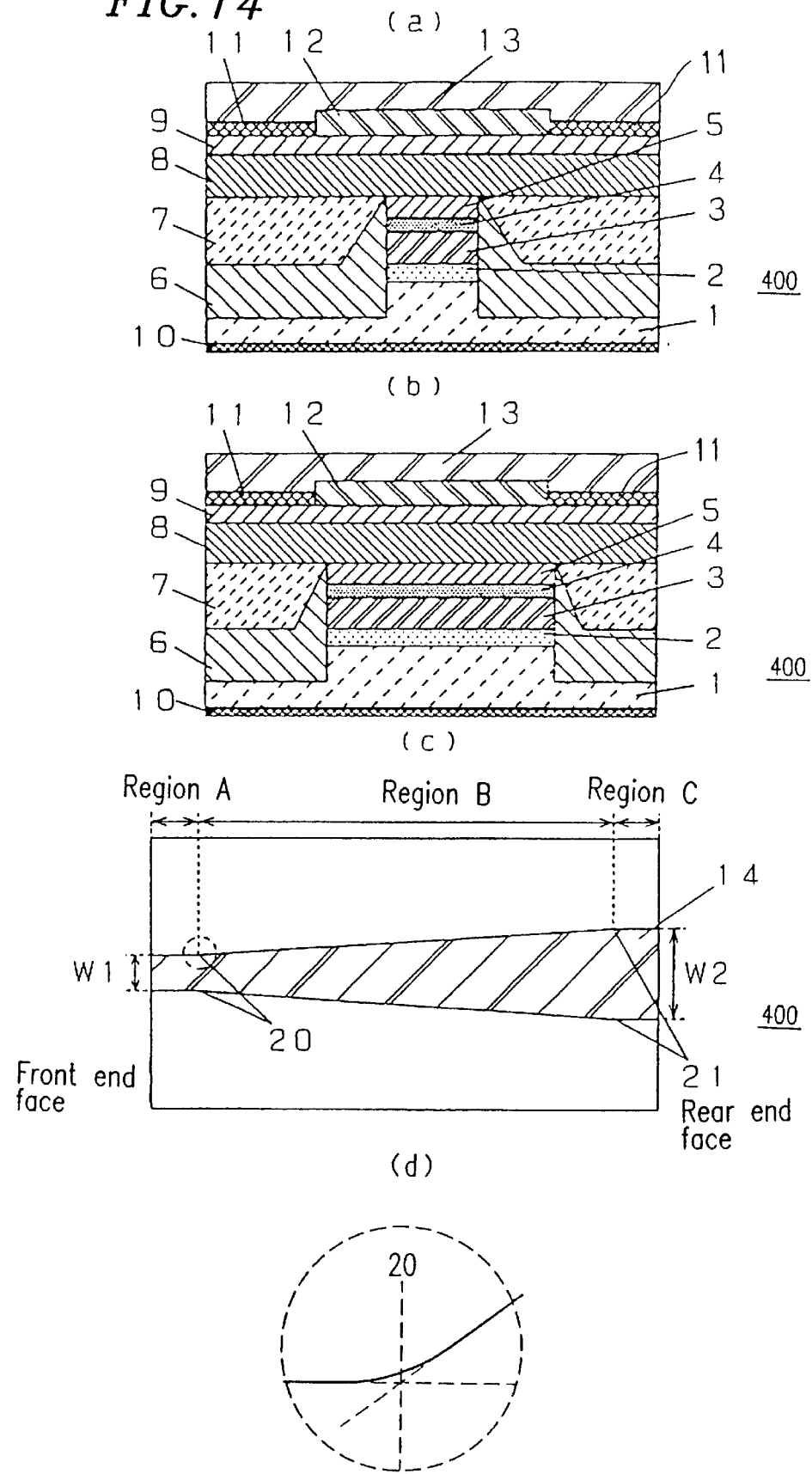

FIG. 14(a) is a view of a semiconductor laser device 400 according to Example 4 of the present invention as viewed from the front end face thereof, whereas FIG. 14(b) is a view of the semiconductor laser device 400 as viewed from the rear end face thereof. Moreover, FIG. 14(c) is a see-through view of the semiconductor laser device 400 as viewed from above, where the internal structure can be seen. Furthermore, FIG. 14(d) is an enlarged view illustrating a portion of the structure of the semiconductor laser device 400. Herein, the hatched region in FIG. 14(c) is the stripe 14. The stripe 14 includes the n-type InGaAsP light confinement layer 2, the multiple quantum well active layer 3, the p-type InGaAsP light confinement layer 4, and the p-type InP cladding layer 5. The oscillation wavelength of the semiconductor laser device 400 is around 1.3 μm.

The basic structure of the semiconductor laser device 400 is the same as that of the semiconductor laser device 100 according to Example 1. The same reference numerals are used for the same components, which will not be described below.

In the semiconductor laser device 400 of the present example, each of a boundary 20 between the region A and the region B and a boundary 21 between the region B and the region C has a smooth connection. Herein, the meaning of "smooth", as expressed mathematically, is that the differential coefficient of the gradient in one region matches that in the other at the boundary 20 between the region A and the region B and at the boundary 21 between the region B and the region C. Therefore, as shown in an enlarged view of FIG. 14(d), the stripe width W1 in the region A is gradually widened from W1 toward the region B so that discontinuity of the differential coefficient does not occur at the boundary 20. Similarly, the stripe width of the region B gradually approaches W2 toward the region C so that discontinuity of the differential coefficient does not occur at the boundary 21.

Due to such a configuration, the change of the refractive index becomes gentle at the boundaries 20 and 21 between the region A and the region B and between the region B and the region C, respectively. Thus, reflection of light is suppressed at each of the boundaries 20 and 21, and generation of the compound cavity mode is suppressed, so that the laser noise is not increased.

Referring to FIGS. 15(a) to 15(d) and FIGS. 16(a) and 16(b), the effect of the present example will be described.

Figure 15:
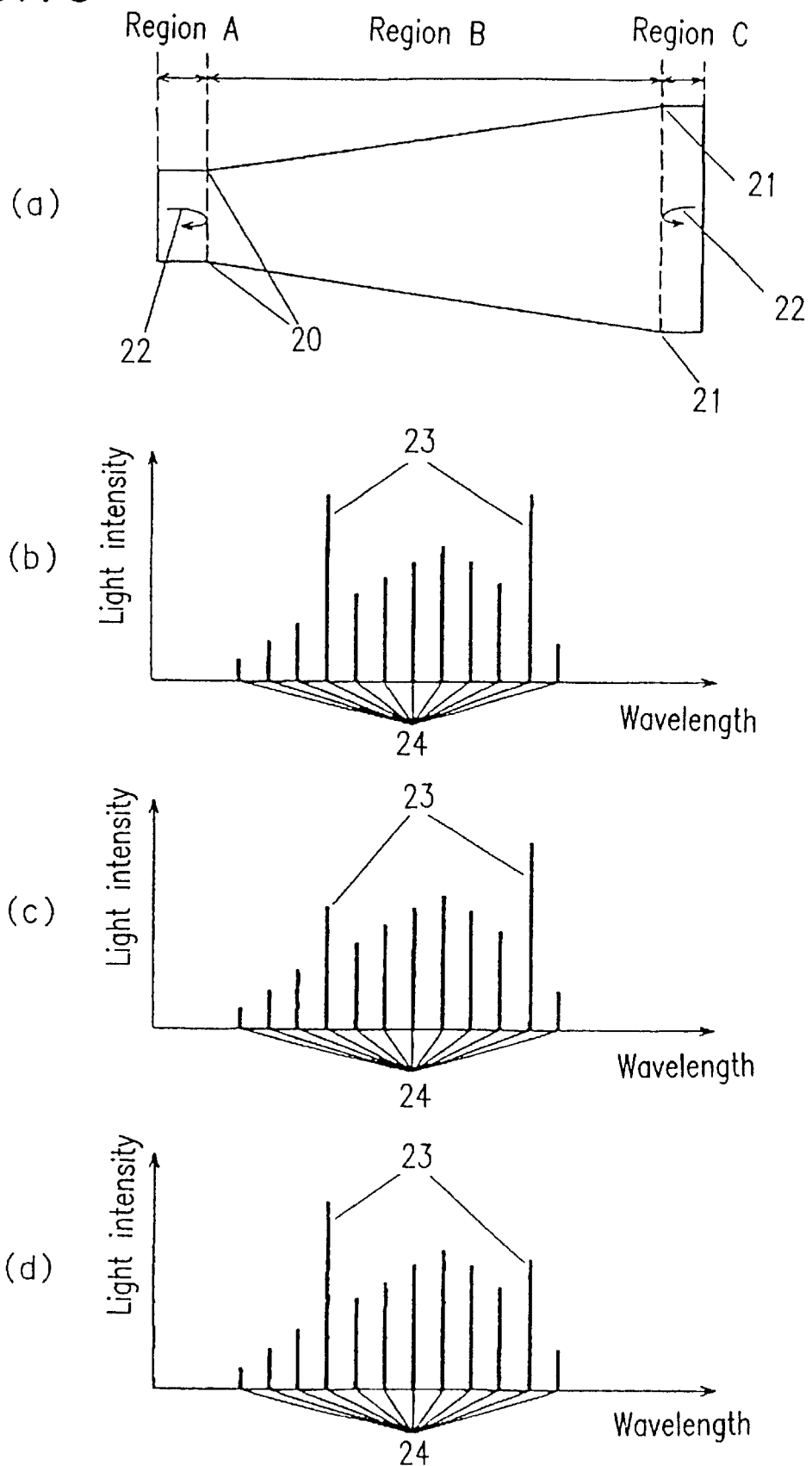

As schematically illustrated in FIG. 15(a), when the stripe width changes abruptly at the boundary 20 between the region A and the region B and at the boundary 21 between the region B and the region C, the refractive index also changes abruptly at the respective boundaries 20 and 21. Thus, the amount of light reflection increases at the respective boundaries 20 and 21, whereby a light feedback 22 occurs within the region A or within the region C. As a result, local oscillation modes exist at an interval which corresponds to the cavity length of the region A or the cavity length of the region C. When such a local oscillation mode matches an oscillation mode corresponding to the total cavity length (the main oscillation mode) in the vicinity of the peak of the gain curve, the oscillation spectrum as shown in FIG. 15(b) results. Herein, reference numeral 24 denotes a main oscillation mode corresponding to the total cavity length, and reference numeral 23 denotes the situation where the local oscillation mode at the interval corresponding to the cavity length in the region A or the cavity length of the region C overlaps with the main oscillation mode corresponding to the total cavity length. Such an oscillation mode including two types of oscillation modes is called a compound cavity mode. Moreover, as the amount of injected current varies, the oscillation spectrum varies as shown in FIG. 15(c) or FIG. 15(d), thereby causing noise when the laser is modulated.

On the other hand, FIG. 16(a) is a diagram schematically illustrating a structure of the semiconductor laser device 400 of the present example. By the smooth connection at each of the boundary 20 between the region A and the region B and the boundary 21 between the region B and the region C, the change of the refractive index at the boundaries 20 and 21 becomes gentle, thus suppressing light reflection at the boundaries 20 and 21. As a result, as shown in FIG. 16(b), oscillation modes at the interval corresponding to the cavity length in the region A or the cavity length of the region C do not appear, so that the compound cavity mode is suppressed, whereby the laser noise is not increased.

EXAMPLE 5

Figure 17:
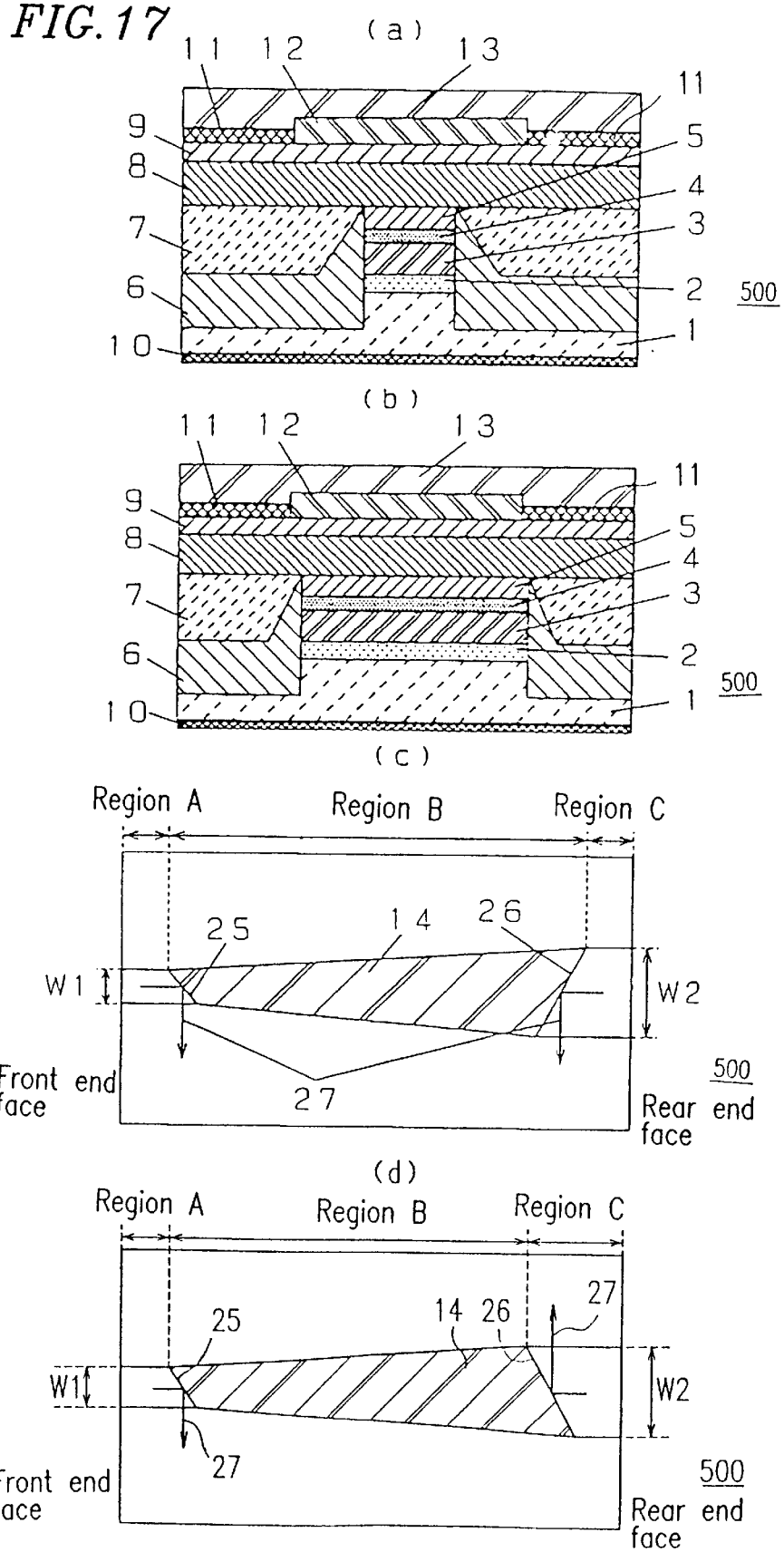

FIG. 17(a) is a view of a semiconductor laser device 500 according to Example 5 of the present invention as viewed from the front end face thereof, whereas FIG. 17(b) is a view of the semiconductor laser device 500 as viewed from the rear end face thereof. Moreover, FIG. 17(c) is a see-through view of the semiconductor laser device 500 as viewed from above, where the internal structure can be seen. Furthermore, FIG. 17(d) is a see-through view as viewed from above illustrating a modified structure of the semiconductor laser device 500. Herein, the hatched region in FIGS. 17(c) and 17(d) is the stripe 14. The stripe 14 includes the n-type InGaAsP light confinement layer 2, the multiple quantum well active layer 3, the p-type InGaAsP light confinement layer 4, and the p-type InP cladding layer 5. The oscillation wavelength of the semiconductor laser device 500 is around 1.3 μm.

The basic structure of the semiconductor laser device 500 is the same as that of the semiconductor laser device 100 according to Example 1. The same reference numerals are used for the same components, which will not be described below.

In the semiconductor laser device 500 of the present example, in the region A and the region C, the lengths on respective sides of the stripe on the side adjoining the region B are different from each other, and each of a boundary 25 between the region A and the region B and a boundary 26 between the region C and the region B is inclined by 45° with respect to the cavity length direction.

Due to such a structure, reflected light 27, generated at the boundary 25 between the region A and the region B and the boundary 26 between the region C and the region B, is directed out of the stripe, as shown in FIG. 17(c). Thus, since the region A and the region C themselves do not function as cavities, the compound cavity mode is suppressed, so that the laser noise is not increased.

Herein, the inclination angle of the boundaries 25 and 26 does not necessarily have to be 45°, but substantially the same effects can be realized when it is set within the range of about 15° to about 75°. Moreover, the inclination angle of the boundary 25 and the inclination angle of the boundary 26 do not necessarily have to be set to the same value, but may also be set to values different from each other.

Furthermore, although the boundary 25 and the boundary 26 are inclined with respect to the cavity length direction in directions opposite to each other in the structure of FIG. 17(c), they may also be inclined in the same direction so as to be parallel to each other, as shown in FIG. 17(d).

EXAMPLE 6

FIG. 18(a) is a view of a semiconductor laser device 600 according to Example 6 of the present invention as viewed from the front end face thereof, whereas FIG. 18(b) is a view of the semiconductor laser device 600 as viewed from the rear end face thereof. Moreover, FIG. 18(c) is a see-through view of the semiconductor laser device 600 as viewed from above, where the internal structure can be seen. Herein, the hatched region in FIG. 18(c) is the stripe 14. The stripe 14 includes the n-type InGaAsP light confinement layer 2, the multiple quantum well active layer 3, the p-type InGaAsP light confinement layer 4, and the p-type InP cladding layer 5. The oscillation wavelength of the semiconductor laser device 600 is around 1.3 µm.

The basic structure of the semiconductor laser device 600 is the same as that of the semiconductor laser device 100 according to Example 1. The same reference numerals are used for the same components, which will not be described below.

Figure 19:
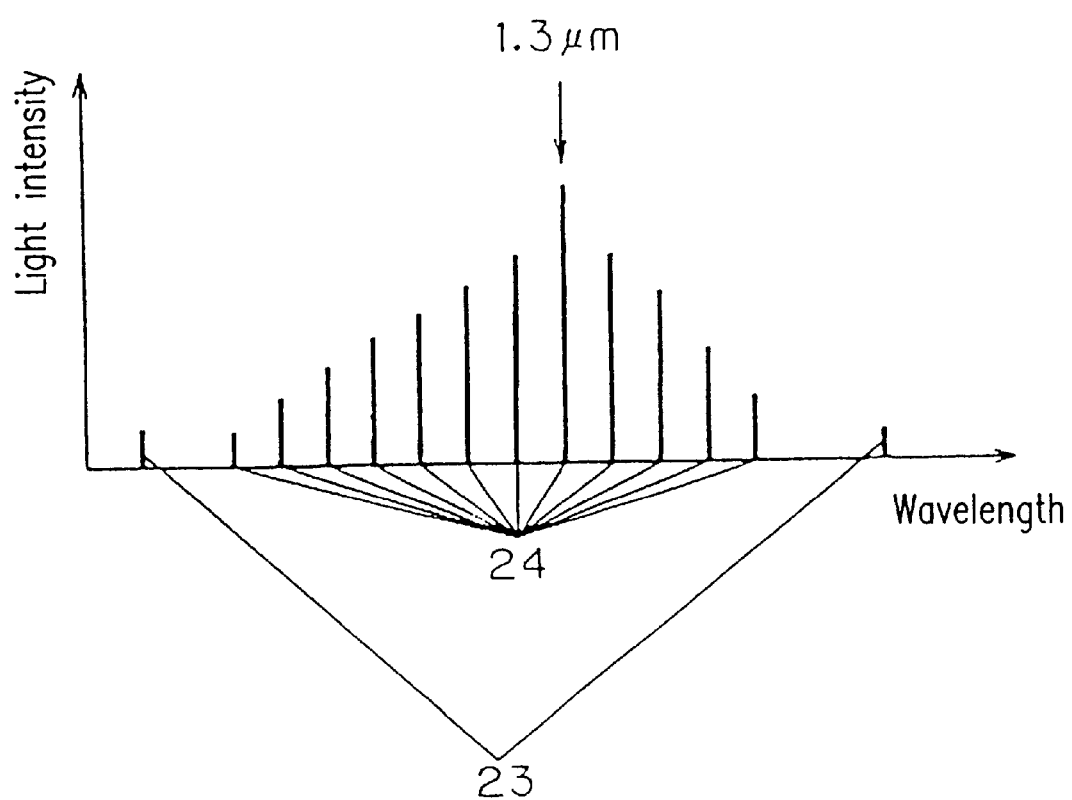
FIG. 19 is a diagram for illustrating the effect according to Example 6 of the present invention, showing an oscillation mode characteristic in the structure thereof.

In the semiconductor laser device 600 of the present example, the respective length of the region A and the region C is set to about 5 µm or less. Thus, as shown in FIG. 19, the local cavity mode 23 corresponding to the cavity length of the region A and the cavity length of the region C does not exist, but only an oscillation mode 24 corresponding to the total cavity length exists in the obtained oscillation spectrum in the vicinity of 1.3 µm, which is the oscillation wavelength of the semiconductor laser device 600. As a result, the compound cavity mode is suppressed, whereby the laser noise is not increased. On the other hand, when the length of the region A and the region C is greater than the above-described value, the interval of the local cavity mode corresponding to the cavity length of the region A or the cavity length of the region C might become shorter so as to influence the main oscillation mode corresponding to the total cavity length.

EXAMPLE 7

FIG. 20(a) is a view of a semiconductor laser device 700 according to Example 7 of the present invention as viewed from the front end face thereof, whereas FIG. 20(b) is a view of the semiconductor laser device 700 as viewed from the rear end face thereof. Moreover, FIG. 20(c) is a see-through view of the semiconductor laser device 700 as viewed from above, where the internal structure can be seen. Herein, the hatched region in FIG. 20(c) is the stripe 14. The stripe 14 includes the n-type InGaAsP light confinement layer 2, the multiple quantum well active layer 3, the p-type InGaAsP light confinement layer 4, and the p-type InP cladding layer 5. The oscillation wavelength of the semiconductor laser device 700 is around 1.3 µm.

The basic structure of the semiconductor laser device 700 is the same as that of the semiconductor laser device 100 according to Example 1. The same reference numerals are used for the same components, which will not be described below.

In the semiconductor laser device 700 of the present example, a highly reflective film 28 with a reflectance of about 60% or higher, typically about 80%, is formed on the rear end face, with the length of the region A and the length of the region C being about 25 µm and about 5 µm or less, respectively. When the highly reflective film 28 is formed on the rear end face, the compound cavity mode is more easily generated in the region C located on the rear end face side; however, by shortening the length of the region C as described above, generation of a cavity mode in the region C is suppressed, so that the laser noise is not increased. Moreover, since the length of the region A is about 25 µm, disappearance of the region A does not occur due to misalignment in cleavage.

EXAMPLE 8

Figure 21:
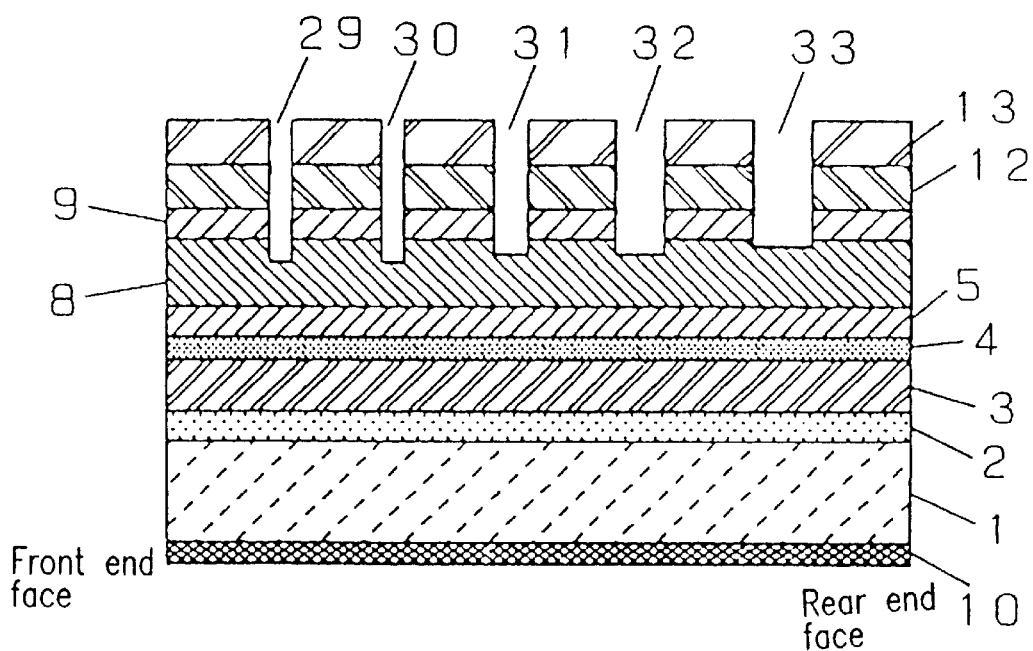
FIG. 21 is a cross-sectional view illustrating a structure of a semiconductor laser device according to Example 8 of the present invention.

FIG. 21 is a cross-sectional view of a central portion of a semiconductor laser device 800 according to Example 8 of the present invention taken along the cavity length direction. The oscillation wavelength of the semiconductor laser device 800 is around 1.3 µm.

The basic structure of the semiconductor laser device 800 is the same as that of the semiconductor laser device 100 according to Example 1. The same reference numerals are used for the same components, which will not be described below.

In semiconductor laser device 800 of the present example, the Au/Zn electrode 12 and the Ti/Au electrode 13 on the p-side are separated by five separation grooves 29 to 33 which are parallel to the end faces. At the separation grooves 29 to 33, the p-type InGaAsP contact layer 9 and a portion of the p-type InP cladding layer 8 directly under the contact layer 9 are further removed.

The separation grooves 29 to 33 closer to the rear end face along the cavity length have a wider width. That is, the separation groove 30 is wider than the separation groove 29, while the separation groove 31 is wider than the separation groove 30. Particularly, the width of the separation groove 29 closest to the front end face is typically about 5 µm, while the widths of the separation grooves 30 to 32 are typically about 10 µm, about 15 µm and about 20 µm, respectively, with the width of the separation groove 32 closest to the rear end face being typically about 25 µm.

When the p-side electrodes 12 and 13 are formed entirely over the upper surface of the laser element without providing separation grooves such as those in the present example, the amount of current injected into the active region substantially increases in a region which is provided closer to the rear end portion and thus has a wider stripe width; therefore, the closer to the rear end portion, the higher the light intensity becomes, as shown in FIG. 22(a). In such a case, the carrier concentration is lowered in a region which is closer to the rear end portion and thus has a higher light intensity, whereby the carrier concentration varies along the cavity length direction, as shown in FIG. 22(b). As a result, the half value width of the gain spectrum is widened, so that the differential gain decreases while the threshold current increases.

On the contrary, by providing a structure with the separation grooves 29 to 33 as in the present example, the area of the p-side electrodes 12 and 13 is substantially more reduced when closer to the rear end face where the stripe width is wider, whereby the amount of injected current consequently decreases. Therefore, the increase in light intensity due to a wide stripe width is suppressed, so that the light intensity distribution becomes constant as shown in FIG. 22(c).

Herein, although the number of the separation grooves 29 to 33 is set to five in the present example, the specific number of the separation grooves does not necessarily have to be 5, but similar effects can be realized if it is 2 or more.

EXAMPLE 9

Figure 23:
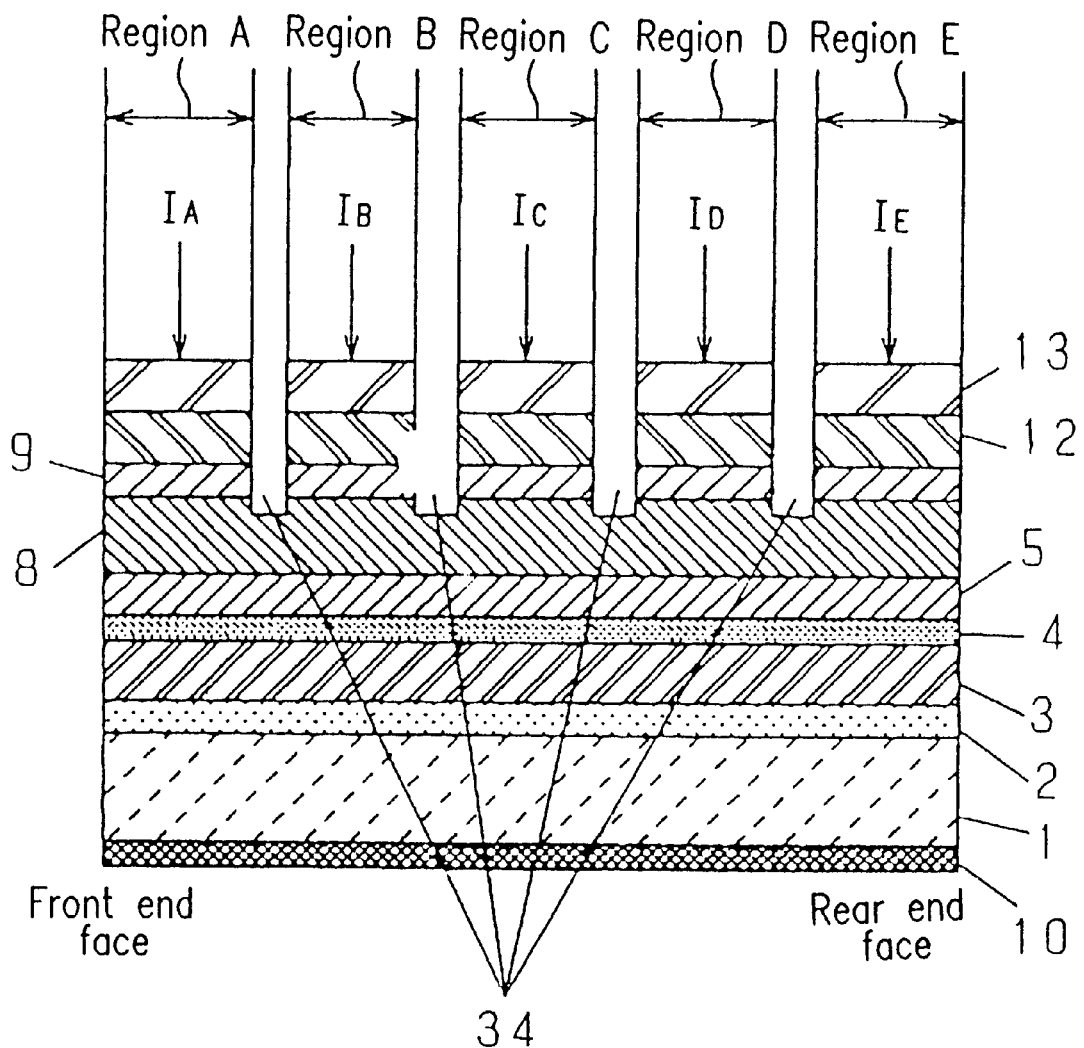
FIG. 23 is a c ross-sectional view illustrating a structure of a semiconductor laser device according to Example 9 of the present invention.

FIG. 23 is a cross-sectional view of a central portion of a semiconductor laser device 900 according to Example 9 of the present invention taken along the cavity length direction. The oscillation wavelength of the semiconductor laser device 900 is around 1.3 µm.

The basic structure of the semiconductor laser device 900 is the same as that of the semiconductor laser device 100 according to Example 1. The same reference numerals are used for the same components, which will not be described below.

In the semiconductor laser device 900 of the present example, the Au/Zn electrode 12 and the Ti/Au electrode 13 on the p-side are separated by four separation grooves 34 which are parallel to the end faces. At each separation groove 34, the p-type InGaAsP contact layer 9 and a portion of the p-type InP cladding layer 8 directly under the contact layer 9 are further removed. Moreover, the width of the separation groove 34 is constant at about 5 μm.

The cavity is separated by the separation grooves 34 into five regions A, B, C, D and E each having a length of about 60 μm, while the currents $I_A$, $I_B$, $I_C$, $I_D$, $I_E$ injected into the respective regions A to E satisfy the relationship of $I_A > I_B > I_C > I_D > I_E$. Thus, the amount of injected current is more reduced when closer to the rear end face where the stripe width is wider. Therefore, as in Example 8, the increase in light intensity due to a wide stripe width is suppressed, so that the light intensity becomes constant along the cavity length direction.

Herein, although the number of the separation grooves 34 is set to four in the present example, the specific number of the separation grooves 34 does not necessarily have to be 4, but similar effects can be realized if it is 2 or more.

EXAMPLE 10

Figure 24:
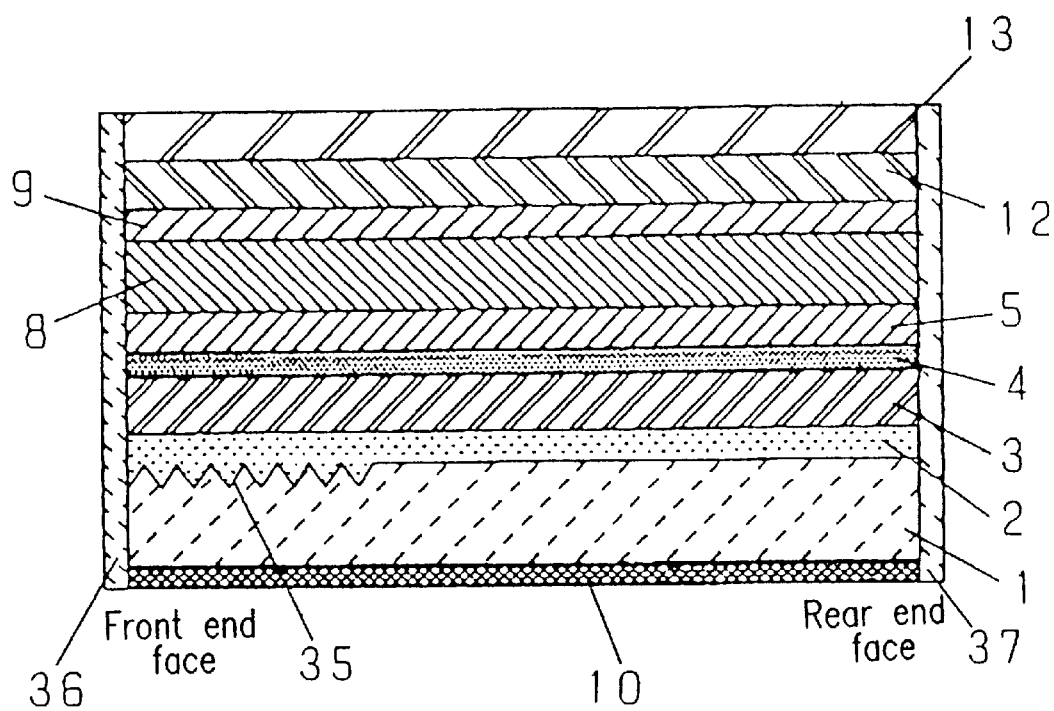
FIG. 24 is a cross-sectional view illustrating a structure of a semiconductor laser device according to Example 10 of the present invention.

FIG. 24 is a cross-sectional view of a central portion of a semiconductor laser device 1000 according to Example 10 of the present invention taken along the cavity length direction. The oscillation wavelength of the semiconductor laser device 1000 is around 1.3 μm.

The basic structure of the semiconductor laser device 1000 is the same as that of the semiconductor laser device 100 according to Example 1. The same reference numerals are used for the same components, which will not be described below.

In the semiconductor laser device 1000 of the present example, a diffraction grating 35 having a pitch of about 200 nm is formed between the n-type InP substrate 1 and the n-type InGaAsP light confinement layer 2. The diffraction grating 35 is formed over an extent of about one third of the cavity length from the front end face of the semiconductor laser device 1000, with the coupling coefficient thereof being about 60 cm$^{-1}$. Moreover, a non-reflective film 36 whose reflectance is typically about 5% is coated on the front end face of the semiconductor laser device 1000, while a highly reflective film 37 whose reflectance is typically about 80% is coated on the rear end face.

FIGS. 25(a) and 25(b) schematically show a light intensity distribution over a cavity length of a semiconductor laser device.

FIG. 25(a) shows, as a comparative example, the result in the case where the diffraction grating is formed over the entire cavity length. In such a case, as shown by the curve A, the light intensity distribution inside the cavity gradually increases from the front end face toward the rear end face, with a considerably increased light intensity in the vicinity of the rear end face. This is a phenomenon occurring due to two coincidental factors: localization of the light intensity in the vicinity of the rear end face caused by an internal light feedback due to the presence of the diffraction grating; and, an increase in the light intensity at the rear end face due to a widened stripe width in the vicinity of the rear end face. When the light intensity becomes considerably high in the vicinity of the rear end face as in this case, the light intensity which can be taken out from the front end face is lowered.

On the contrary, in the semiconductor laser device 1000 of the present example, the diffraction grating 35 is formed only in the vicinity of the front end face so as to reduce the localization of the light intensity in the vicinity of the rear end face due to the light feedback. As a result, as shown by the curve B in FIG. 25(b), a substantially uniform light intensity distribution is realized over the entire cavity length, thereby increasing the light intensity which can be taken out from the front end face.

Herein, although a structure in which the diffraction grating 35 is added to the structure of the semiconductor laser device of Example 1 has been described in the above description, similar effects as described above can also be realized by combining a diffraction grating with the structure of the semiconductor laser device according to one of Examples 2 to 9.

EXAMPLE 11

Figure 26:
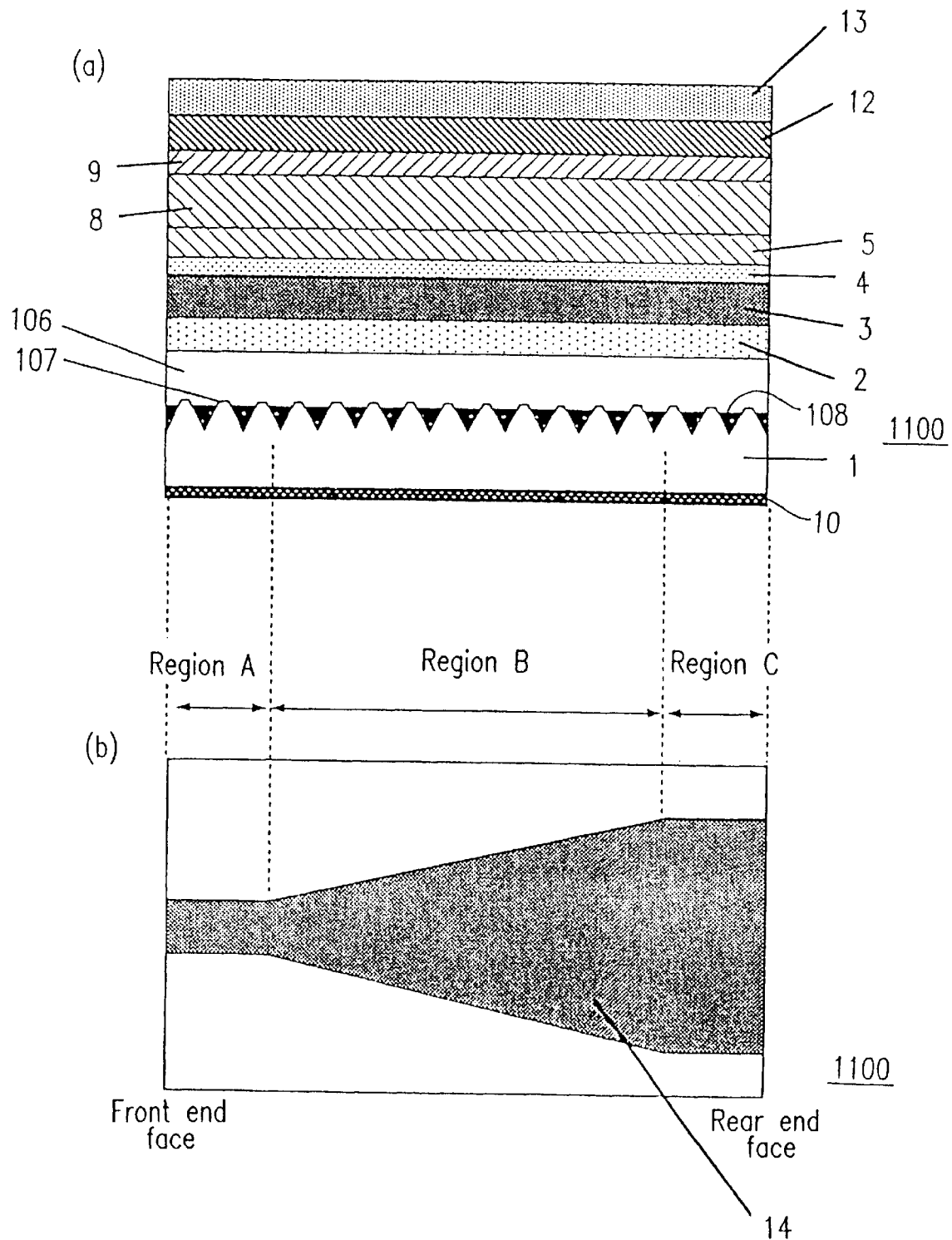
FIGS. 26(a) and 26(b) are respectively a cross-sectional view and a see-through view as viewed from above illustrating a structure of a semiconductor laser device according to Example 11 of the present invention.

FIG. 26(a) is a cross-sectional view of a central portion of a semiconductor laser device 1100 according to Example 11 of the present invention taken along the cavity length direction. Moreover, FIG. 26(b) is a see-through view of the semiconductor laser device 1100 as viewed from above, where the internal structure can be seen. Herein, the hatched region in FIG. 26(b) is the stripe 14. The stripe 14 includes the n-type InGaAsP light confinement layer 2, the multiple quantum well active layer 3, the p-type InGaAsP light confinement layer 4, and the p-type InP cladding layer 5. The oscillation wavelength of the semiconductor laser device 1100 is around 1.3 μm.

The basic structure of the semiconductor laser device 1100 is the same as that of the semiconductor laser device 100 according to Example 1. The same reference numerals are used for the same components, which will not be described below.

In the semiconductor laser device 1100 of the present example, corrugations 107 having a substantially trapezoidal cross section with a pitch of about 200 nm is formed on the n-type InP substrate 1 over the entire cavity length. An InAsP layer 108 having a thickness of about 30 nm to about 50 nm is formed only in the concave portions of the corrugations 107. Moreover, an n-type InP buffer layer 106 having a thickness of about 50 nm is formed between the n-type InP substrate 1 and the n-type InGaAsP light confinement layer 2 so as to cover the corrugations 107 and the InAsP layer 108.

Figure 27:
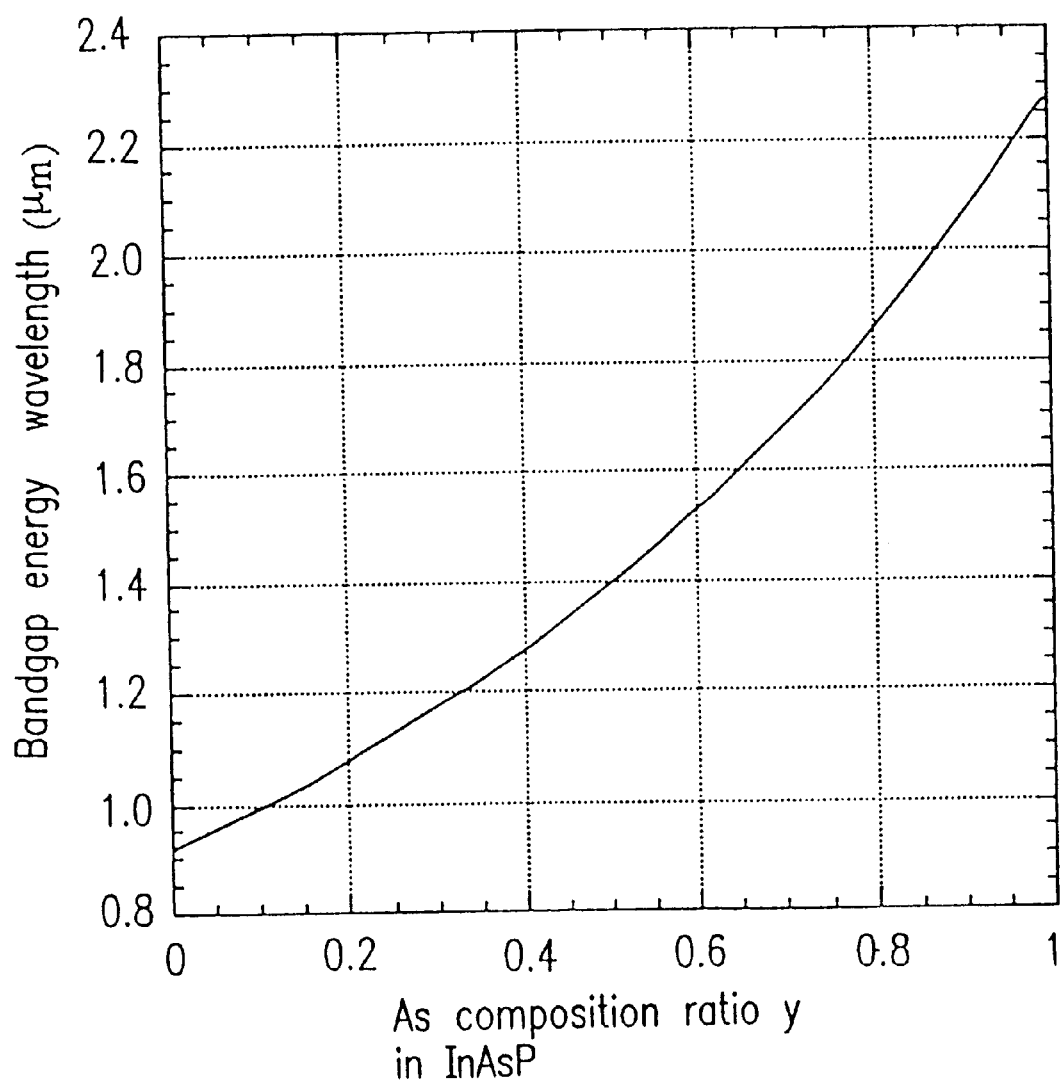
FIG. 27 is a diagram showing the relationship between the composition ratio of As and the bandgap energy wavelength in an InAsP layer for illustrating the effect of Example 11 of the present invention.

FIG. 27 shows the relationship between the composition ratio y of As, where the composition of the InAsP layer 108 is expressed as $InAs_yP_{1-y}$, and the bandgap energy wavelength of the InAsP layer 108. Thus, it is possible to vary the bandgap energy wavelength by varying the composition ratio y of As in the InAsP layer 108.

Herein, the bandgap energy wavelength in FIG. 27 has been obtained based on a calculation made on an assumption that an InAsP layer is coherently grown on an InP layer, i.e., the InAsP layer is grown to latticematch with the InP layer in the plane direction.

Figure 28:
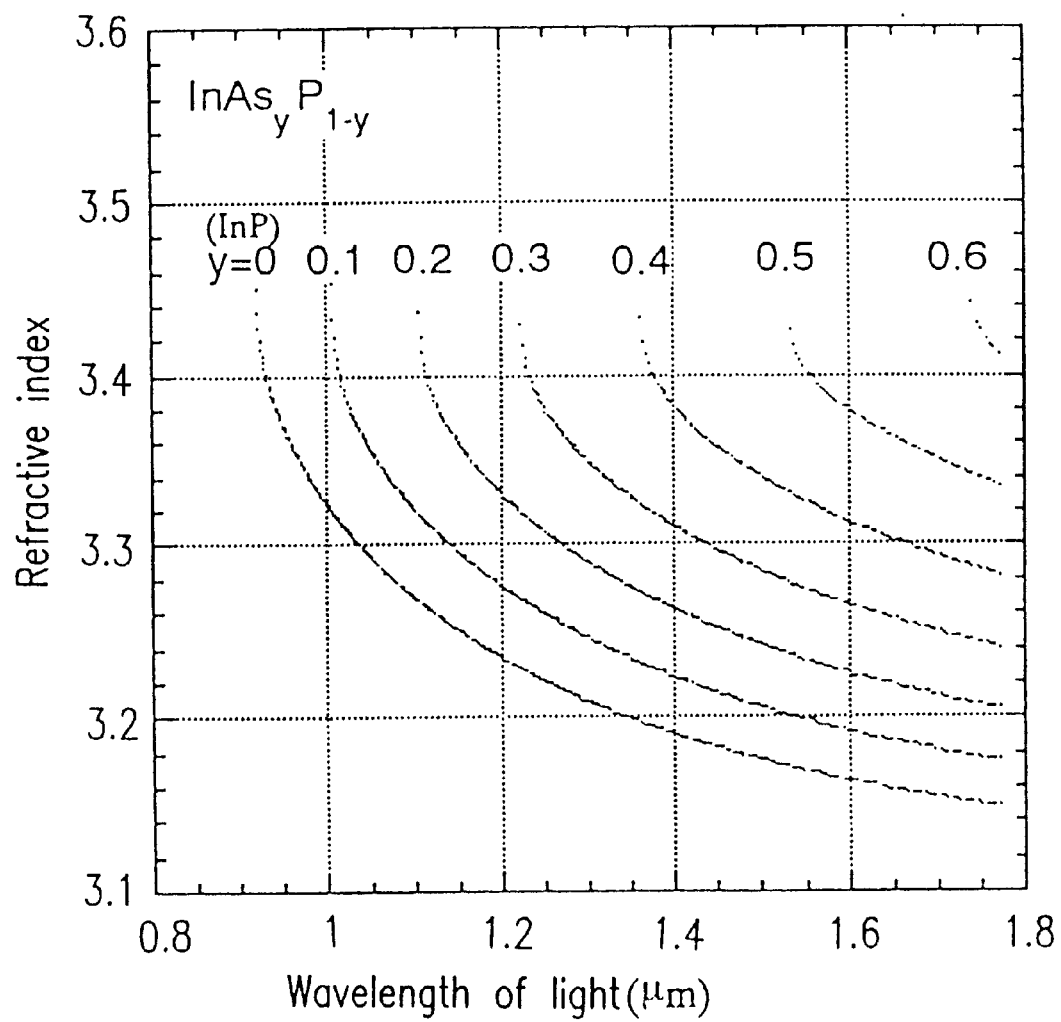
FIG. 28 is a diagram showing the refractive index characteristic with respect to the light wavelength with the composition ratio of As in the InAsP layer being a parameter.
Figure 29:
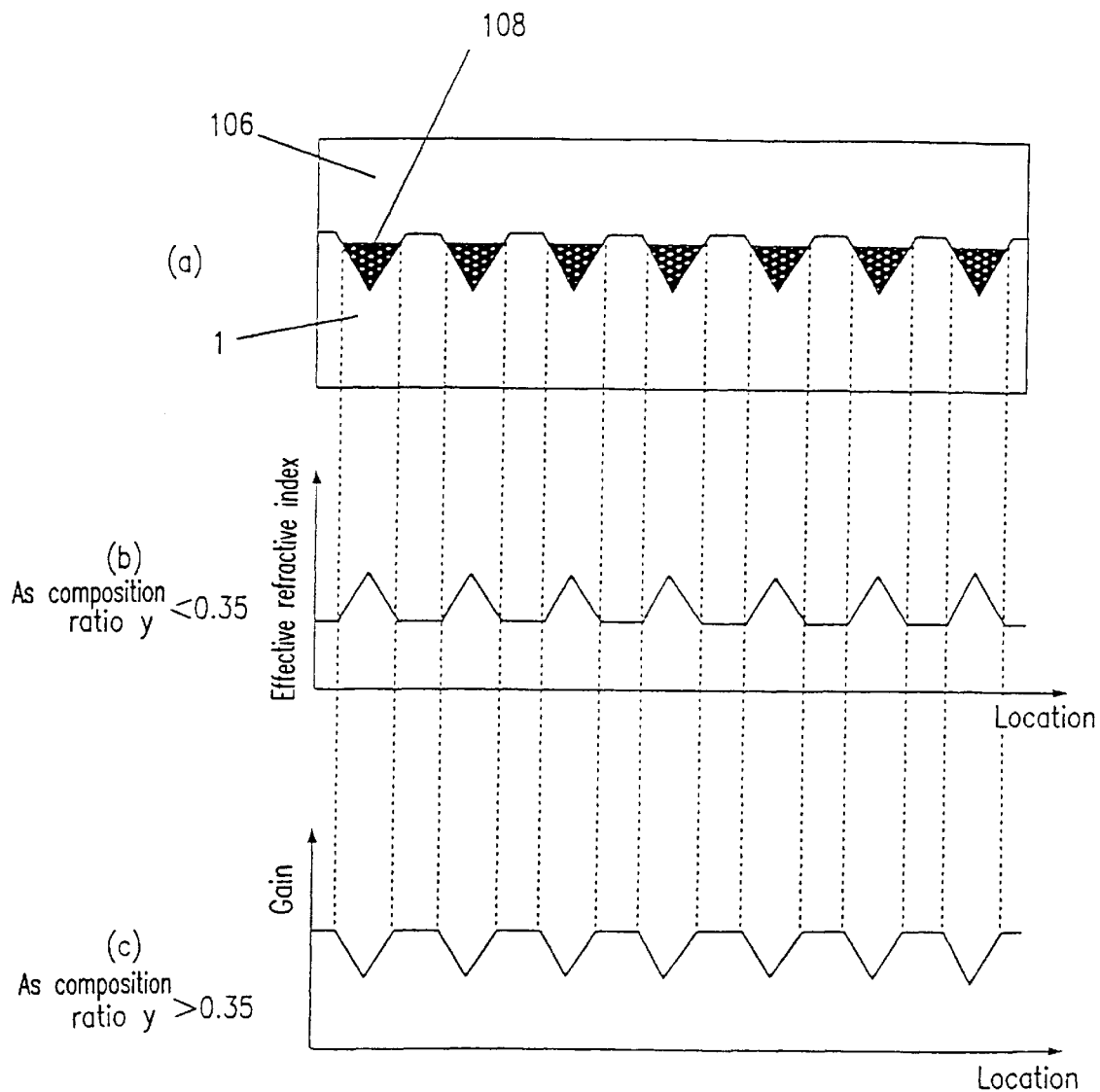

From FIG. 27, assuming the composition ratio y of As in the $InAs_yP_{1-y}$ layer 108 to be about 0.35 or less, the bandgap energy wavelength thereof becomes a wavelength shorter than about 1.3 μm, which is the oscillation wavelength of the semiconductor laser device 1100 of the present example, whereby the $InAs_yP_{1-y}$ layer 108 does not absorb laser light radiated from the active layer. However, as shown in FIG. 28, the $InAs_yP_{1-y}$ layer 108 has a larger refractive index compared to InP (i.e., y=0) for light of the same wavelength. Therefore, for an arrangement of the $InAs_yP_{1-y}$ layer 108 as shown in FIG. 29(a), the effective refractive index varies periodically along the cavity length direction as shown in FIG. 29(b). As a result, a distributed feedback type (DFB)

laser of a refractive index coupled type is realized, thus allowing for a single wavelength oscillation.

On the other hand, when the composition ratio y of As in the $InAs_yP_{1-y}$ layer 108 is set to be about 0.35 or greater, the bandgap energy wavelength becomes a wavelength longer than about 1.3 μm, which is the oscillation wavelength of the semiconductor laser device 1100 of the present example, whereby the $InAs_yP_{1-y}$ layer 108 absorbs laser light radiated from the active layer. In such a case, for the arrangement of the $InAs_yP_{1-y}$ layer 108 as shown in FIG. 29(a), the gain varies along the cavity length direction as shown in FIG. 29(c). As a result, a distributed feedback type (DFB) laser of a gain coupled type is realized, thus allowing for an single wavelength oscillation.

The corrugations 107 on the surface of the substrate 1 and the InAsP layer 108 in the structure of the present example substantially function as a diffraction grating. As described above, when an $InAs_yP_{1-y}$ crystal is used as the constituent material for the diffraction grating, either the distributed feedback type laser of the refractive index coupled type, or the distributed feedback type laser of the gain coupled type, can be realized by controlling the composition ratio y of the As thereof. In the case of realizing the refractive index coupled type distributed feedback laser, since the refractive index of the InAsP layer 108 can be varied by controlling the composition ratio y of As in the InAsP layer 108, it is possible to accurately control the refractive index coupling coefficient. On the other hand, in the case of realizing the gain coupled type distributed feedback laser, since the absorption coefficient of the InAsP layer 108 can be varied by controlling the composition ratio y of As in the InAsP layer 108, it is possible to accurately control the gain coupling coefficient.

Moreover, in the gain coupled type distributed feedback laser, as compared to the refractive index coupled type distributed feedback laser, noise is increased only to a relatively small degree even when reflected returning light is incident upon the laser. Thus, in the case where light emitted from a semiconductor laser device is optically-coupled directly to an optical fiber, there is an advantage that the laser noise is not easily increased even if light reflected by the end face of the optical fiber returns to the laser emission surface.

Herein, in the present example, the n-type InP buffer layer 106 is provided between the substrate 1 and the light confinement layer 2. The buffer layer 106 is provided in order to reduce the influence of the strain on the active layer 3 to be formed further thereon, in view of the fact that a large compressive strain is applied to the $InAs_yP_{1-y}$ layer 108 when the As composition y of the $InAs_yP_{1-y}$ layer 108 is relatively large. When the As composition y of the $InAs_yP_{1-y}$ layer 108 is relatively small to be about 0.35 or less, the provision of the buffer layer 106 may be omitted.

Moreover, the InAsP layer 108 may also be an $In_{1-x}Ga_xAs$ layer or an $In_{1-x}Ga_xAs_yP_{1-y}$ layer. Similar effects as those in the InAsP layer 108 can be realized by properly selecting values for the composition ratio x and/or y in these compositions.

EXAMPLE 12

Figure 30:
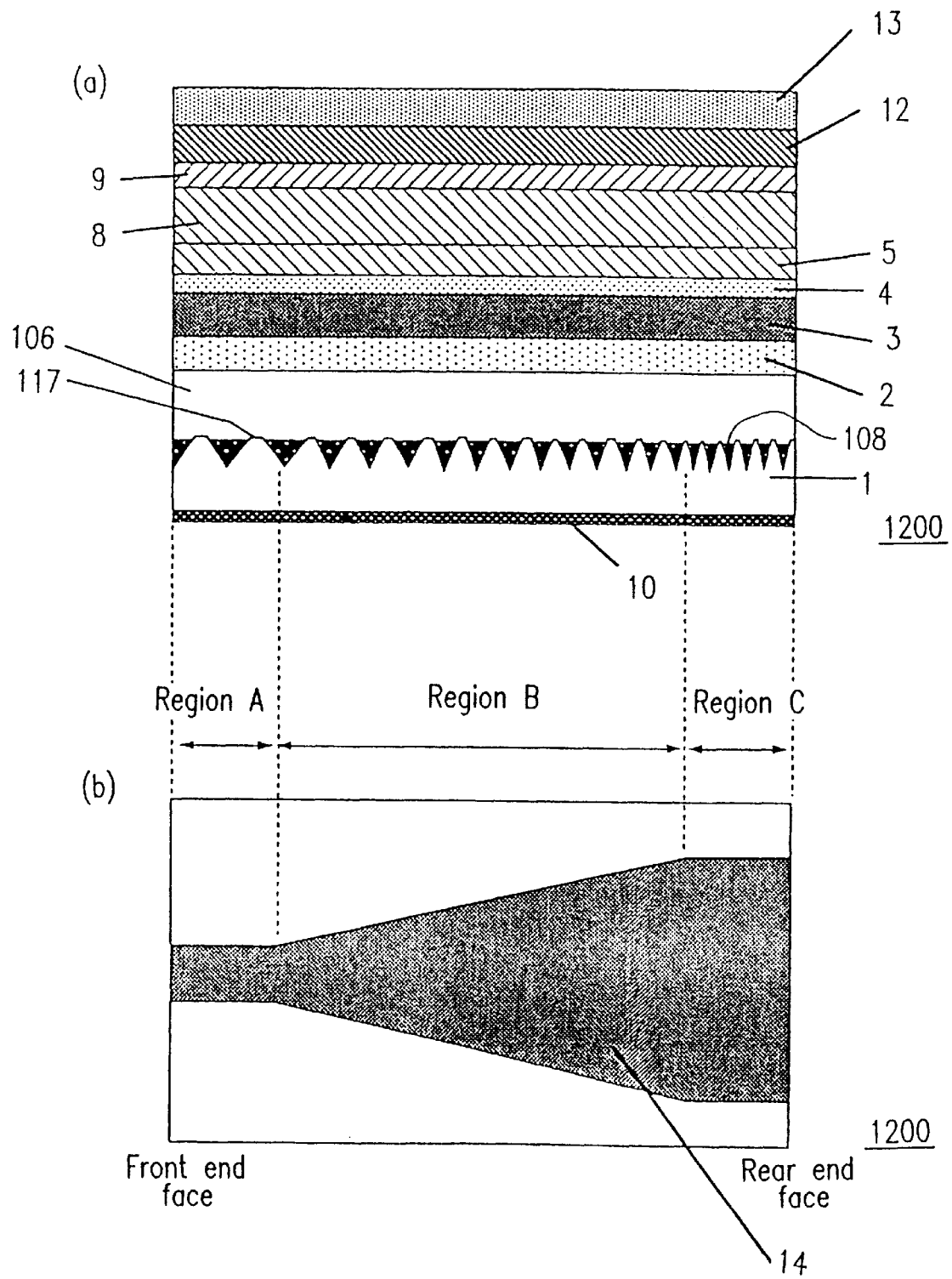
FIGS. 30(a) and 30(b) are respectively a cross-sectional view and a see-through view as viewed from above illustrating a structure of a semiconductor laser device according to Example 12 of the present invention.

FIG. 30(a) is a cross-sectional view of a central potion of a semiconductor laser device 1200 according to Example 12 of the present invention taken along the cavity length direction. Moreover, FIG. 30(b) is a see-through view of the semiconductor laser device 1200 as viewed from above, where the internal structure can be seen. Herein, the hatched region in FIG. 30(b) is the stripe 14. The stripe 14 includes the n-type InGaAsP light confinement layer 2, the multiple quantum well active layer 3, the p-type InGaAsP light confinement layer 4, and the p-type InP cladding layer 5. The oscillation wavelength of the semiconductor laser device 1200 is around 1.3 μm.

The basic structure of the semiconductor laser device 1200 is the same as that of the semiconductor laser device 1100 according to Example 11. The same reference numerals are used for the same components, which will not be described below.

In the semiconductor laser device 1200 of the present example, the pitch of corrugations 117 formed on the surface of the n-type InP substrate 1 gradually varies along the cavity length direction. Accordingly, the pitch of the diffraction grating of the InAsP layer 108 formed in the concave portions of the corrugations 117 gradually varies along the cavity length direction.

The features of the semiconductor laser device 1200 of the present example will be described with reference to FIGS. 31(a) to 31(f).

Figure 31:
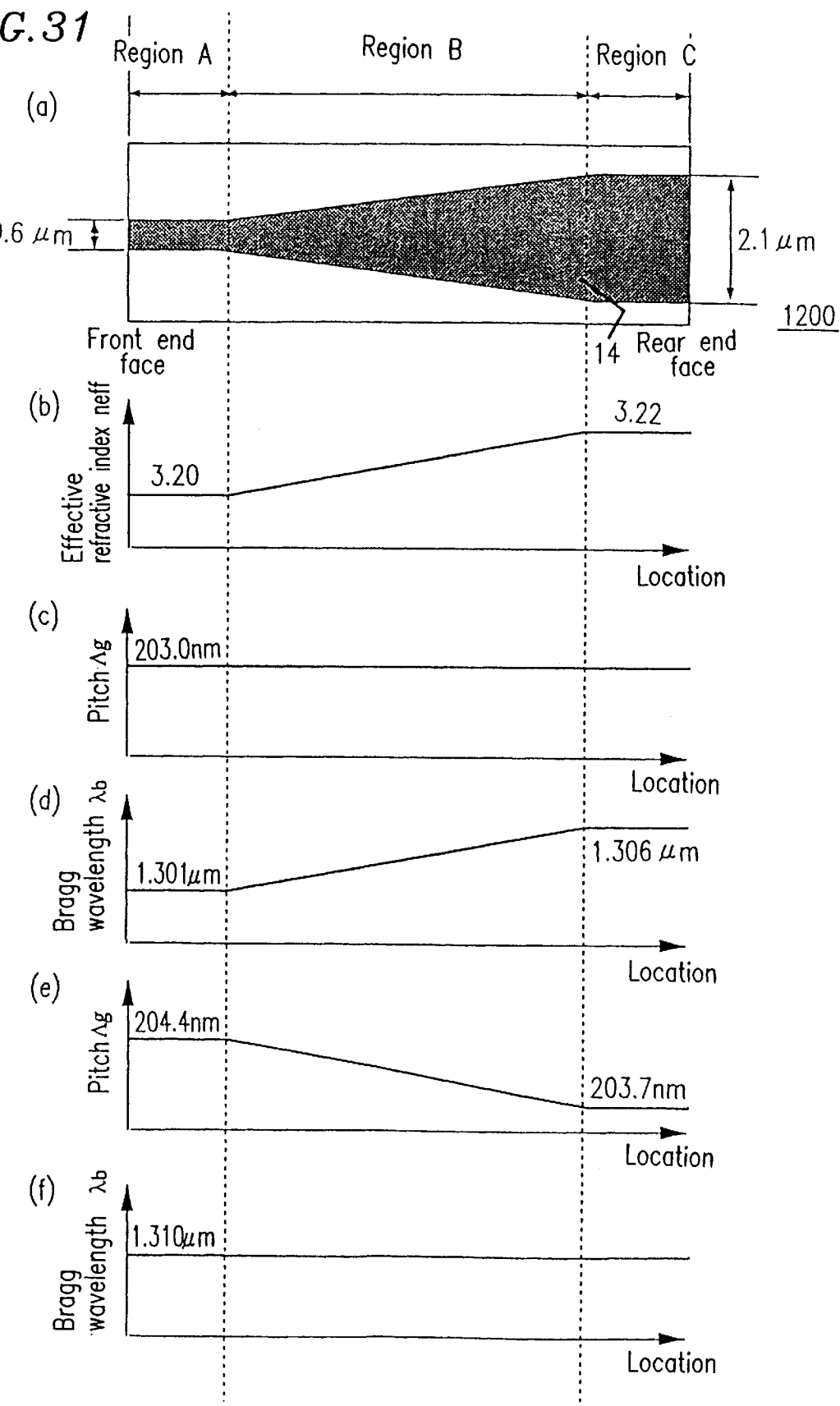

FIG. 31(a) is a view of the stripe structure 14 of the active layer in the semiconductor laser device 1200, as viewed from above, whereas FIG. 31(b) shows a distribution of the effective refractive index neff thereof along the cavity length direction. FIG. 31(d) shows a distribution of the Bragg wavelength λb along the cavity length direction when it is assumed that the diffraction grating pitch Λg is constant along the cavity length direction, as shown in FIG. 31(c).

As shown in FIG. 31(a), the stripe width is constant at about 0.6 μm in the region A on the front end face (emission surface) side, while stripe width is constant at about 2.1 μm in the region C on the rear end face side. The stripe width varies linearly in the region B between those regions. Then, as shown in FIG. 31(b), the effective refractive index neff is about 3.20 in the region A and is about 3.22 in the region C, while the effective refractive index neff varies linearly from about 3.20 to about 3.22 in the region B between those regions. The Bragg wavelength λb is given by the expression λb=2×Λg×neff. Therefore, when the diffraction grating pitch Λg is constant at Λg=about 203.0 nm along the cavity length direction, as shown in FIG. 31(c), the Bragg wavelength λb varies between about 1.301 μm to about 1.306 μm, as shown in FIG. 31(d). Thus, when the Bragg wavelength λb along the cavity length direction varies within a certain range, the possibility for oscillation with a single wavelength to occur is lowered.

Figure 32:
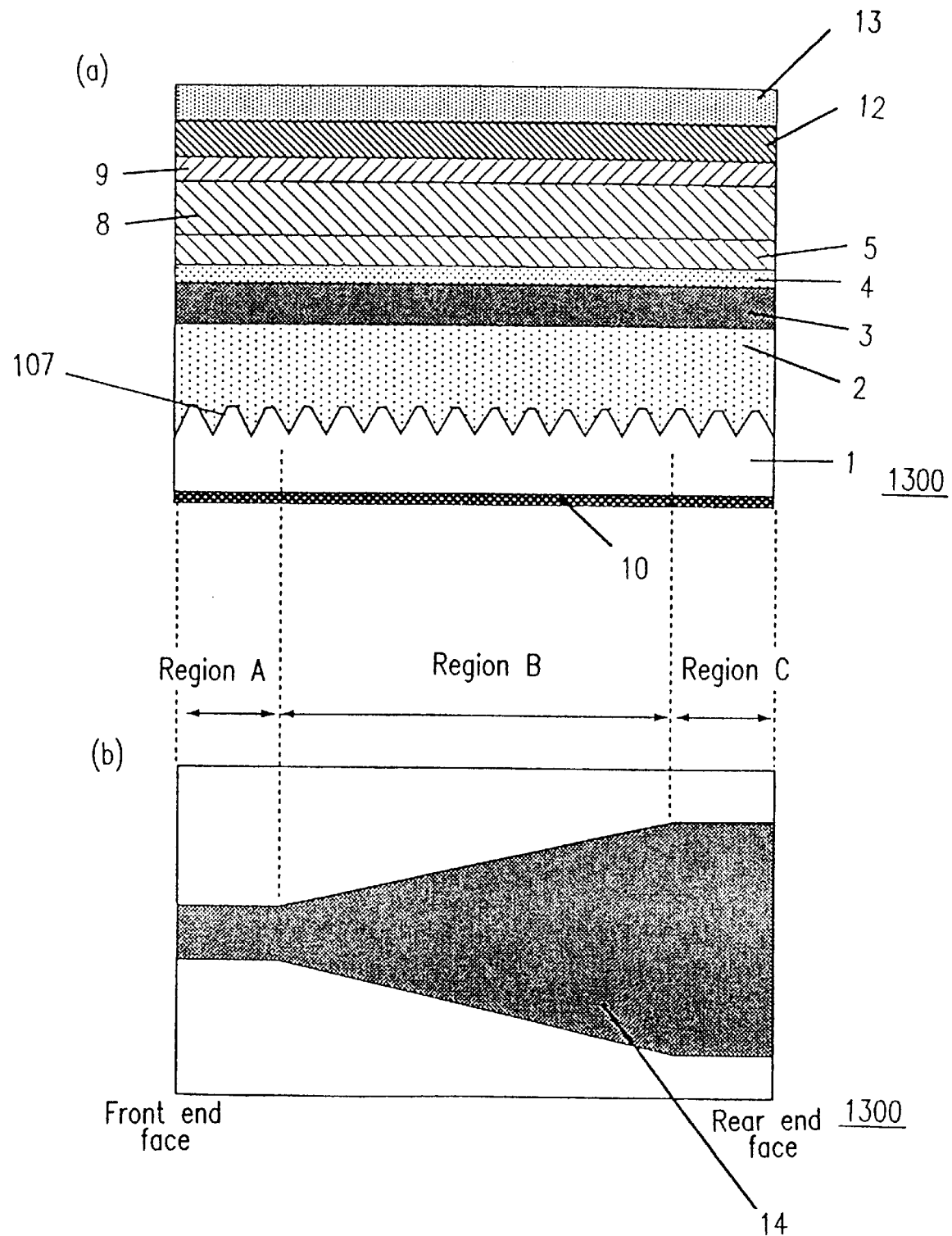
FIGS. 32(a) and 32(b) are respectively a cross-sectional view and a see-through view as viewed from above illustrating a structure of a semiconductor laser device according to Example 13 of the present invention.

On the contrary, by providing a structure as shown in FIG. 32(e) in which the diffraction grating pitch Λg=about 204.4 nm in the region A and Λg=about 203.7 nm in the region C while it varies linearly within the range of about 204.4 nm to about 203.7 nm in the region B, the Bragg wavelength λb is constant at λb=about 1.310 μm along the cavity length direction, as shown in FIG. 31(f). When the Bragg wavelength λb is constant along the cavity length direction, the possibility for oscillation with a single wavelength to occur is not lowered.

EXAMPLE 13

FIG. 32(a) is a cross-sectional view of a central potion of a semiconductor laser device 1300 according to Example 13 of the present invention taken along the cavity length direction. Moreover, FIG. 32(b) is a see-through view of the semiconductor laser device 1300 as viewed from above, where the internal structure can be seen. Herein, the hatched region in FIG. 32(b) is the stripe 14. The stripe 14 includes the n-type InGaAsP light confinement layer 2, the multiple quantum well active layer 3, the p-type InGaAsP light confinement layer 4, and the p-type InP cladding layer 5. The oscillation wavelength of the semiconductor laser device 1300 is around 1.3 μm.

The basic structure of the semiconductor laser device 1300 is the same as that of the semiconductor laser device 1100 according to Example 11. The same reference numerals are used for the same components, which will not be described below.

In the semiconductor laser device 1300 of the present example, the n-type InGaAsP light confinement layer 2 is formed directly on the corrugations 107 having a pitch of about 200 nm, which is formed on the n-type InP substrate 1 over the entire cavity length. Also in such a structure, due to the presence of the corrugations 107 formed on the n-type InP substrate 1, the thickness of the n-type InGaAsP light confinement layer 2 varies periodically along the cavity length direction. Thus, the semiconductor laser device 1300 becomes a distributed feedback type laser of a refractive index coupled type, thereby allowing for a single wavelength oscillation.

EXAMPLE 14

Figure 33:
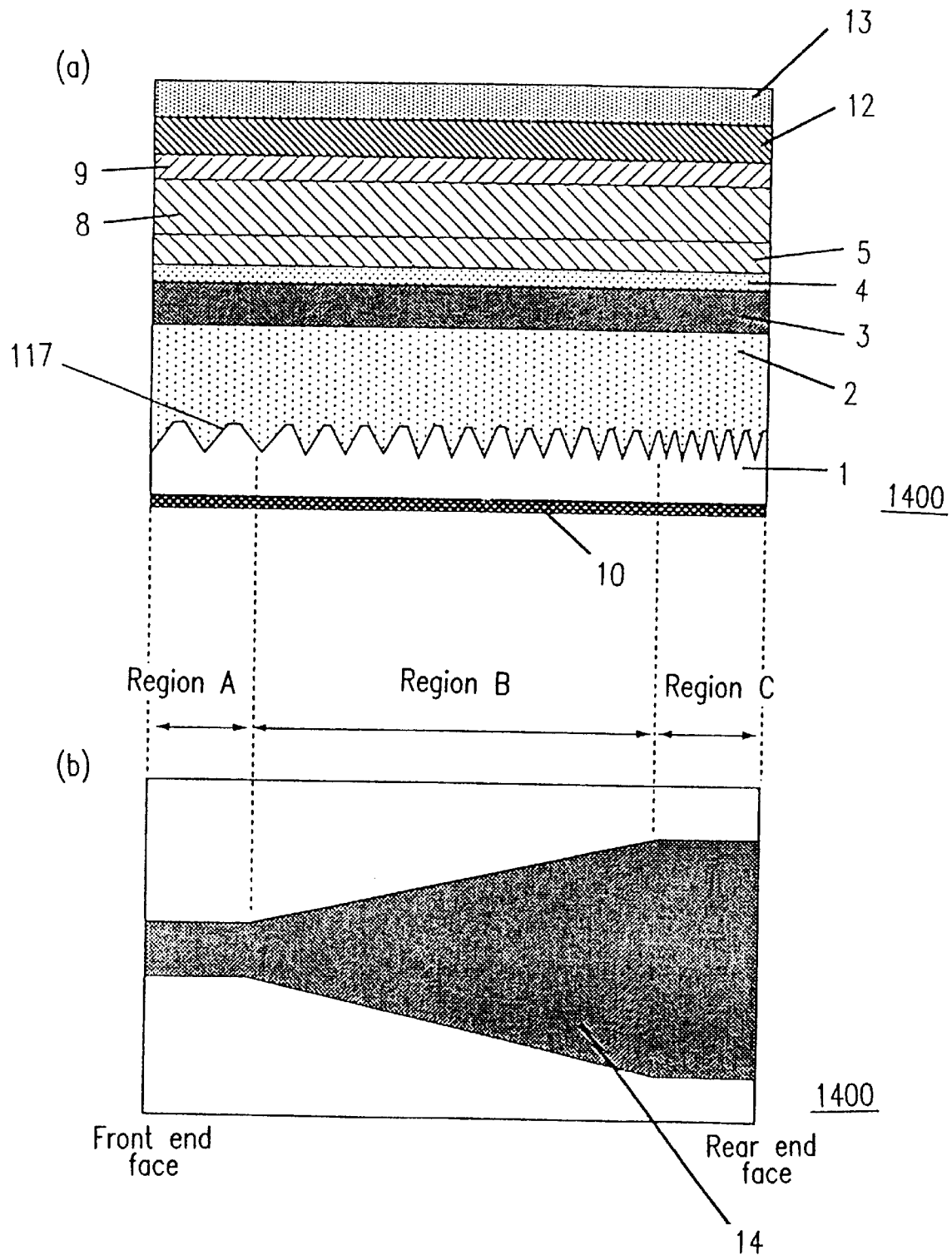
FIGS. 33(a) and 33(b) are respectively a cross-sectional view and a see-through view as viewed from above illustrating a structure of a semiconductor laser device according to Example 14 of the present invention.

FIG. 33(a) is a cross-sectional view of a central potion of a semiconductor laser device 1400 according to Example 14 of the present invention taken along the cavity length direction. Moreover, FIG. 33(b) is a see-through view of the semiconductor laser device 1400 as viewed from above, where the internal structure can be seen. Herein, the hatched region in FIG. 33(b) is the stripe 14. The stripe 14 includes the n-type InGaAsP light confinement layer 2, the multiple quantum well active layer 3, the p-type InGaAsP light confinement layer 4, and the p-type InP cladding layer 5. The oscillation wavelength of the semiconductor laser device 1400 is around 1.3 μm.

The basic structure of the semiconductor laser device 1400 is the same as that of the semiconductor laser device 1200 according to Example 12. The same reference numerals are used for the same components, which will not be described below.

In the semiconductor laser device 1400 of the present example, the n-type InGaAsP light confinement layer 2 is formed directly on the corrugations 117 having a variable pitch, which is formed on the n-type InP substrate 1. Also in such a structure, similar effects as those in the semiconductor laser device 1200 of Example 12 may be realized.

EXAMPLE 15

FIG. 34(a) is a diagram illustrating a configuration of an optical communication system 1500 according to Example 15 of the present invention.

Particularly, in the optical communication system 1500, a semiconductor laser 39 is directly intensity-modulated by an electric signal from an electric signal generator 38, and laser light radiated from the front end face of the semiconductor laser 39 is collected directly on an optical fiber 40. Then, light output from the optical fiber 40 is converted into an electric signal by a photodetector 41, thus transmitting an audio signal, a video signal, or data. As the semiconductor laser 39 in this configuration, one of the semiconductor laser devices 100 to 1400 of Examples 1 to 14 is used.

A feature of the configuration of the above-described optical communication system 1500 is that radiation light from the semiconductor laser 39 is directly collected on the optical fiber 40.

In an optical communication system 1550 according to conventional technology, a lens 44 is inserted between a semiconductor laser 42 and the optical fiber 40, as shown in FIG. 34(b). This is because, in the optical communication system 1550 according to conventional technology, the semiconductor laser 42 has a wide beam divergence, so that radiation light 43 cannot be collected directly on the optical fiber 40.

On the contrary, in the configuration of the optical communication system 1500 of the present invention, one of the semiconductor laser devices 100 to 1400, as described in the respective examples, is used as the semiconductor laser 39. Since each of the semiconductor laser devices 100 to 1400 has a very narrow beam divergence, it is possible to collect the radiation light of the semiconductor laser 39 directly on the optical fiber 40, as in the configuration illustrated in FIG. 34(a), without the intervention of a lens. As a result, the cost required for producing the lens and the cost required for aligning the lens can be reduced. Thus, it is consequently possible to reduce the cost of the whole system.

EXAMPLE 16

Referring to FIGS. 9(a) to 9(d), a production method for the semiconductor laser device of the present invention will be described. In each of FIGS. 9(a) to 9(d), a cross-sectional view of the semiconductor laser device taken along the direction perpendicular to the cavity length is shown on the left of the figure, while a top view of the semiconductor laser device is shown on the right of the figure.

Figure 9:
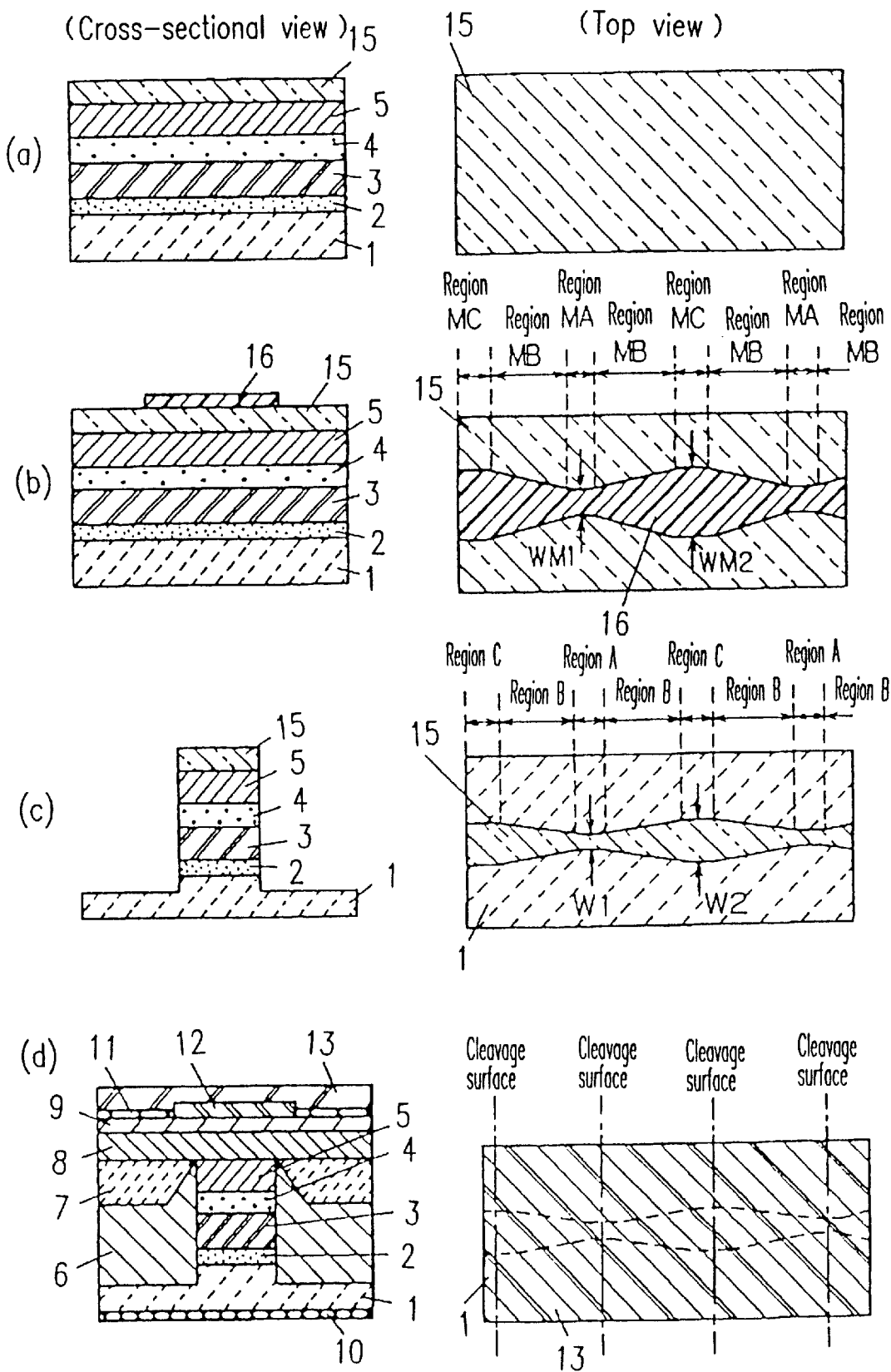
FIGS. 9(a) to 9(d) are cross-sectional views and see-through views as viewed from above illustrating a production method for a semiconductor laser device of the present invention.

First, as shown in FIG. 9(a), the n-type InGaAsP light confinement layer (about 150 nm thick, λg=about 1.05 μm) 2, the multiple quantum well active layer 3, the p-type InGaAsP light confinement layer (about 30 nm thick, λg=about 1.05 μm) 4, the p-type InP cladding layer (about 400 nm thick) 5, and a p-type InGaAsP cap layer (about 100 nm thick, λg=about 1.3 μm) 15 are deposited on the entire surface of the n-type InP substrate 1 by, for example, the organometallic vapor phase growth method.

Subsequently, as shown in FIG. 9(b), a striped SiN film 16 is formed on the surface of the p-type InGaAsP cap layer 15. As shown in the top view of FIG. 9(b), the striped SiN film 16 is formed so that a region MC, a region MB, a region MA, and a region MB are sequentially present along the stripe length direction (the cavity length direction). The region MA is a region having a constant stripe width WM1, while the region MC is a region having a constant stripe width WM2 (wherein, WM1<WM2). Moreover, the region MB is a region which connects the region MA and the region MC and has a stripe width which continuously varies between WM1 and WM2. The respective length of the region MA and the region MC along the stripe length direction is, for example, about 50 μm, while the length of the region MB along the stripe length direction is, for example, about 250 μm.

Subsequently, as shown in FIG. 9(c), dry etching or wet etching is performed while using the striped SiN film 16 having a width which varies depending upon the location as a mask, thus processing the n-type InGaAsP light confinement layer 2, the multiple quantum well active layer 3, the p-type InGaAsP light confinement layer 4, the p-type InP cladding layer 5, and the p-type InGaAsP cap layer 15 into a striped pattern. Thereafter, the SiN film 16 is removed. Thus, a striped mesa including the n-type InGaAsP light confinement layer 2, the multiple quantum well active layer 3 and the p-type InGaAsP light confinement layer 4 is formed. The striped mesa is formed in such a manner that the region C, the region B, the region A and the region B are sequentially present along the stripe length direction (the cavity length direction), as illustrated in the top view of FIG. 9(c), corresponding to the configuration of the above-described striped SiN film 16. The region A is a region having a constant stripe width W1, while the region C is a region having a constant stripe width W2 (wherein, W1<W2). Moreover, the region B is a region which connects the region A and the region C and has a stripe width continuously varying between W1 and W2. The length of the region A and the region C along the stripe length direction is respectively, for example, about 50 $\mu$m, while the length of the region B along the stripe length direction is, for example, about 250 $\mu$m. Herein, the stripe width W1 in the region A is set to a value less than about 1.0 $\mu$m and such that it allows for the fundamental mode.

Subsequently, as shown in FIG. 9(d), the p-type InP current blocking layer 6, the n-type InP current blocking layer 7, the p-type InP burying layer 8, and the p-type InGaAsP contact layer ($\lambda$g=about 1.3 $\mu$m) 9 are sequentially deposited by the liquid phase growth method so as to bury the striped mesa which is formed as described above.

Herein, in the liquid phase growth step, the cap layer 15 is eluted into a solvent used and is lost. Alternatively, the above-described burying process may be performed by the chemical vapor deposition method, instead of the liquid phase growth method. In that case, the formation of the cap layer 15 is omitted at the beginning.

Moreover, the SiO$_2$ insulating film 11 is deposited on the produced p-type InGaAsP contact layer 9. Then, the SiO$_2$ insulating film 11 is provided with a striped window, and the Au/Zn electrode 12 is deposited so as to be in contact with the p-type InGaAsP contact layer 9 through this window. Furthermore, the Ti/Au electrode 13 is deposited on the SiO$_2$ insulating film 11 and the Au/Zn electrode 12. On the other hand, the Au/Sn electrode 10 is deposited on the reverse surface of the n-type InP substrate 1.

Then, a cleavage process is conducted along a plurality of cleavage surfaces, as shown in the top view of FIG. 9(d), thus forming the semiconductor laser device of the present invention. Herein, the plurality of cleavage surfaces are preferably located in the middle portion of the region A and the region C as shown in the top view of FIG. 9(c).

In the above-described production steps, the length of the region A and the region C is respectively set to be about 50 $\mu$m, and therefore, even when the location of the cleavage surfaces as shown in FIG. 9(d) is shifted by up to 25 $\mu$m from the middle portion of the region A and the region C, the width of the stripe including the active layer at the front end face and the rear end face of the produced semiconductor laser device is not influenced by the shift of the cleavage location.

Although, the length of the region A and the region C is respectively set to be about 50 $\mu$m in the above description, similar characteristics as described above can be obtained as long as it is shorter than about 15% of the length of the region B.

Herein, the various configurations of the stripe 14 described in the above examples are realized by forming the SiN film 16, which functions as an etching mask, into an appropriate pattern. Moreover, the coating of the highly reflective film and the non-reflective film onto the end faces can be performed by a method known in the technical field.

Moreover, a method for providing the corrugations 107 on the surface of the n-type InP substrate 1 and forming the InAsP layer 108 in the concave portions of the corrugations 107 in Example 11 will be described. Particularly, a production method for the semiconductor laser device (a DFB laser) 1100, as illustrated in FIGS. 26(a) and 26(b), will be described with reference to FIGS. 35(a) to 35(e).

First, as shown in FIG. 35(a), the corrugations (a diffraction grating) 107 having a pitch of about 203 nm and a depth of about 100 nm is formed on the surface of the n-type InP substrate 1 by the two-beam interference exposure method.

Next, about 100 cc/min of 100% phosphine (PH$_3$) and about 10 cc/min of 10% arsine (AsH$_3$) are introduced into a hydrogen atmosphere, and the n-type InP substrate 1 is thermally processed in this atmosphere at about 600° C. As a result, as shown in FIG. 35(b), the InAsP layer 108 having a thickness of about 50 nm is formed in the concave portions of the corrugations (a diffraction grating) 107. Then, as shown in FIG. 35(c), the n-type InP cladding layer 106, the n-type InGaAsP light confinement layer (about 50 nm thick, $\lambda$g=about 1.05 $\mu$m) 2, the multiple quantum well active layer 3, the p-type InGaAsP light confinement layer 4, and the p-type InP cladding layer (about 400 nm thick) 5 are successively and sequentially deposited by successively using the organometallic vapor phase growth method.

Subsequently, as shown in FIG. 35(d), the striped mesa is formed by etching. Then, the p-type InP current blocking layer 6, the n-type InP current blocking layer 7, the p-type InP burying layer 8, and the p-type InGaAsP contact layer ($\lambda$g=about 1.3 $\mu$m) 9 are sequentially deposited by the liquid phase growth method.

Moreover, the SiO$_2$ insulating film 11 is deposited on the produced p-type InGaAsP contact layer 9. Then, the SiO$_2$ insulating film 11 is provided with a striped window, and the Au/Zn electrode 12 is deposited so as to be in contact with the p-type InGaAsP contact layer 9 through this window. Furthermore, the Ti/Au electrode 13 is deposited on the SiO$_2$ insulating film 11 and the Au/Zn electrode 12. On the other hand, the Au/Sn electrode 10 is deposited on the re verse surface of the n-type InP substrate 1.

Then, cleavage is conducted at an appropriate location, so as to produce a DFB laser device as shown in FIG. 35(e).

Important steps in the above-described production method will be described in detail with reference to FIGS. 36(a) to 36(c).

FIG. 36(a) illustrates a cross section of the n-type InP substrate 1, on which the corrugations (a diffraction grating) 107 has been formed by etching. When the n-type InP substrate 1, on which the corrugations (a diffraction grating) 107 has been formed, is thermally processed in an atmosphere in which phosphine (PH$_3$) and arsine (AsH$_3$) are mixed, the InAsP layer 108 is deposited in the concave portions of the corrugations (a diffraction grating) 107 due to a mass-transport phenomenon during the thermal process, as shown in FIG. 36(b). By subsequently growing the n-type InP cladding layer 106, it is possible to form the InAsP layer 108 in inverse triangle shapes arranged periodically in the n-type InP cladding layer 106, as shown in FIG. 36(c).

Figure 37:
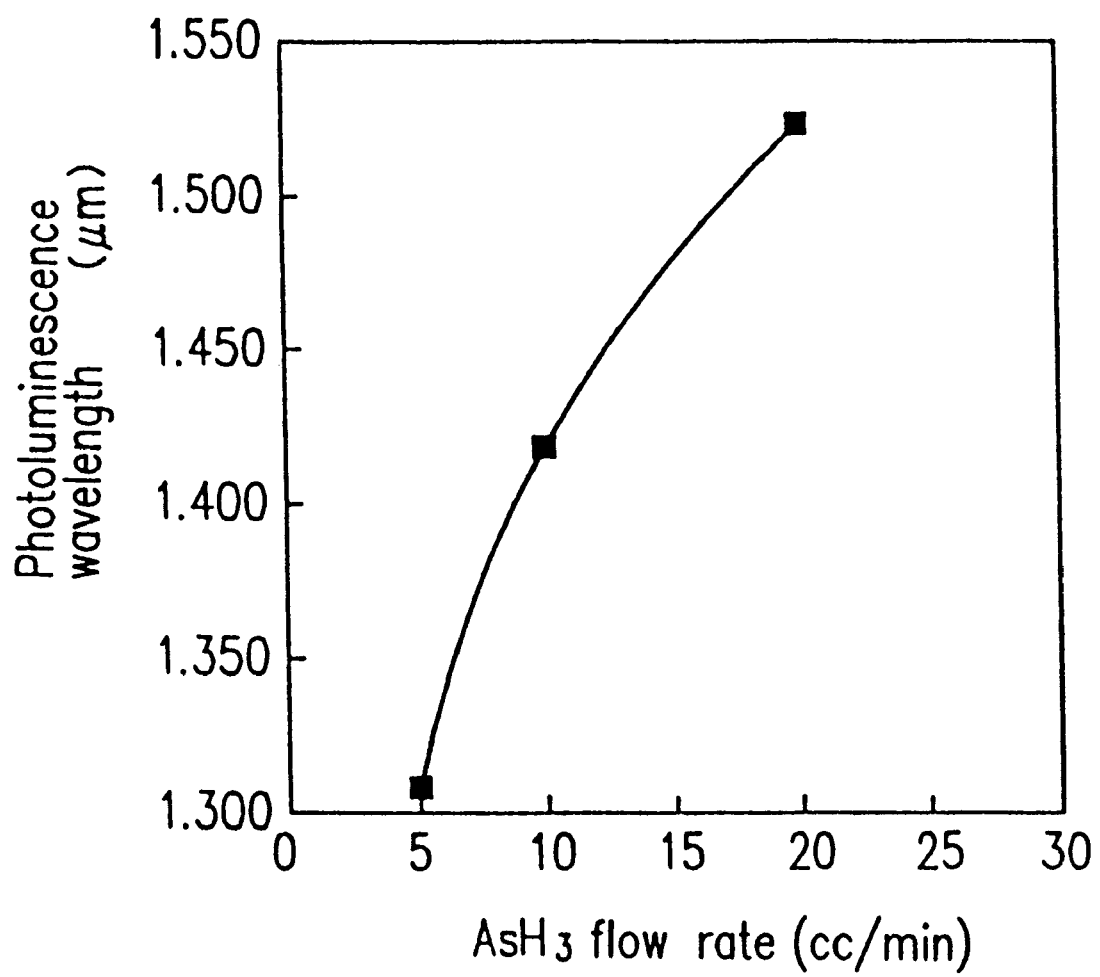
FIG. 37 is a diagram showing the relationship between the flow rate of arsine ($AsH_3$) and the photoluminescence wavelength in the production method for the semiconductor laser device according to Example 11 of the present invention.

FIG. 37 shows the variation of the photoluminescence wavelength with respect to the flow rate of arsine, with the flow rate of the 100% phosphine being about 100 cc/min and the temperature being about 600° C. As shown in FIG. 37, when the flow rate of arsine (AsH$_3$) varies while the flow rate of phosphine (PH$_3$) is constant, the photoluminescence wavelength from the InAsP layer 108 continuously varies. This indicates that it is possible to vary the bandgap energy of the InAsP layer 108 by varying the flow rate of arsine (AsH$_3$).

Moreover, when the bandgap energy of the InAsP layer 108 is set to be greater than the light energy which is emitted from the active layer 3 of the produced semiconductor laser device via a light distributed feedback, i.e., when the photoluminescence wavelength of the InAsP layer 108 is set to be on the shorter wavelength side with respect to the oscillation wavelength of the semiconductor laser device, the InAsP layer 108 becomes transparent to light emitted from the active layer 3. As a result, a periodical variation of refractive index occurs due to the fact that the refractive index of the InAsP layer 108 is higher than that of the surrounding InP layer, so that a refractive index coupled type DFB laser can be produced.

On the other hand, when the bandgap energy of the InAsP layer 108 is set to be less than the light energy which is emitted from the active layer 3 of the produced semiconductor laser device via a light distributed feedback, i.e., when the photoluminescence wavelength of the InAsP layer 108 is set to be on the longer wavelength side with respect to the oscillation wavelength of the semiconductor laser device, the InAsP layer 108 functions as an absorbing layer which absorbs light emitted from the active layer 3. Thus, a periodical variation of gain occurs, whereby a gain coupled type DFB laser can be produced.

INDUSTRIAL APPLICABILITY

As described above, the semiconductor laser device of the present invention has a very narrow beam-divergence and is capable of generating a high optical output with a low threshold current in spite of the very simple structure thereof.

Moreover, by using a production method for the semiconductor laser device of the present invention, it is possible to produce, with a good controllability, the semiconductor laser device of the present invention having the above-described features.

We claim:

1. A semiconductor laser device comprising a substrate and a multi-layer structure formed on the substrate, wherein:
   the multi-layer structure includes an optical waveguide region having at least an active layer and a burying layer for burying peripheries of the optical waveguide region, the optical waveguide region being formed in stripes along a cavity length direction;
   a stripe width of the optical waveguide region is such that a width W1 at a front end face and a width W2 at a rear end face satisfy a relationship of W1<W2;
   the stripe width continuously varies between the width W1 and the W2 along the cavity length direction, thereby generating laser light with a very narrow beam divergence; and
   the optical waveguide region further comprises a light confinement layer adjoining the active layer.

2. A semiconductor laser device comprising a substrate and a multi-layer structure formed on the substrate, wherein:
   the multi-layer structure includes an optical waveguide region having at least an active layer and a burying layer for burying peripheries of the optical waveguide region, the optical waveguide region being formed in stripes along a cavity length direction;
   a stripe width of the optical waveguide region is such that a width W1 at a front end face and a width W2 at a rear end face satisfy a relationship of W1<W2;
   the stripe width continuously varies between the width W1 and the W2 along the cavity length direction, thereby generating laser light with a very narrow beam divergence;
   the optical waveguide region comprises: a first region having the width W1 of a constant value; a second region having the width W2 of a constant value; and a third region having a width which continuously varies along the cavity length direction between the width W1 and the width W2,
   the first region is located on the front end face side while the second region is located on the rear end face side; and
   a length of the first region and a length of the second region are each shorter than a length of the third region.

3. A semiconductor laser device according to claim 2, wherein a length of the first region and a length of the second region are each shorter than about 15% of a length of the third region.

4. A semiconductor laser device according to claim 2, wherein the first region and the third region, and the second region and the third region are respectively connected smoothly.

5. A semiconductor laser device according to claim 2, wherein a length of the first region and a length of the second region are each about 5 µm or less.

6. A semiconductor laser device according to claim 2, wherein at least one of the first region and the second region has, on a side adjoining the third region, lengths different from each other on respective sides of the striped shape.

7. A semiconductor laser device according to claim 2, wherein at least one of the first region and the second region has, on a side adjoining the third region, lengths different from each other on respective sides of the striped shape with a connection surface to the third region being inclined by substantially about 45° with respect to the cavity length direction.

8. A semiconductor laser device according to claim 2, wherein the rear end face is coated with a highly reflective film, and a length of the first region is longer than about 5 µm while a length of the second region is about 5 µm or less.

9. A semiconductor laser device comprising a substrate and a multi-layer structure formed on the substrate, wherein:
   the multi-layer structure includes an optical waveguide region having at least an active layer and a burying layer for burying peripheries of the optical waveguide region, the optical waveguide region being formed in stripes along a cavity length direction;
   a stripe width of the optical waveguide region is such that a width W1 at a front end face and a width W2 at a rear end face satisfy a relationship of W1<W2;
   the stripe width continuously varies between the width W1 and the W2 along the cavity length direction, thereby generating laser light with a very narrow beam divergence; and
   the stripe width of the optical waveguide region varies linearly along the cavity length direction with a gradient of variation being about 0.14° or less with respect to the cavity length direction.

10. A semiconductor laser device comprising a substrate and a multi-layer structure formed on the substrate, wherein:
   multi-layer structure includes an optical waveguide region having at least an active layer and a burying layer for burying peripheries of the optical waveguide region, the optical waveguide region being formed in stripes along a cavity length direction;
   a stripe width of the optical waveguide region is such that a width W1 at a front end face and a width W2 at a rear end face satisfy a relationship of W1<W2;
   the stripe width continuously varies between the width W1 and the W2 along the cavity length direction, thereby generating laser light with a very narrow beam divergence;

the stripe width of the optical waveguide region varies linearly along the cavity length direction, and the optical waveguide region includes at least two regions, the gradients of variation of which are different from each other, and the gradient of one of the two regions which is closest to the front end face is about 0.14° or less with respect to the cavity length direction.

11. A semiconductor laser device comprising a substrate and a multi-layer structure formed on the substrate, wherein:
the multi-layer structure includes an optical waveguide region having at least an active layer and a burying layer for burying peripheries of the optical waveguide region, the optical waveguide region being formed in stripes along a cavity length direction;
a stripe width of the optical waveguide region is such that a width W1 at a front end face and a width W2 at a rear end face satisfy a relationship of W1<W2;
the stripe width continuously varies between the width W1 and the W2 along the cavity length direction, thereby generating laser light with a very narrow beam divergence; and
the width W2 of the stripe of the optical waveguide region is set to be a value such that a higher mode is allowed to exist in a light intensity distribution in a direction parallel to the substrate.

12. A semiconductor laser device according to claim 11, wherein the width W2 of the stripe of the optical waveguide region is about 2 μm or more.

13. A semiconductor laser device comprising a substrate, a multi-layer structure formed on the substrate, and a first electrode provided on the multi-layer structure and a second electrode provided on a reverse surface of the substrate, wherein:
the multi-layer structure includes an optical waveguide region having at least an active layer and a burying layer for burying peripheries of the optical waveguide region, the optical waveguide region being formed in stripes along a cavity length direction;
a stripe width of the optical waveguide region is such that a width W1 at a front end face and a width W2 at a rear end face satisfy a relationship of W1<W2;
the stripe width continuously varies between the width W1 and the W2 along the cavity length direction, thereby generating laser light with a very narrow beam divergence;
the first electrode is separated into a plurality of regions by at least two separation grooves which are parallel to the front end face and the rear end face; and
widths of the separation grooves along the cavity length direction are set to be wider when closer to the rear end face.

14. A semiconductor laser device comprising a substrate, a multi-layer structure formed on the substrate, and a first electrode provided on the multi-layer structure and a second electrode provided on a reverse surface of the substrate, wherein:
the multi-layer structure includes an optical waveguide region having at least an active layer and a burying layer for burying peripheries of the optical waveguide region, the optical waveguide region being formed in stripes along a cavity length direction;
a stripe width of the optical waveguide region is such that a width W1 at a front end face and a width W2 at a rear end face satisfy a relationship of W1<W2;
the stripe width continuously varies between the width W1 and the W2 along the cavity length direction, thereby generating laser light with a very narrow beam divergence;
the first electrode is separated into a plurality of regions by at least two separation grooves which are parallel to the front end face and the rear end face, and configured such that less current is supplied to one of the plurality of regions which is closer to the rear end face.

15. A semiconductor laser device comprising a substrate and a multi-layer structure formed on the substrate, wherein:
the multi-layer structure includes an optical waveguide region having at least an active layer and a burying layer for burying peripheries of the optical waveguide region, the optical waveguide region being formed in stripes along a cavity length direction;
a stripe width of the optical waveguide region is such that a width W1 at a front end face and a width W2 at a rear end face satisfy a relationship of W1<W2;
the stripe width continuously varies between the width W1 and the W2 along the cavity length direction, thereby generating laser light with a very narrow beam divergence; and
a diffraction grating for modulating an effective refractive index of the optical waveguide region periodically along the cavity length direction is formed to be adjacent to the optical waveguide region, thereby oscillating with a single wavelength.

16. A semiconductor laser device according to claim 15, wherein a period of the diffraction grating is shorter in the vicinity of the rear end face than in a vicinity of the front end face.

17. A semiconductor laser device according to claim 16, wherein the period of the diffraction grating varies along the cavity length direction so that a Bragg wavelength is constant along the cavity length direction.

18. A semiconductor laser device according to claim 15, wherein: the semiconductor substrate is formed of InP; the active layer is formed of a multi-layer film of an InGaAsP mixed crystal; and the diffraction grating is a material layer of any one of an InAsP layer, an InGaAsP layer and an InGaAs layer buried in a vicinity of the active layer.

19. A semiconductor laser device according to claim 18, wherein a bandgap energy of the material layer of any one of an InAsP layer, an InGaAsP layer and an InGaAs layer forming the diffraction grating is set to be less than an energy of laser light emitted from the active layer, and the material layer of any one of the InAsP layer, the InGaAsP layer and the InGaAs layer functions as an absorbing layer for the laser light.

20. A semiconductor laser device according to claim 18, wherein a bandgap energy of the material layer of any one of an InAsP layer, an InGaAsP layer and an InGaAs layer forming the diffraction grating is set to be greater than an energy of laser light emitted from the active layer, and the material layer of any one of the InAsP layer, the InGaAsP layer and the InGaAs layer functions as a refractive index modulating layer for the laser light.

21. A semiconductor laser device according to claim 15, wherein the diffraction grating is formed only on a portion of the substrate on the front end face side.

22. A semiconductor laser device comprising a substrate and a multi-layer structure formed on the substrate, wherein:
the multi-layer structure includes an optical waveguide region having at least an active layer and a burying layer for burying peripheries of the optical waveguide region, the optical waveguide region being formed in stripes along a cavity length direction;
a stripe width of the optical waveguide region is such that a width W1 at a front end face and a width W2 at a rear end face satisfy a relationship of W1<W2;

the stripe width continuously varies between the width W1 and the W2 along the cavity length direction, thereby generating laser light with a very narrow beam divergence; and a diffraction grating for modulating a gain of the optical waveguide region periodically along the cavity length direction is formed to be adjacent to the optical waveguide region, thereby oscillating with a single wavelength.

23. A semiconductor laser device according to claim 22, wherein a period of the diffraction grating is shorter in the vicinity of the rear end face than in a vicinity of the front end face.

24. A semiconductor laser device according to claim 22, wherein the period of the diffraction grating varies along the cavity length direction so that a Bragg wavelength is constant along the cavity length direction.

25. A semiconductor laser device according to claim 22 wherein:

the semiconductor substrate is formed of InP;

the active layer is formed of a multi-layer film of an InGaAsP mixed crystal; and the diffraction grating is a material layer of any one of an InAsP layer, InGaAsP layer and an InGaAs layer buried in a vicinity of the active layer.

26. A semiconductor laser device according to claim 22 wherein a band gap energy of the material layer of any one of an InAsP layer, and InGaAsP layer and in InGaAs layer forming the diffraction grating is set to be less than an energy of laser light emitted from the active layer, and the material layer of any one of the InAsP layer, the InGaAsP layer and the InGaAs layer functions as an absorbing layer for the laser light.

27. A semiconductor laser device according to claim 22 wherein a band gap energy of the material layer of any one of an InAsP layer, an InGaAsP layer and an InGaAs layer forming the diffraction grating is set to be greater than an energy of laser light emitted from the active layer, and the material layer of any one of the InAsP layer, the InGaAsP layer and the InGaAs layer functions as a refractive index modulating layer for the laser light.

28. A production method for a semiconductor laser device, the method comprising the steps of:

forming, on a substrate, a multi-layer structure including at least an active layer and a light confinement layer;

processing the multi-layer structure into a striped shape such that a width W1 at a front end face and a width W2 at a rear end face satisfy a relationship of W1<W2, the striped shape having a stripe width which continuously varies between the width W1 and the W2;

forming a burying layer for burying peripheries of the striped shape; and forming an electrode on each of the multi-layer structure and a reverse surface of the substrate.

29. A production method for a semiconductor laser device according to claim 28, wherein, in the step of processing the multi-layer structure, the multi-layer structure is processed into a striped shape including: a first region having the width W1 of a constant value; a second region having the width W2 of a constant value; and a third region having a width which continuously varies between the width W1 and the W2 along the cavity length direction.

30. A production method for a semiconductor laser device according to claim 28, wherein the substrate and the burying layer are formed of InP, and the active layer and the light confinement layer are formed of InGaAsP.

31. A semiconductor laser device according to claim 28, wherein the substrate is InP, and the step of forming the multi-layer structure includes:

forming a periodical corrugations on the InP substrate;

thermally processing the InP substrate in an atmosphere in which at least phosphine ($PH_3$) and arsine ($AsH_3$) are mixed so as to deposit an InAsP layer in concave portions of the periodical corrugations; and depositing the multi-layer structure so as to cover the periodical corrugations and the InAsP layer.

32. A semiconductor laser device according to claim 28, wherein the substrate is InP, and the step of forming the multi-layer structure includes:

depositing a portion of the multi-layer structure on the InP substrate;

forming a diffraction grating on the deposited portion of the multi-layer structure;

thermally processing the deposited portion of the multi-layer structure in an atmosphere in which at least phosphine ($PH_3$) and arsine ($AsH_3$) are mixed so as to deposit an InAsP layer in concave portions of the diffraction grating; and depositing the remaining of the multi-layer structure so as to cover the periodical corrugations and the InAsP layer.

* * * * *